(12) United States Patent
Zhang et al.

(10) Patent No.: US 10,879,269 B1
(45) Date of Patent: Dec. 29, 2020

(54) FERROELECTRIC MEMORY DEVICE CONTAINING A SERIES CONNECTED SELECT GATE TRANSISTOR AND METHOD OF FORMING THE SAME

(71) Applicant: SANDISK TECHNOLOGIES LLC, Addison, TX (US)

(72) Inventors: Yanli Zhang, San Jose, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/454,475

(22) Filed: Jun. 27, 2019

(51) Int. Cl.
| | |
|---|---|
| H01L 27/11582 | (2017.01) |
| H01L 27/11592 | (2017.01) |
| H01L 27/1159 | (2017.01) |
| H01L 27/11597 | (2017.01) |
| G11C 11/22 | (2006.01) |
| H01L 27/11587 | (2017.01) |

(52) U.S. Cl.
CPC ...... *H01L 27/11592* (2013.01); *G11C 11/223* (2013.01); *G11C 11/2259* (2013.01); *H01L 27/1159* (2013.01); *H01L 27/11587* (2013.01); *H01L 27/11597* (2013.01)

(58) Field of Classification Search
None
See application file for complete search history.

(56) References Cited

U.S. PATENT DOCUMENTS

| | | | |
|---|---|---|---|
| 5,654,568 | A | 8/1997 | Nakao |
| 9,941,299 | B1 | 4/2018 | Chen et al. |
| 2002/0105016 | A1 | 8/2002 | Haneder et al. |
| 2007/0120182 | A1 | 5/2007 | Rouh et al. |
| 2015/0041873 | A1 | 2/2015 | Karda et al. |
| 2017/0178712 | A1 | 6/2017 | Van Houdt |
| 2017/0365616 | A1* | 12/2017 | Kang ............... H01L 21/76877 |
| 2019/0259778 | A1 | 8/2019 | Yoo |

FOREIGN PATENT DOCUMENTS

WO    WO2018111215 A1    6/2018

OTHER PUBLICATIONS

Notification of Transmittal of the International Search Report and Written Opinion of the International Search Authority for International Patent Application No. PCT/US2019/068911, dated May 21, 2020, 11 pages.

(Continued)

*Primary Examiner* — Jack S Chen
(74) *Attorney, Agent, or Firm* — The Marbury Law Group, PLLC

(57) ABSTRACT

A ferroelectric memory unit cell includes a series connection of select gate transistor that turns the ferroelectric memory unit cell on and off, and a ferroelectric memory transistor. Data is stored in a ferroelectric material layer of the ferroelectric memory transistor. The ferroelectric memory unit cell may be a planar structure in which both transistors are planar transistors with horizontal current directions. In this case, the gate electrode of the access transistor can be formed as a buried conductive line. Alternatively, the ferroelectric memory unit cell may include a vertical stack of vertical semiconductor channels.

14 Claims, 72 Drawing Sheets

(56) References Cited

OTHER PUBLICATIONS

U.S. Appl. No. 16/227,889, filed Dec. 20, 2018, SanDisk Technologies LLC.
U.S. Appl. No. 16/249,300, filed Jan. 16, 2019, SanDisk Technologies LLC.
U.S. Appl. No. 16/291,673, filed Mar. 4, 2019, SanDisk Technologies LLC.
U.S. Appl. No. 16/374,330, filed Apr. 3, 2019, SanDisk Technologies LLC.
U.S. Appl. No. 16/412,764, filed May 15, 2019, SanDisk Technologies LLC.
U.S. Appl. No. 16/454,458, filed Jun. 27, 2019, SanDisk Technologies LLC.
USPTO Non-Final Office Action for U.S. Appl. No. 16/454,458, dated May 6, 2020.

\* cited by examiner

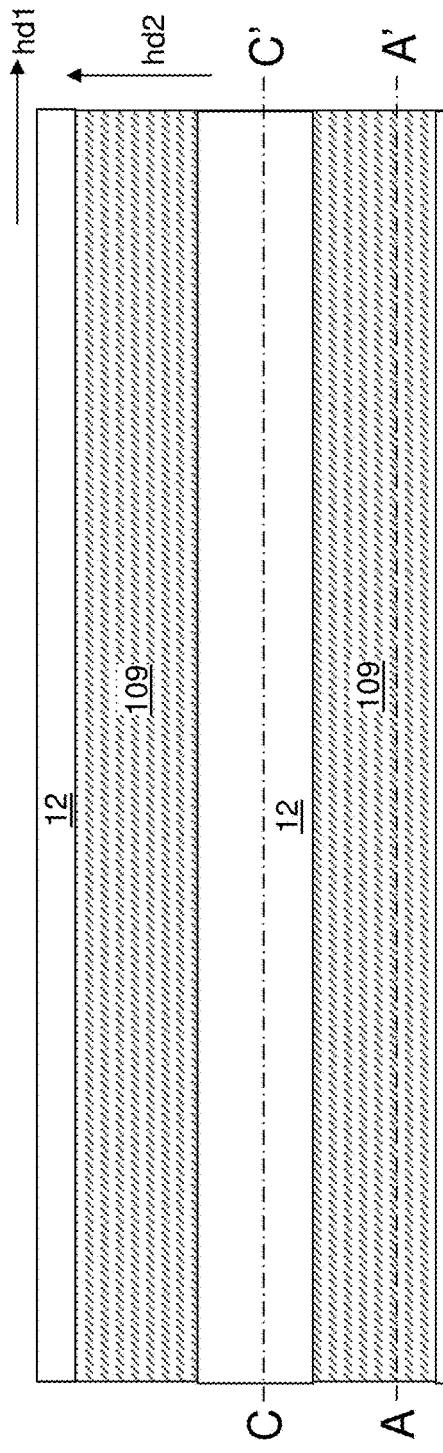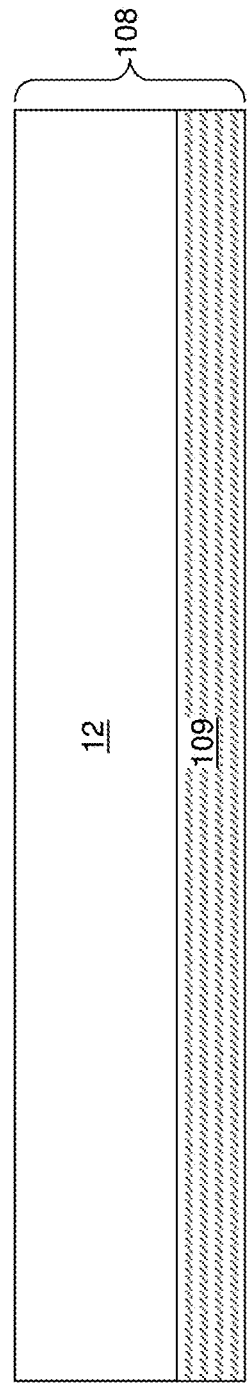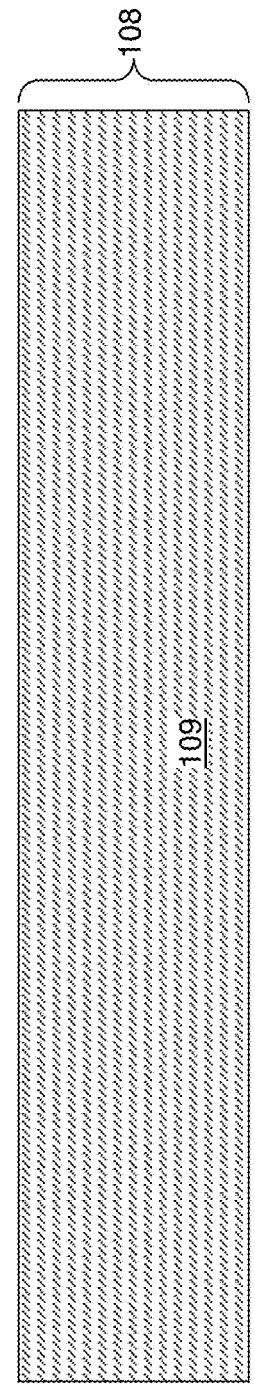

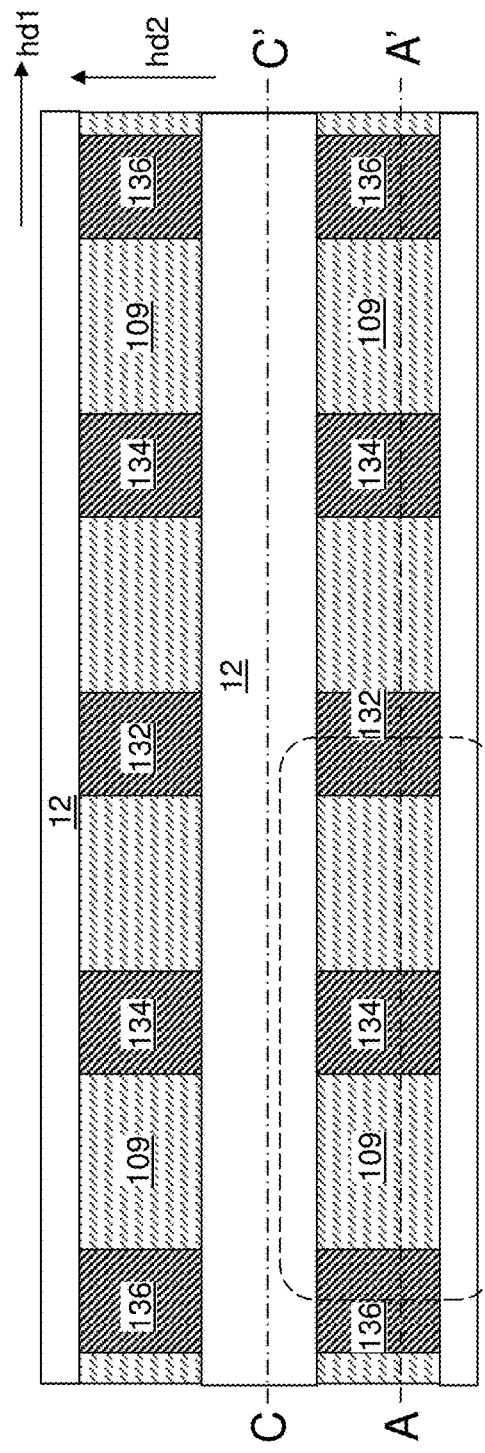
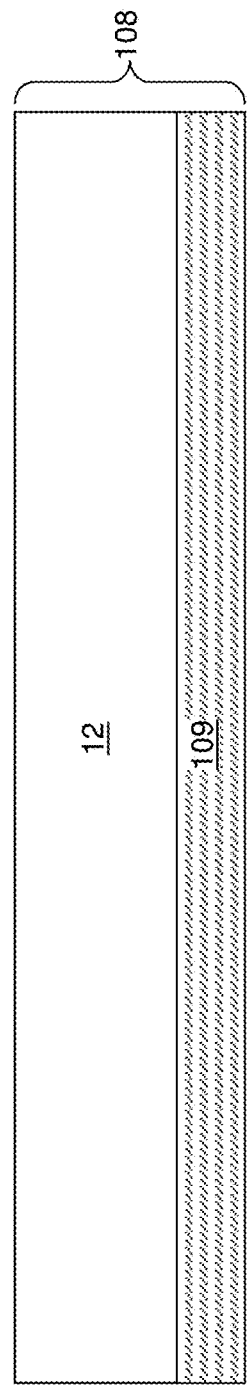
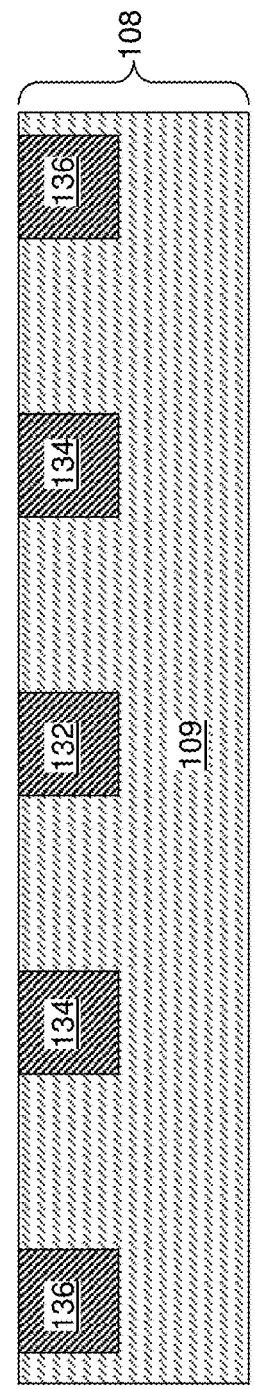
FIG. 3B
FIG. 3C
FIG. 3A

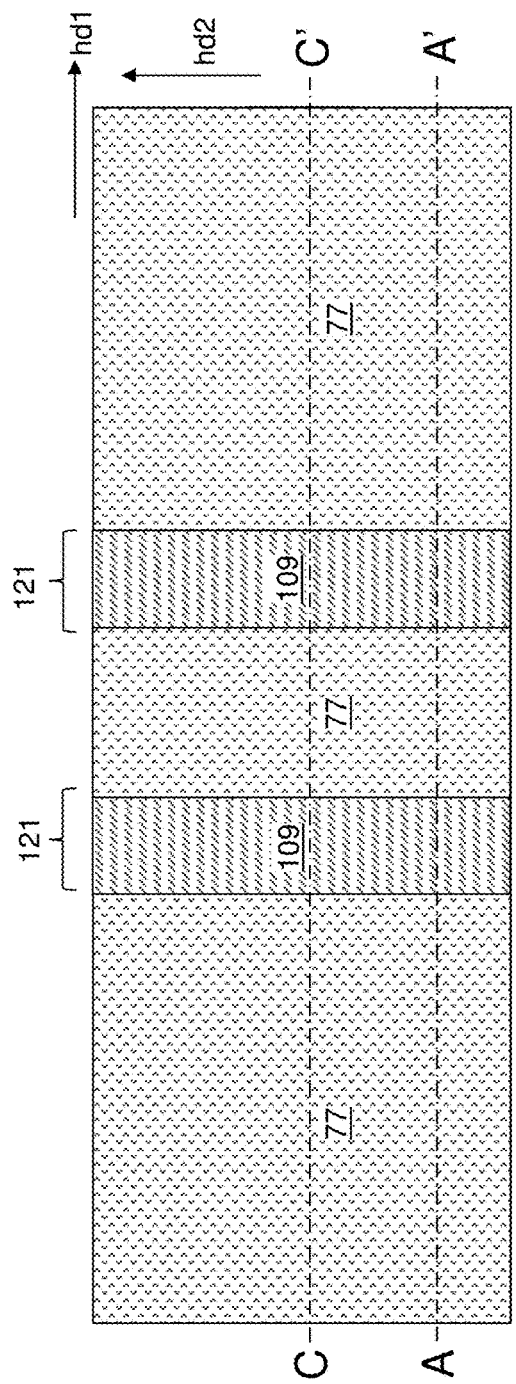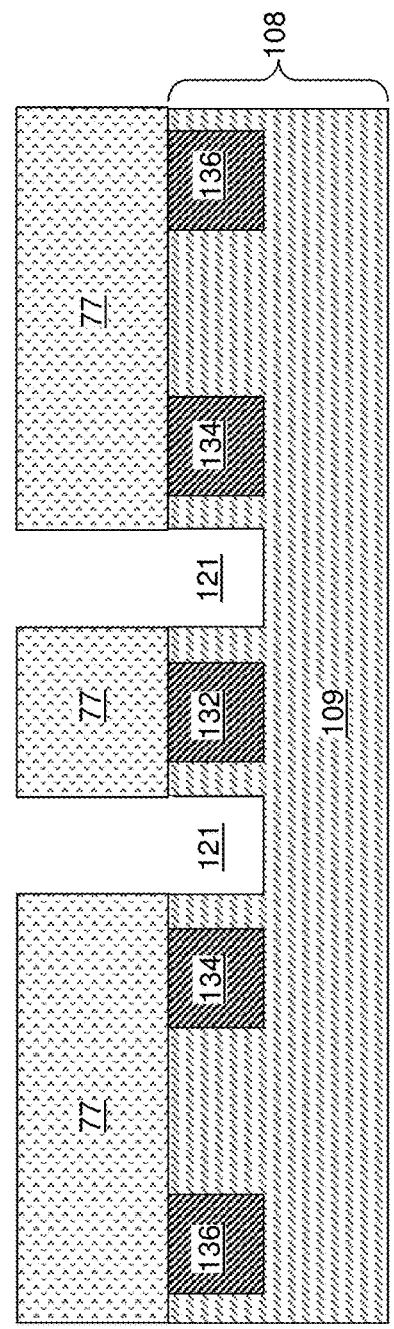
FIG. 4B
FIG. 4A

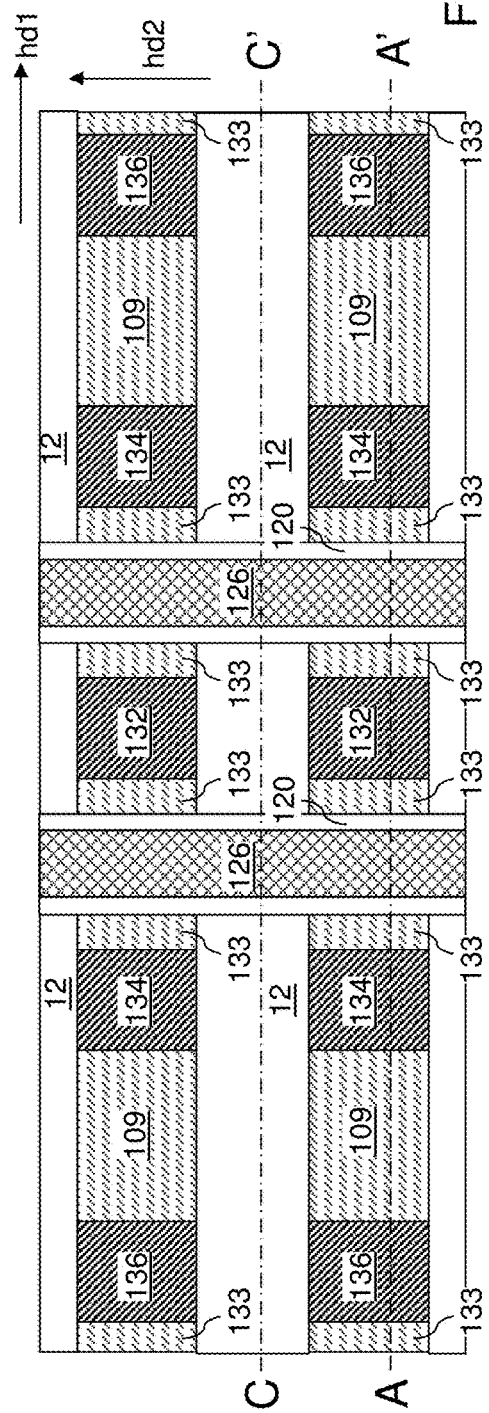
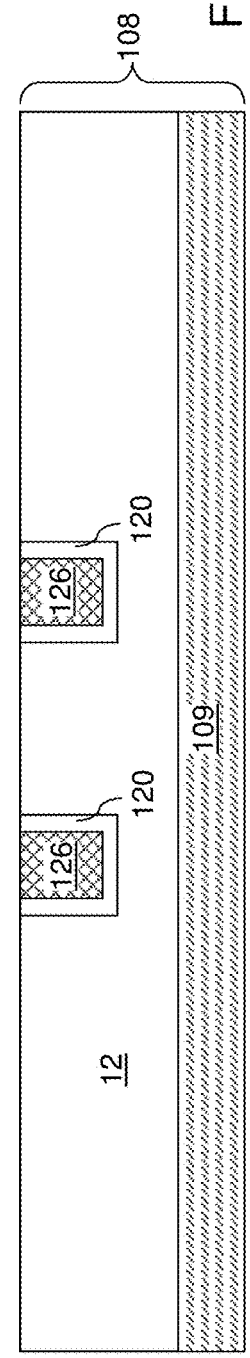
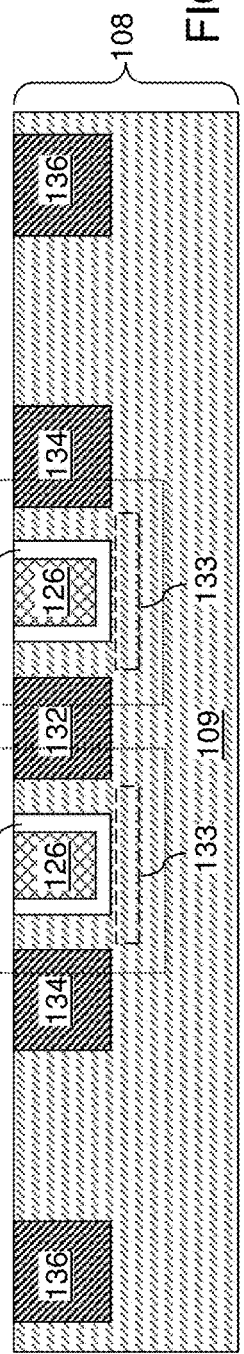
FIG. 5B
FIG. 5C
FIG. 5A

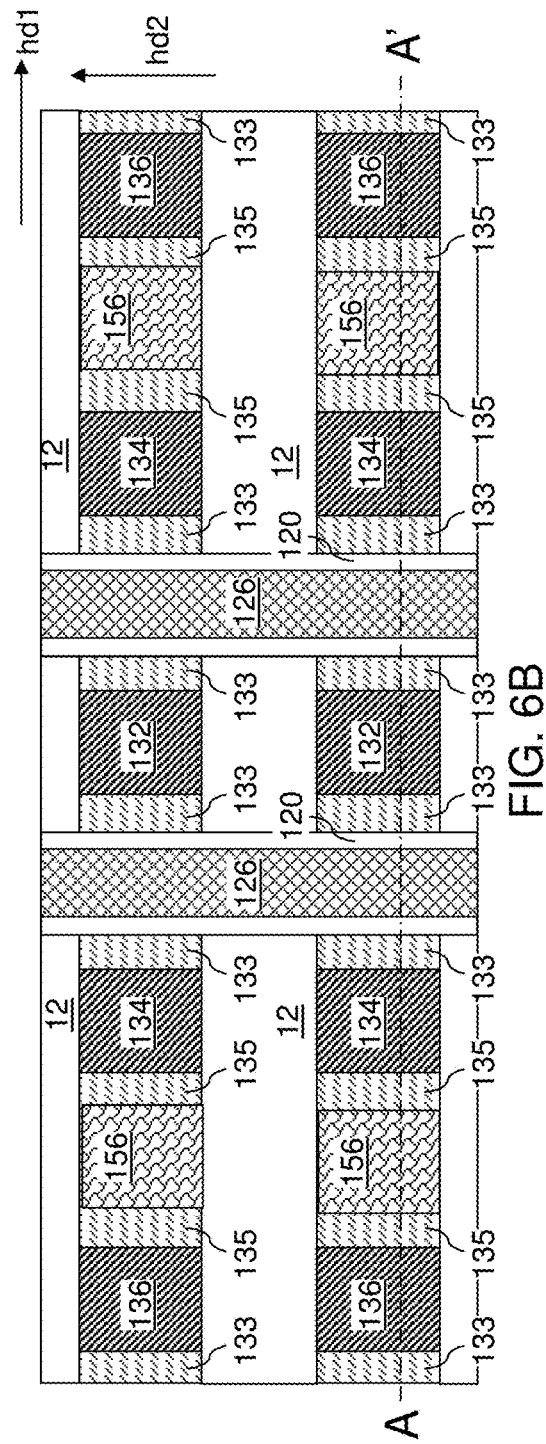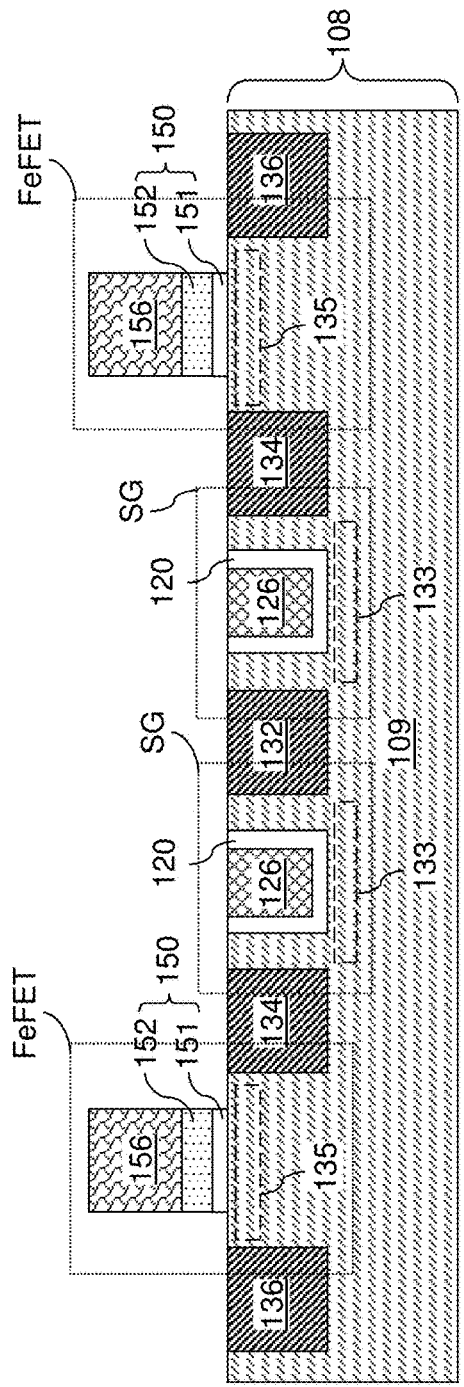
FIG. 6B
FIG. 6A

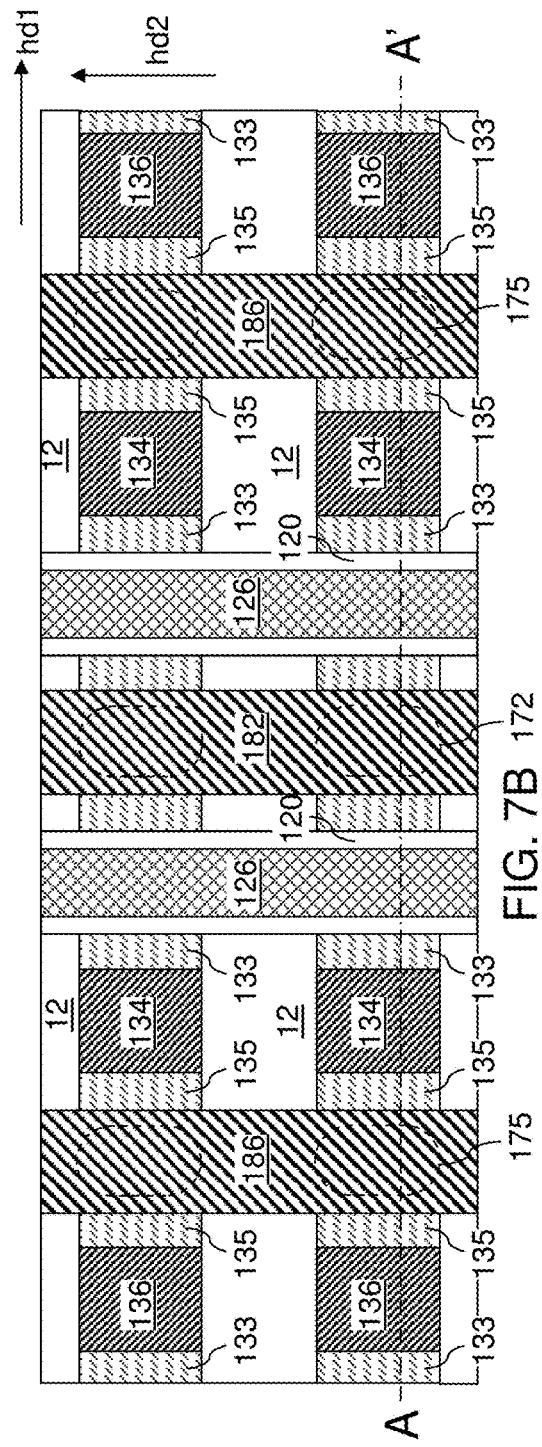
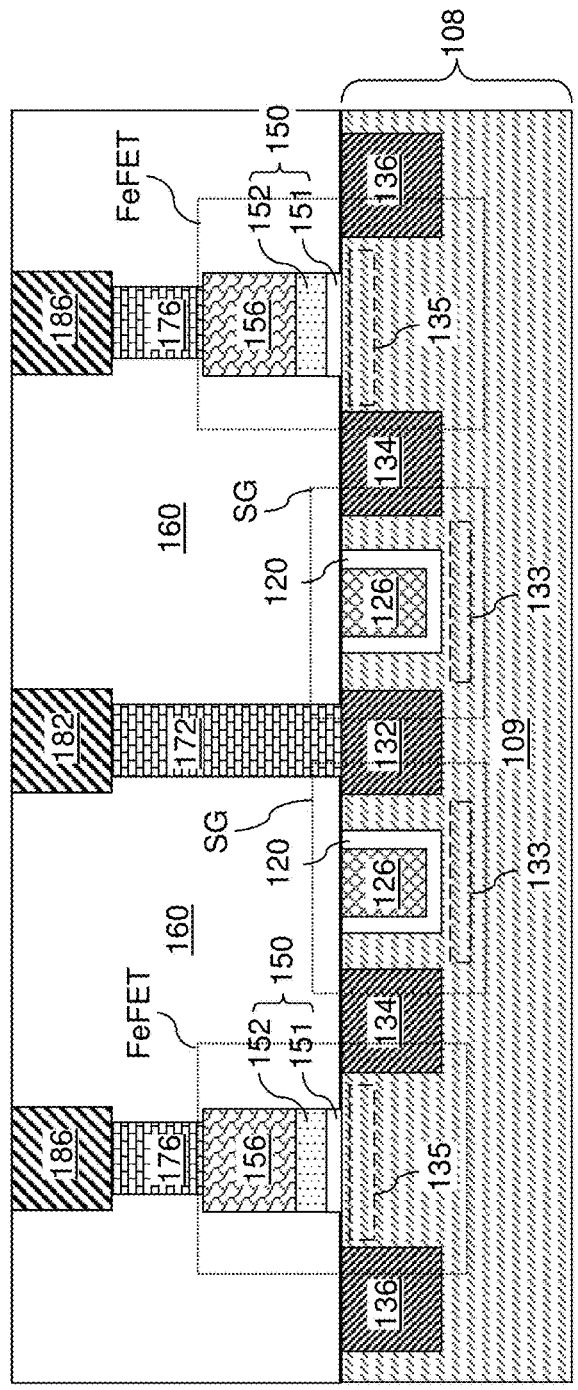
FIG. 7B
FIG. 7A

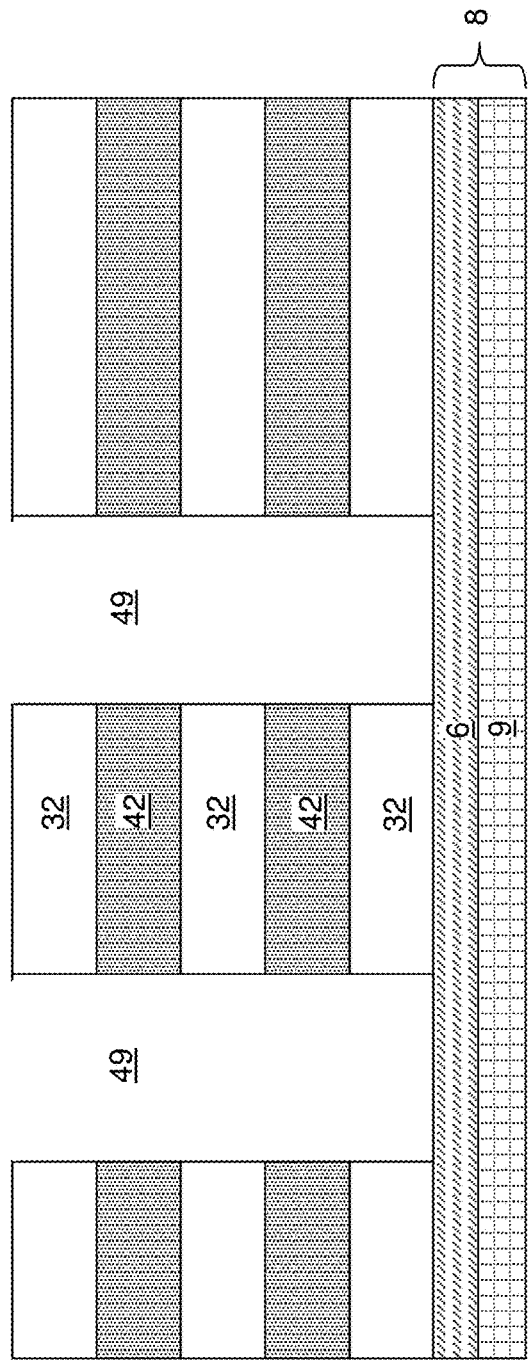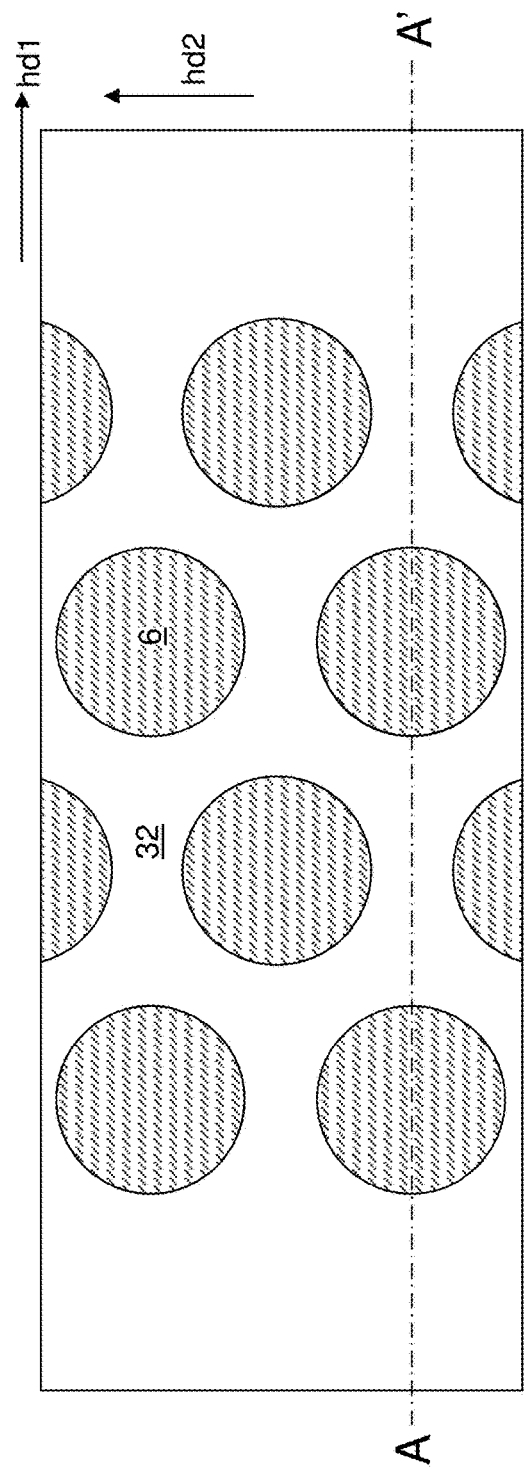

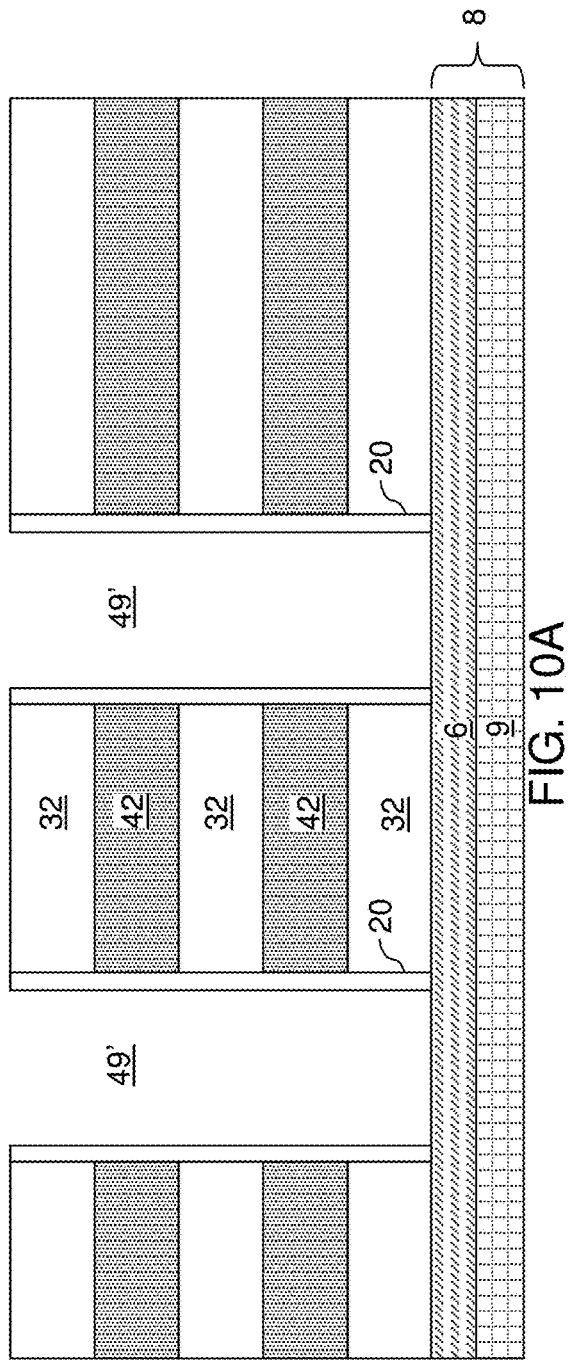
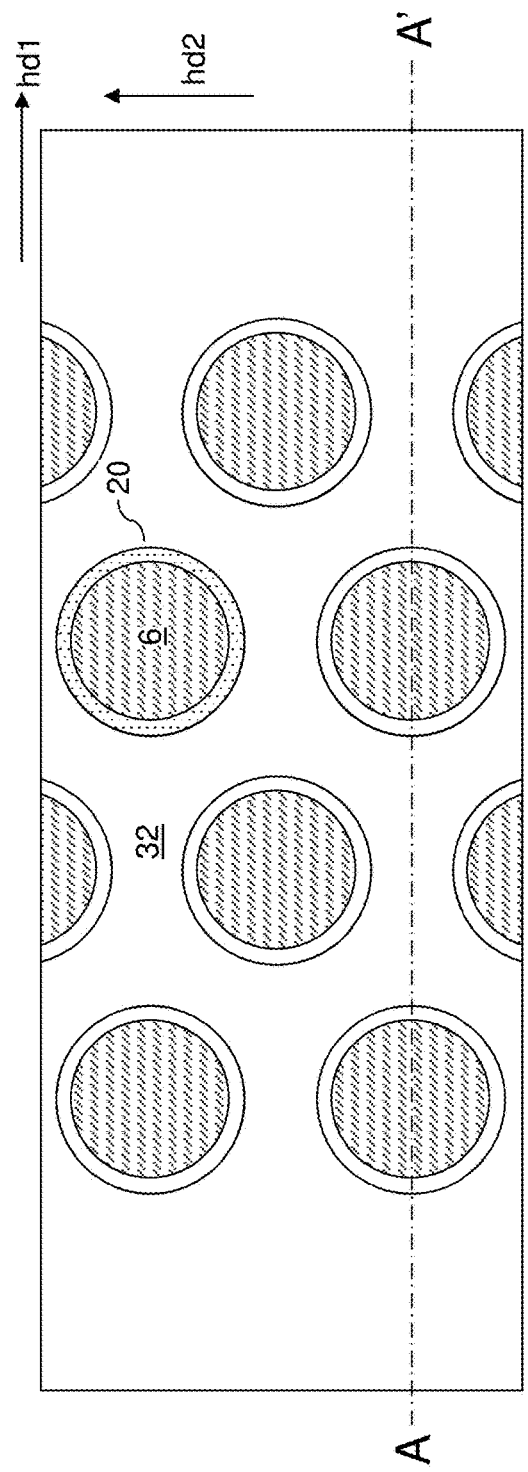
FIG. 10B
FIG. 10A

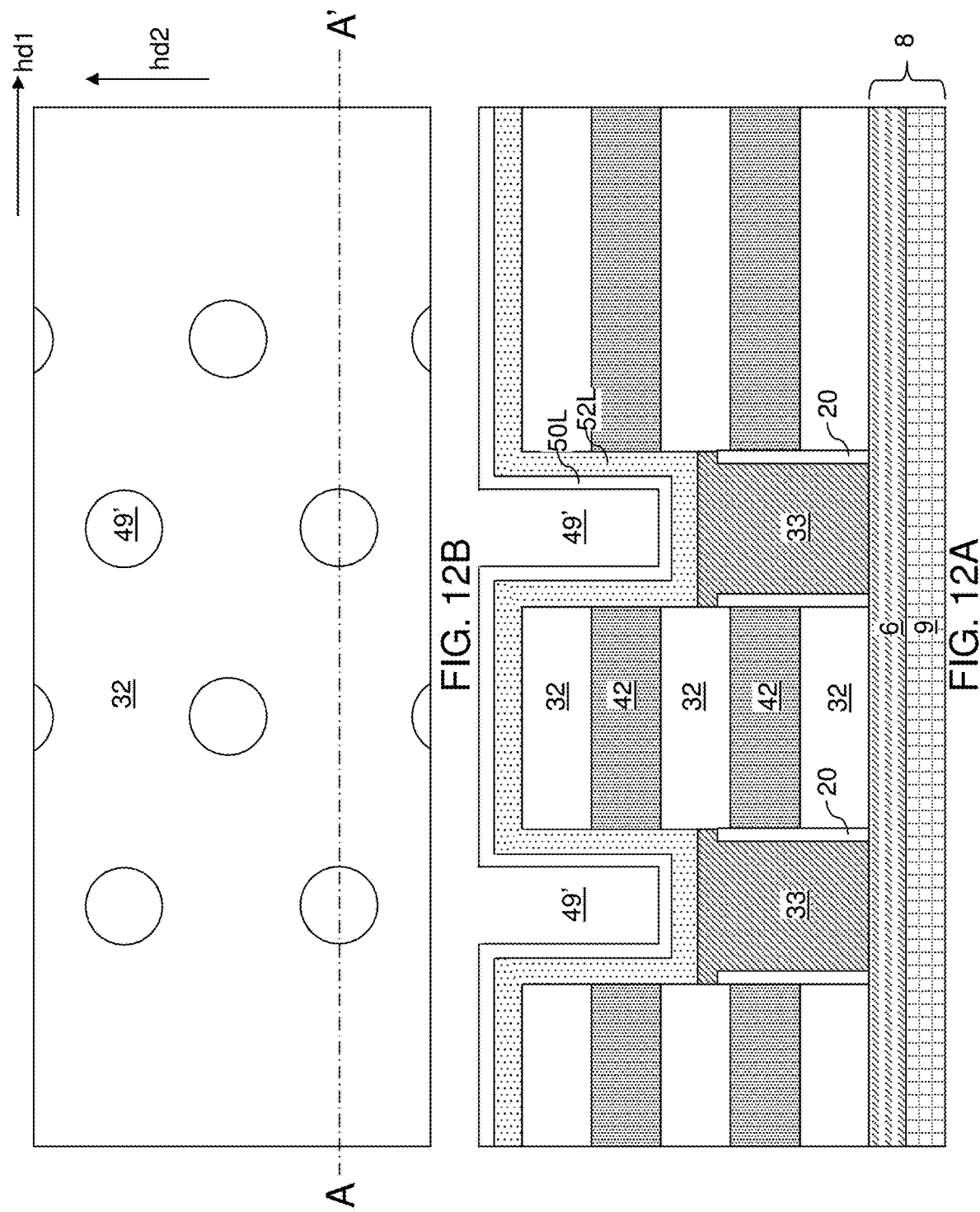

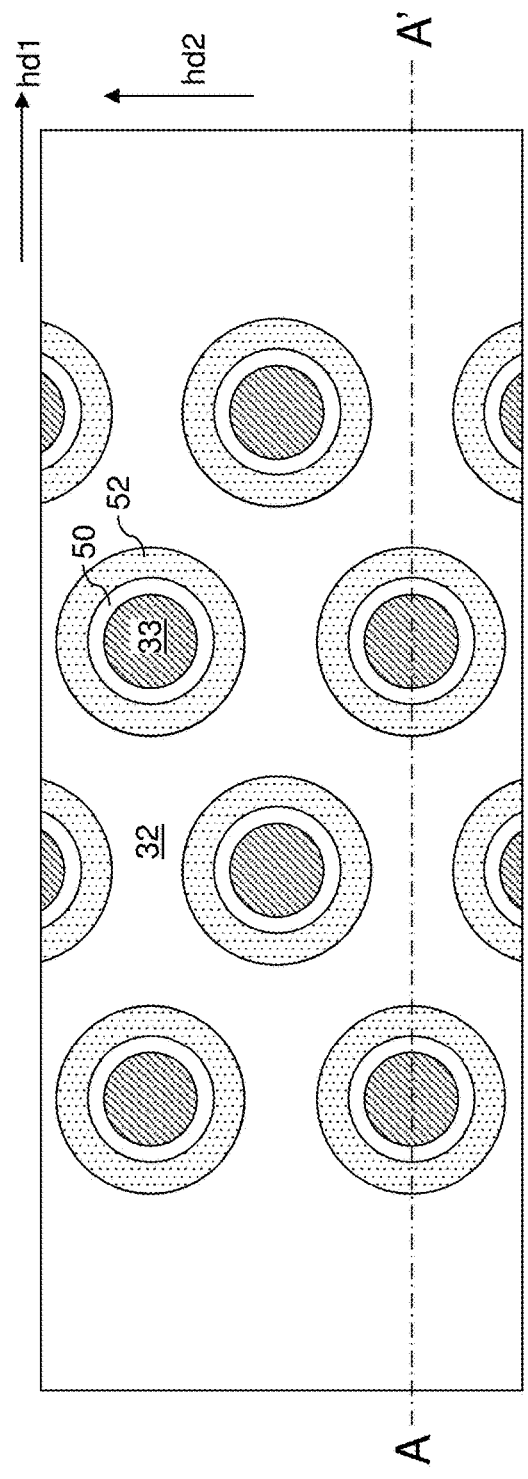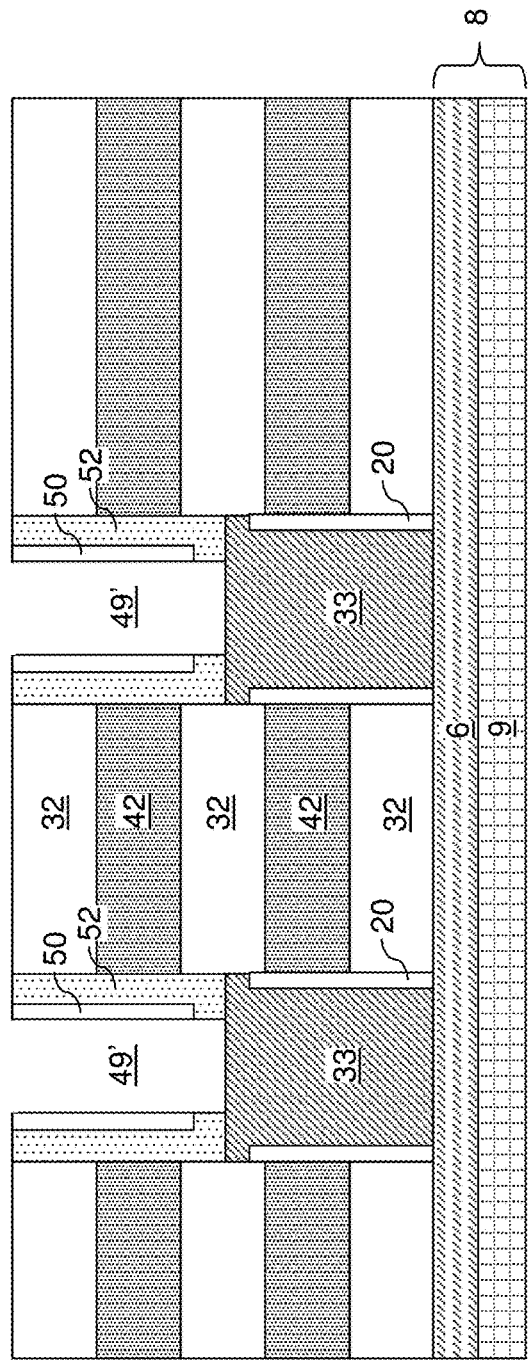
FIG. 13B
FIG. 13A

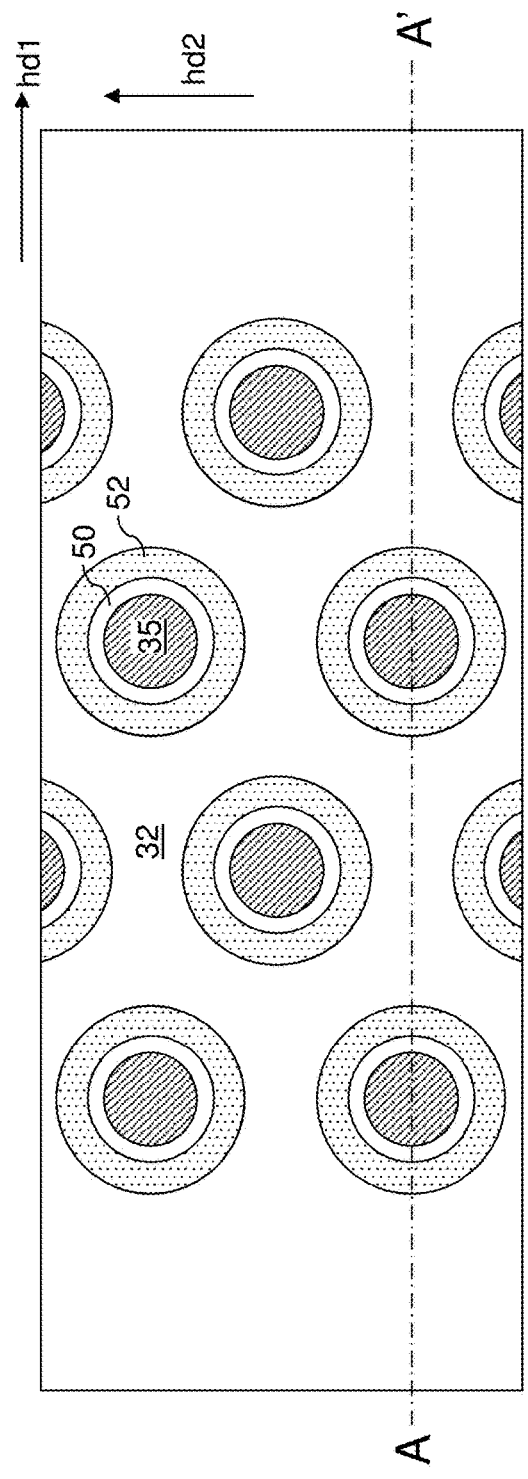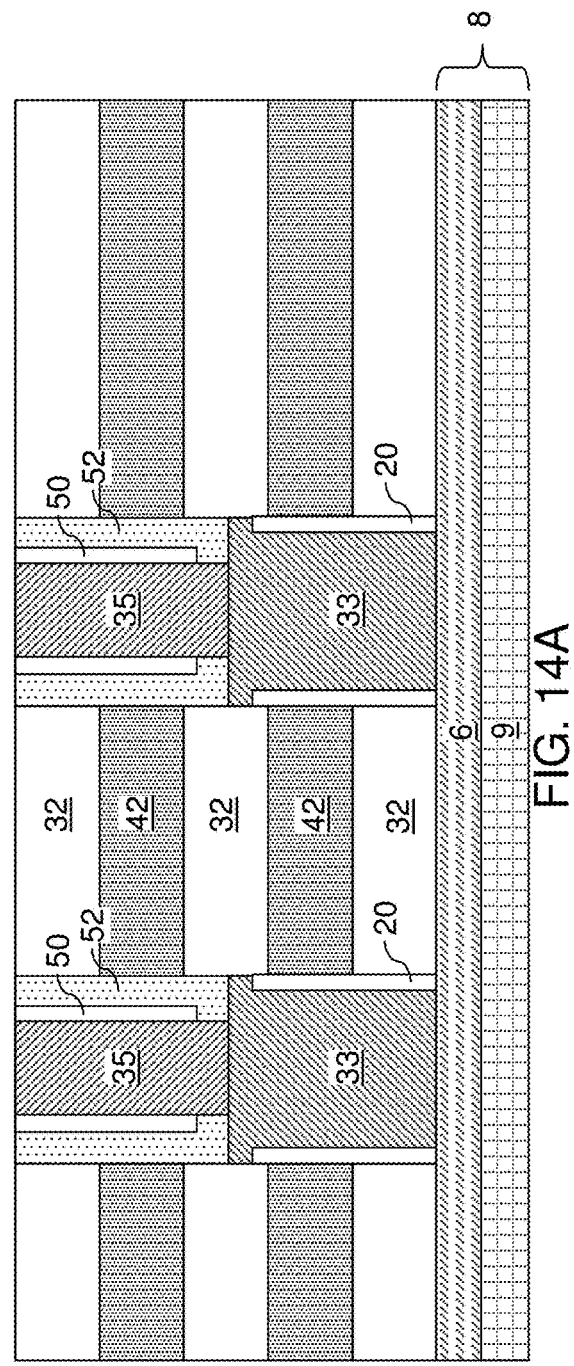
FIG. 14B
FIG. 14A

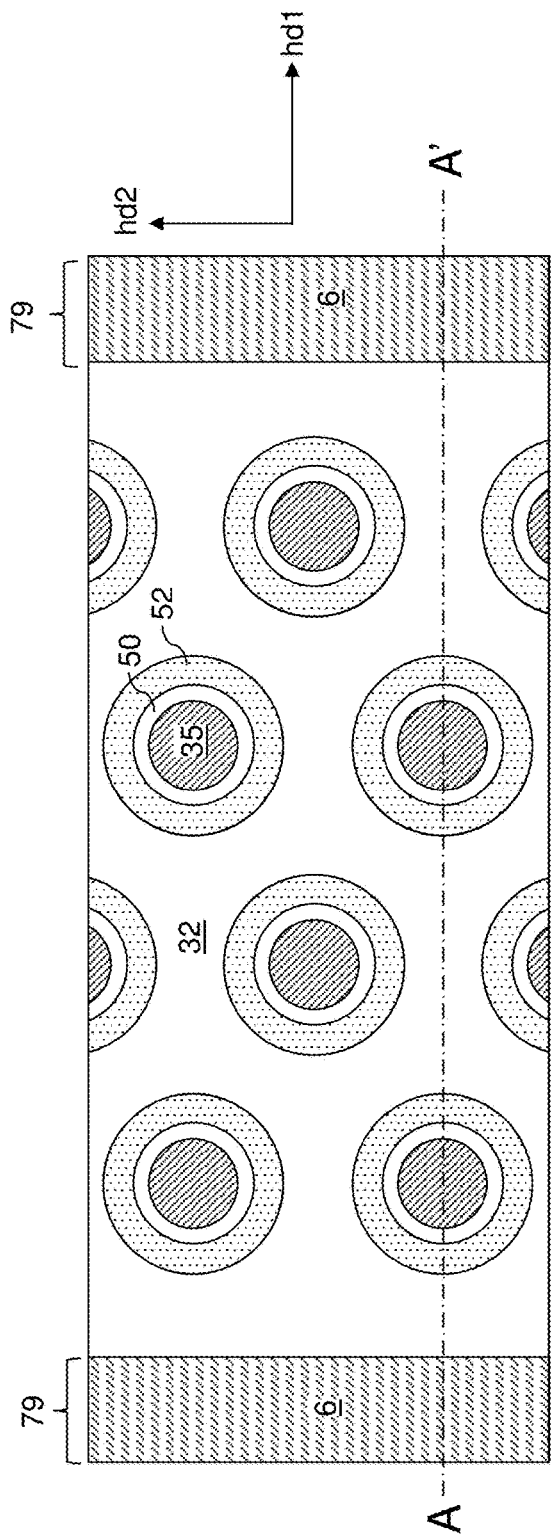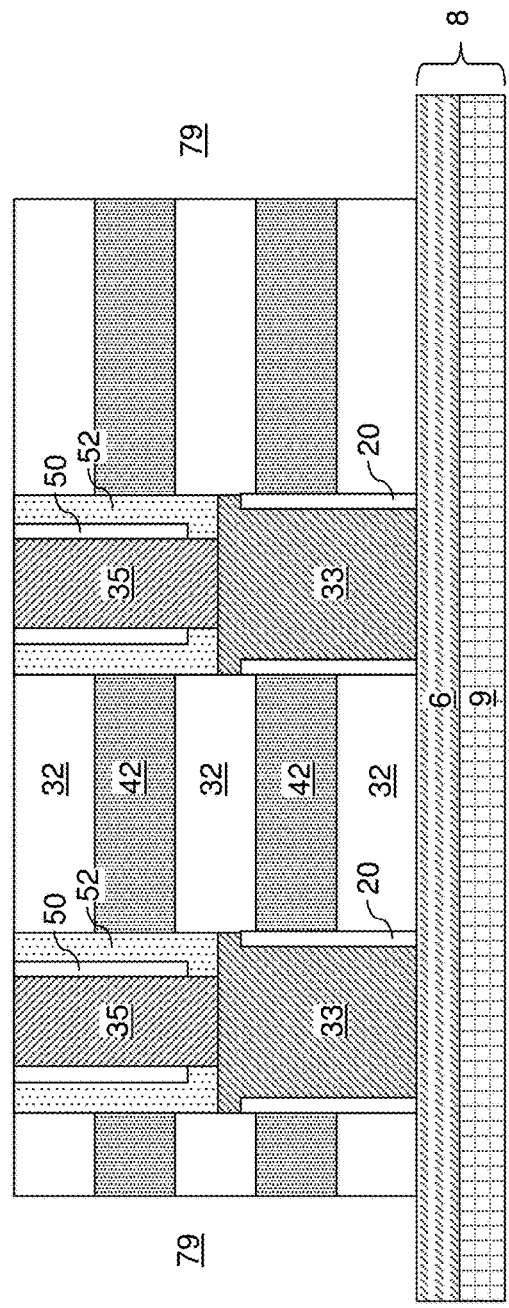
FIG. 15B
FIG. 15A

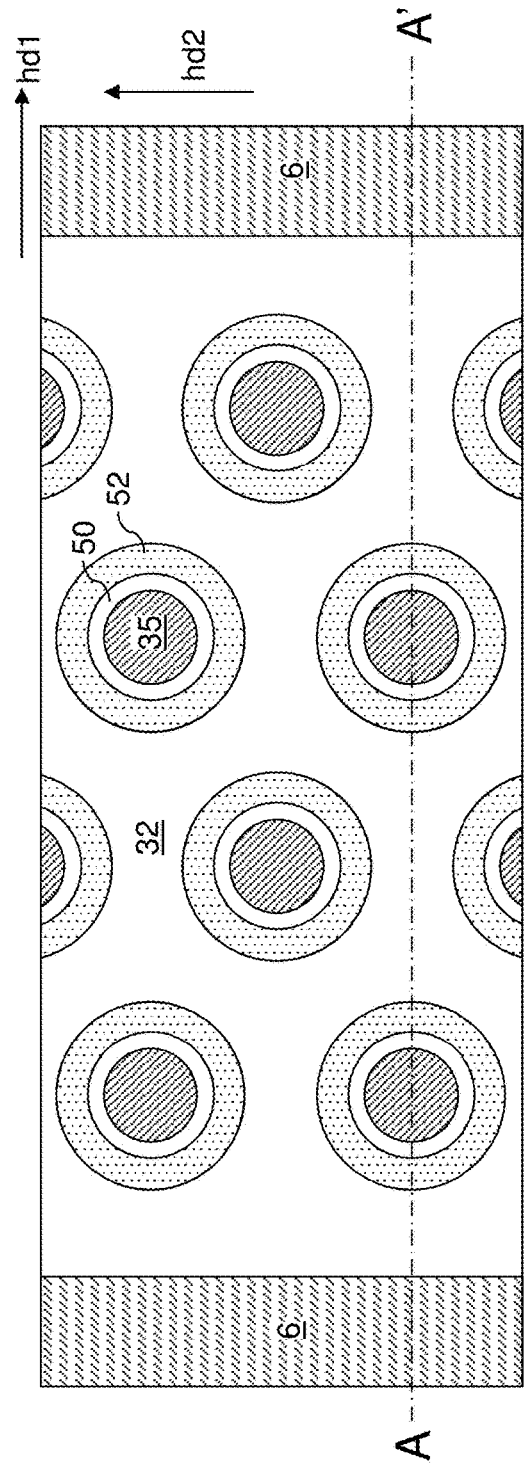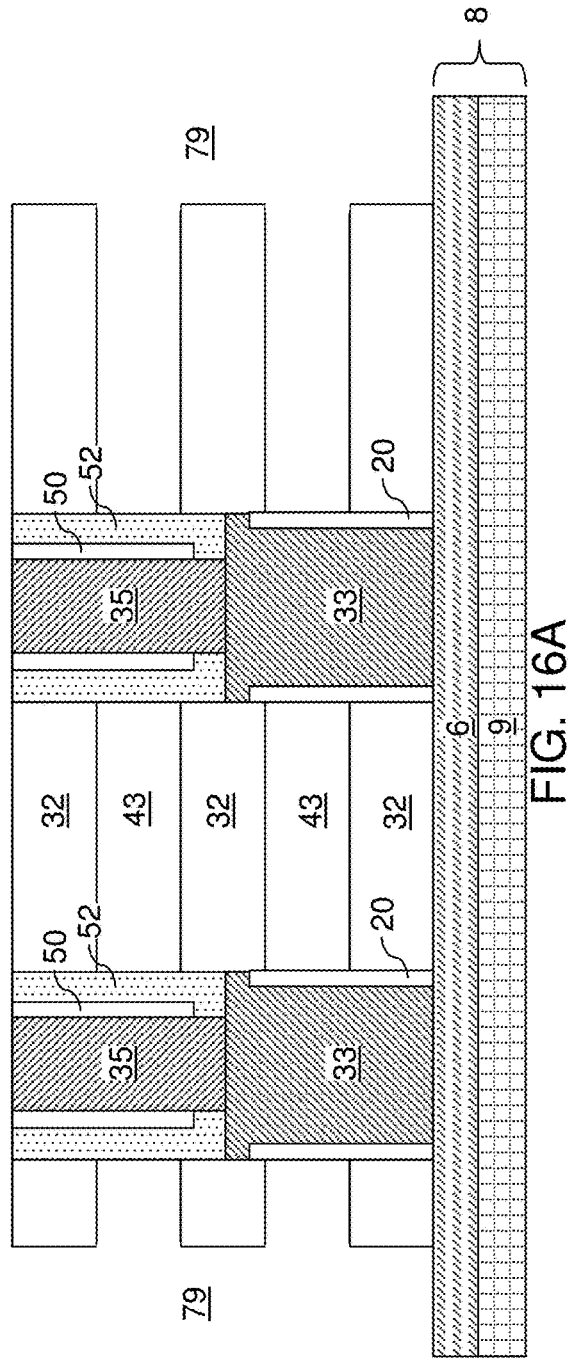

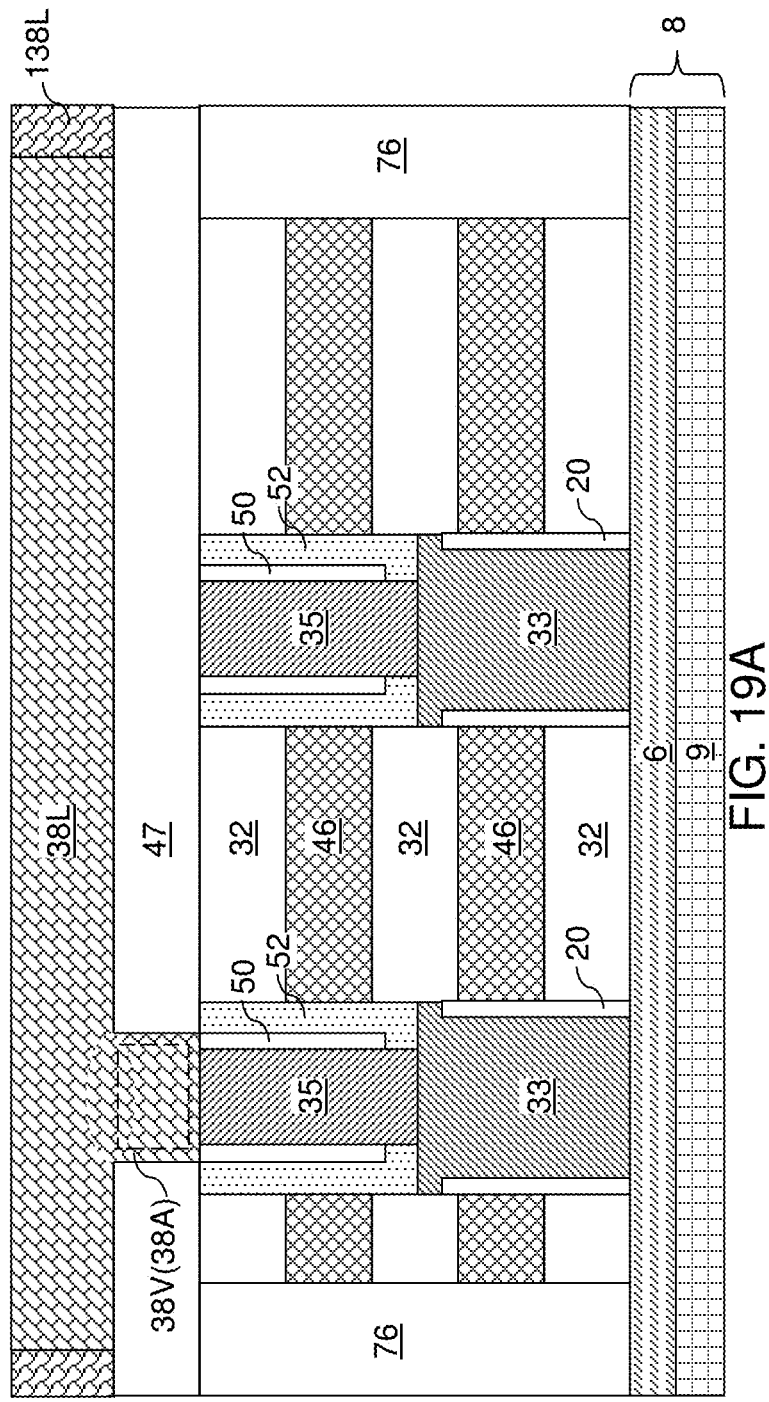

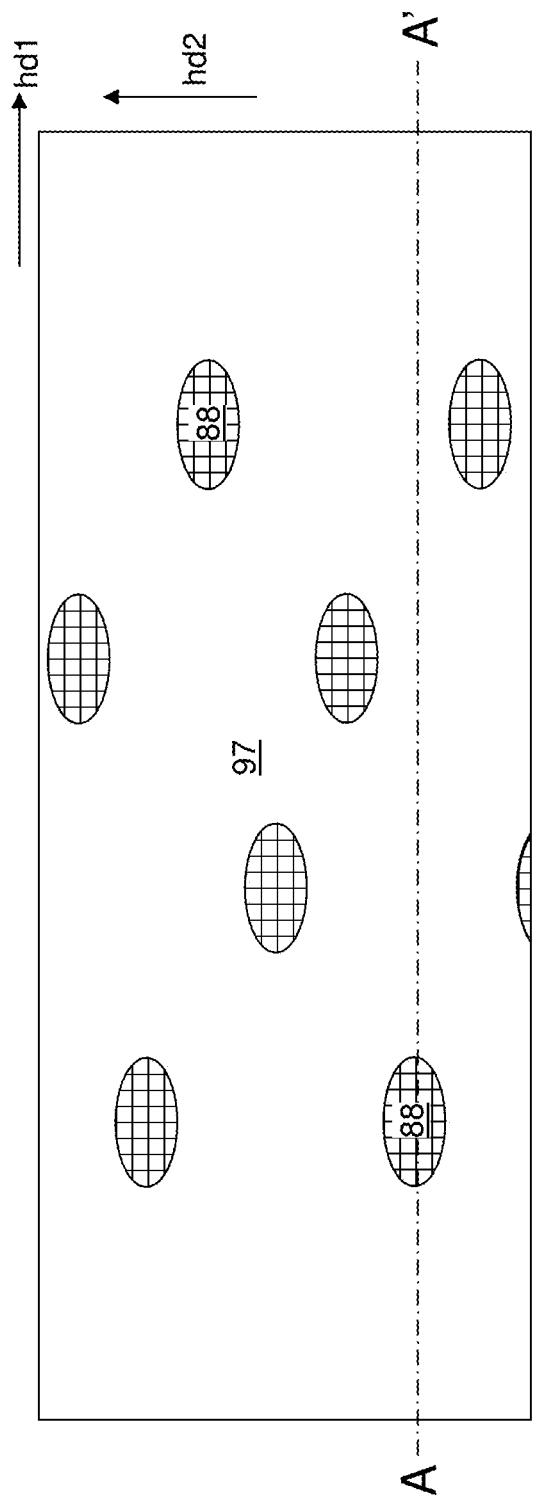

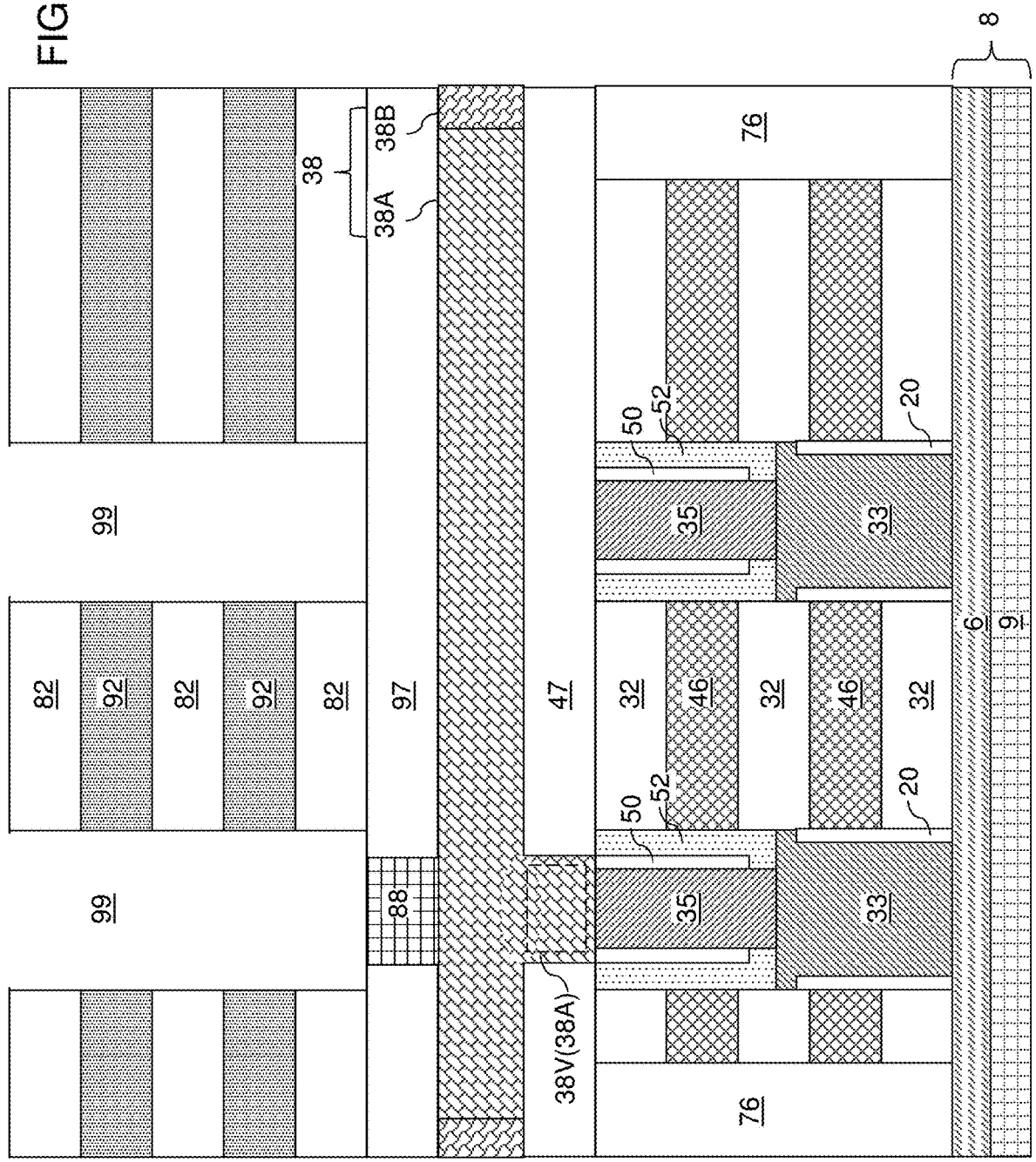

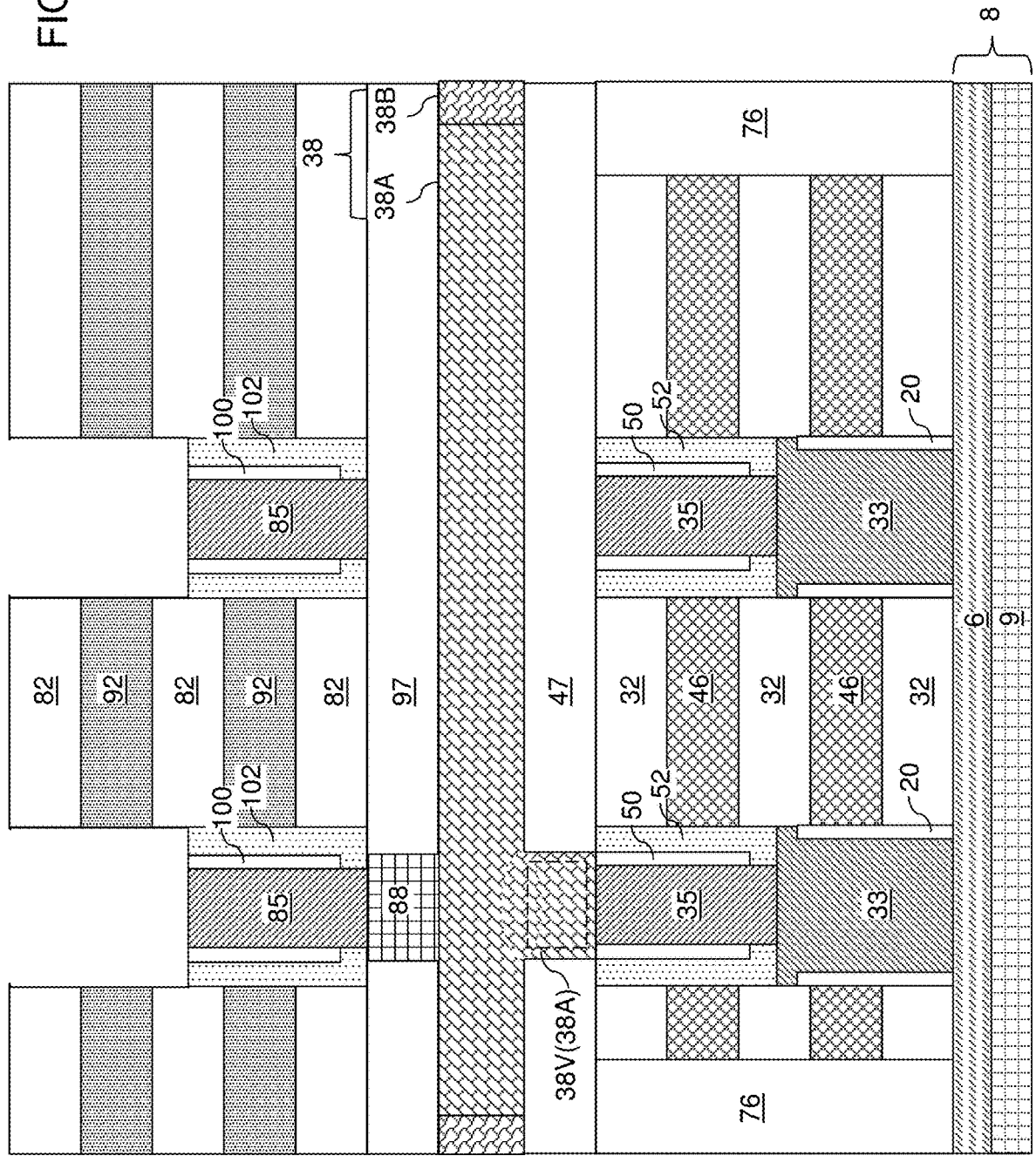

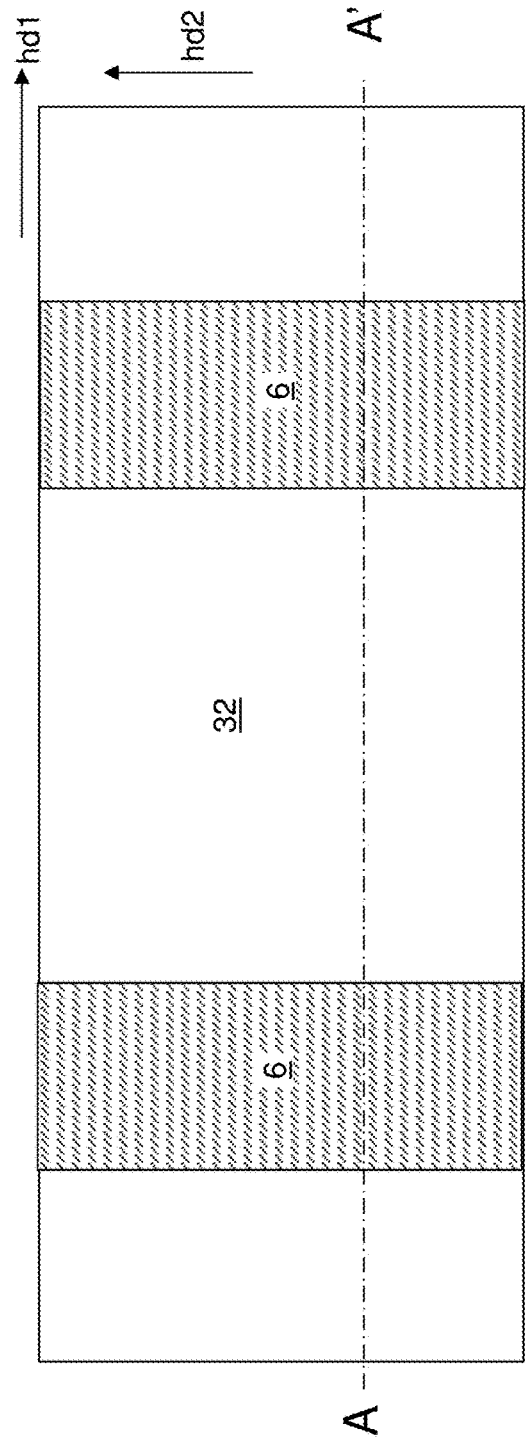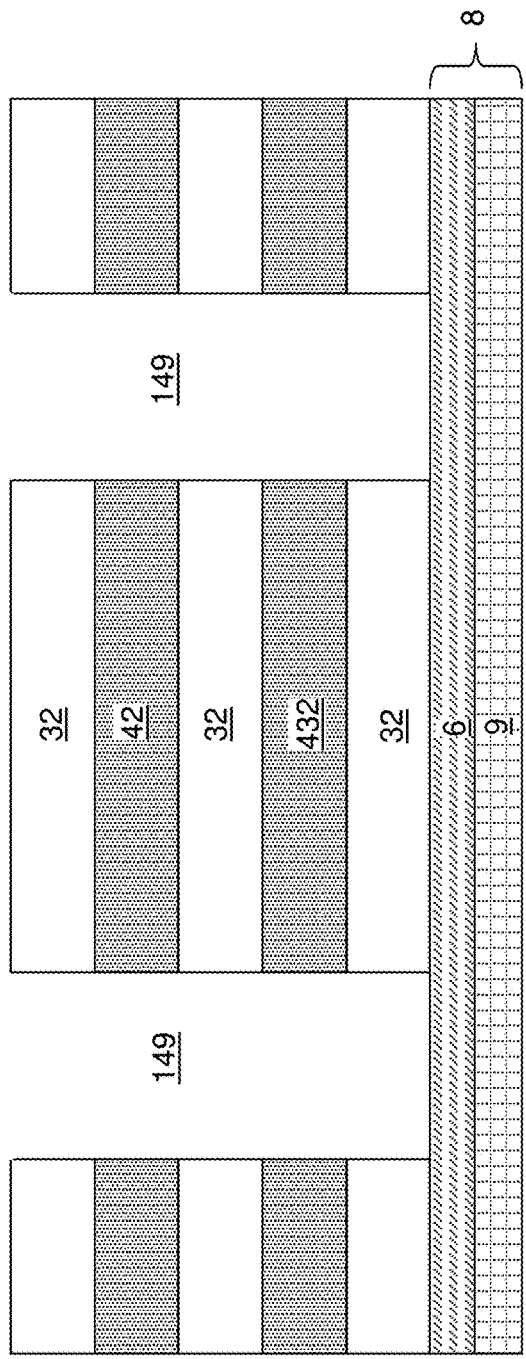

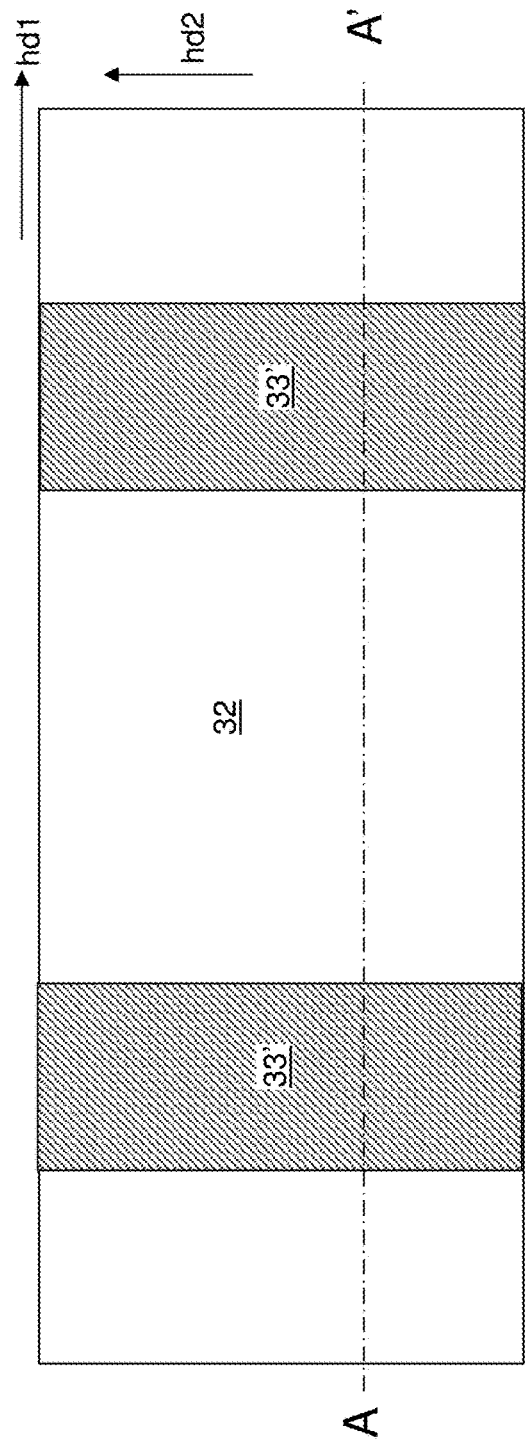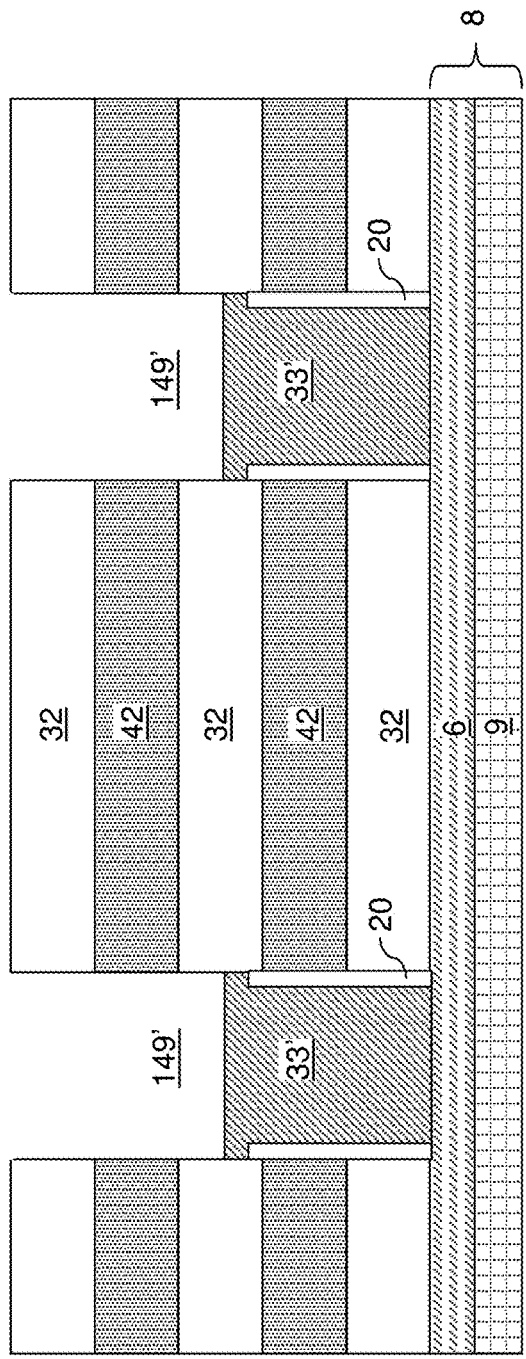

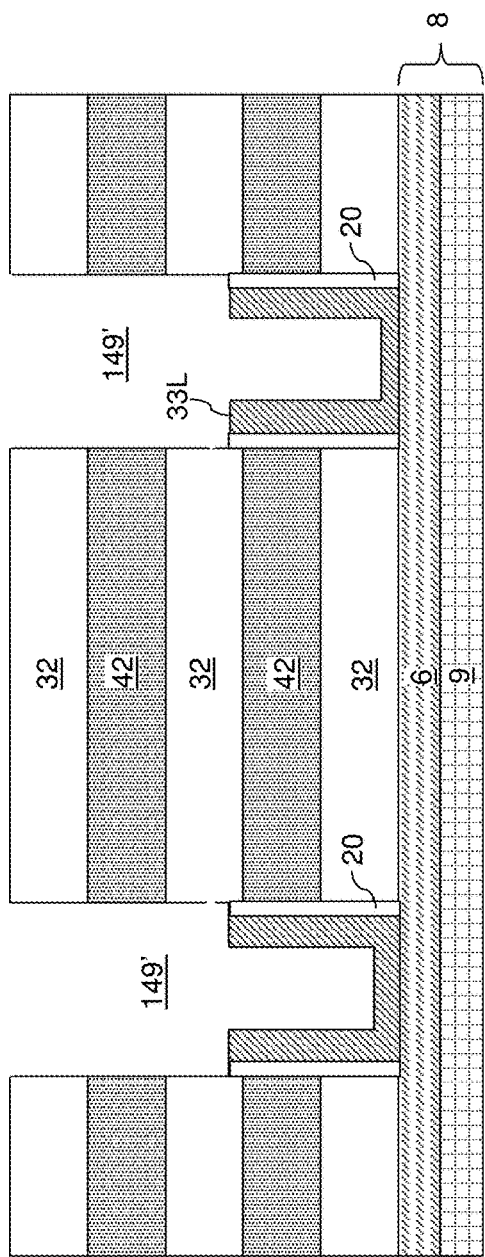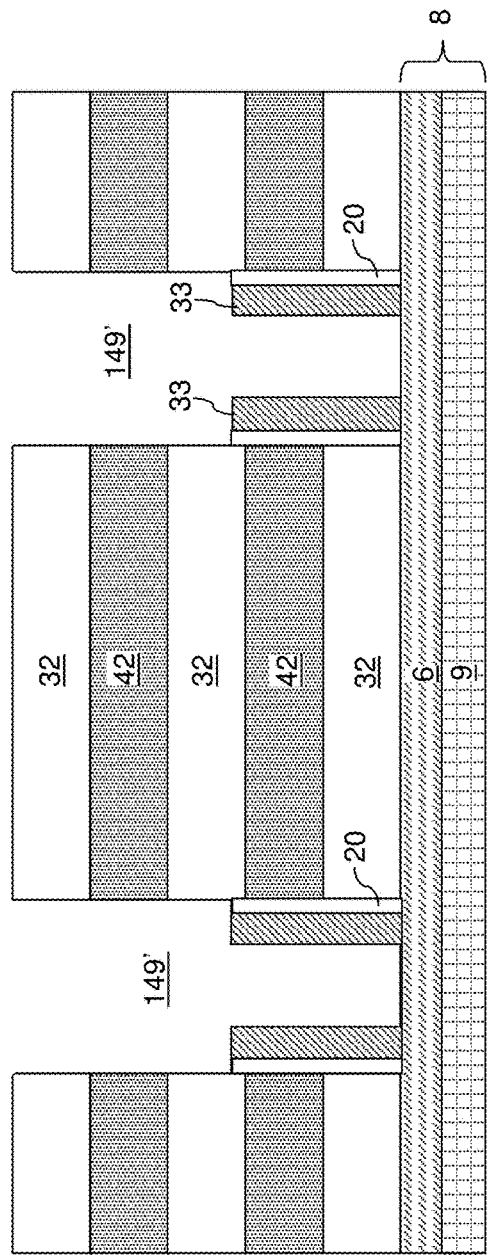

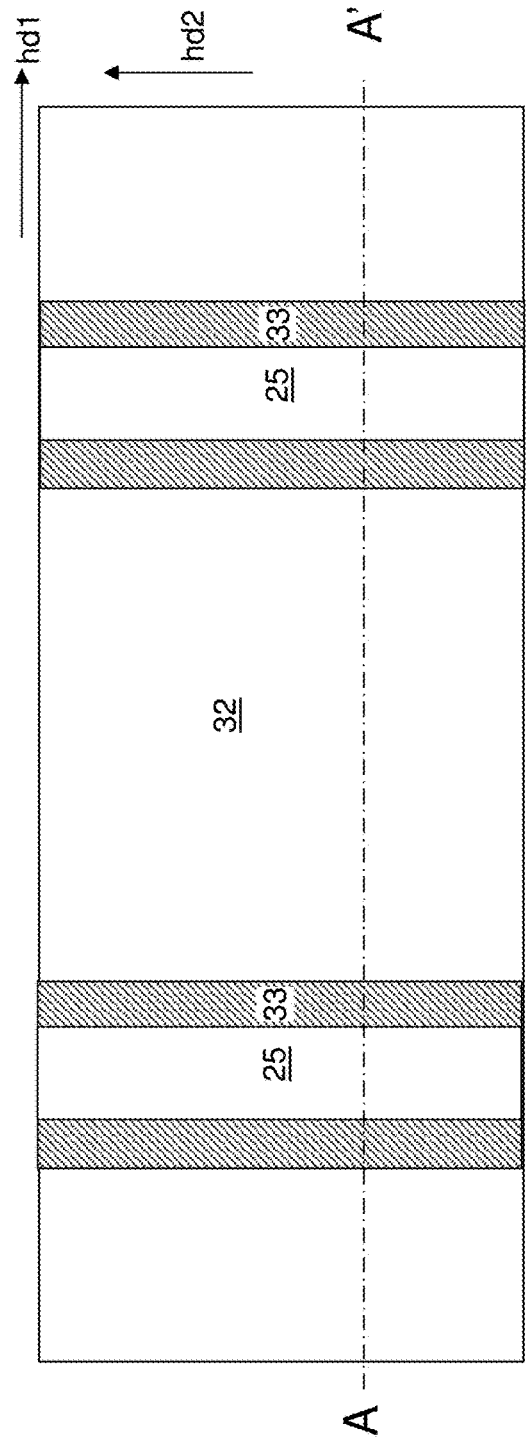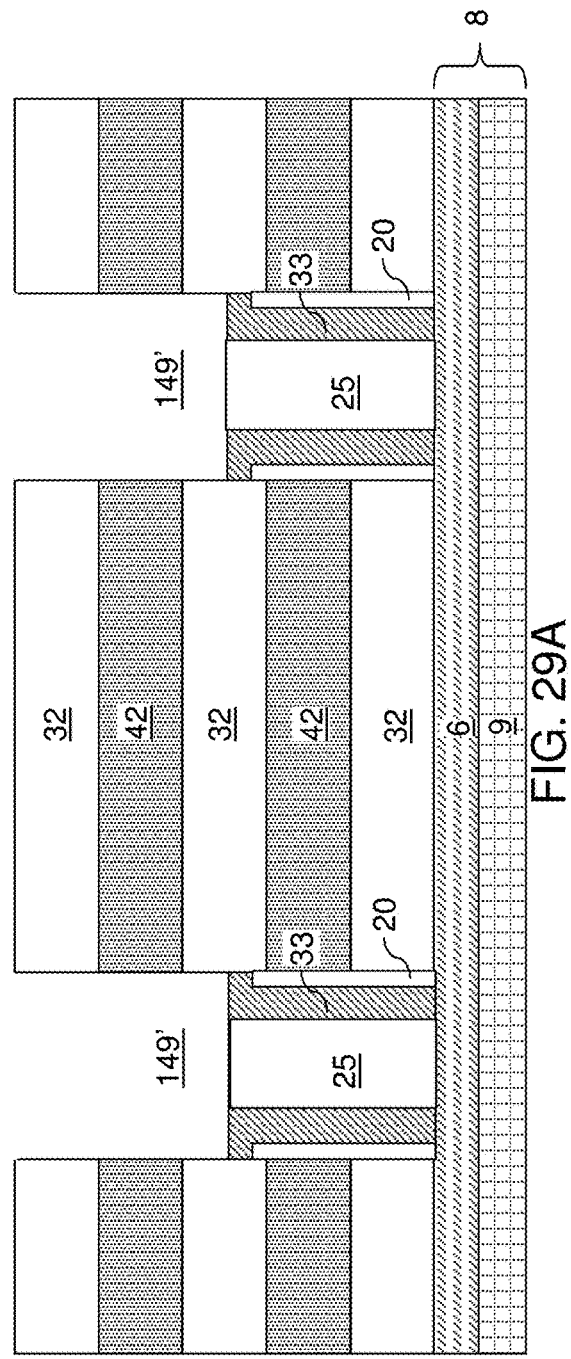

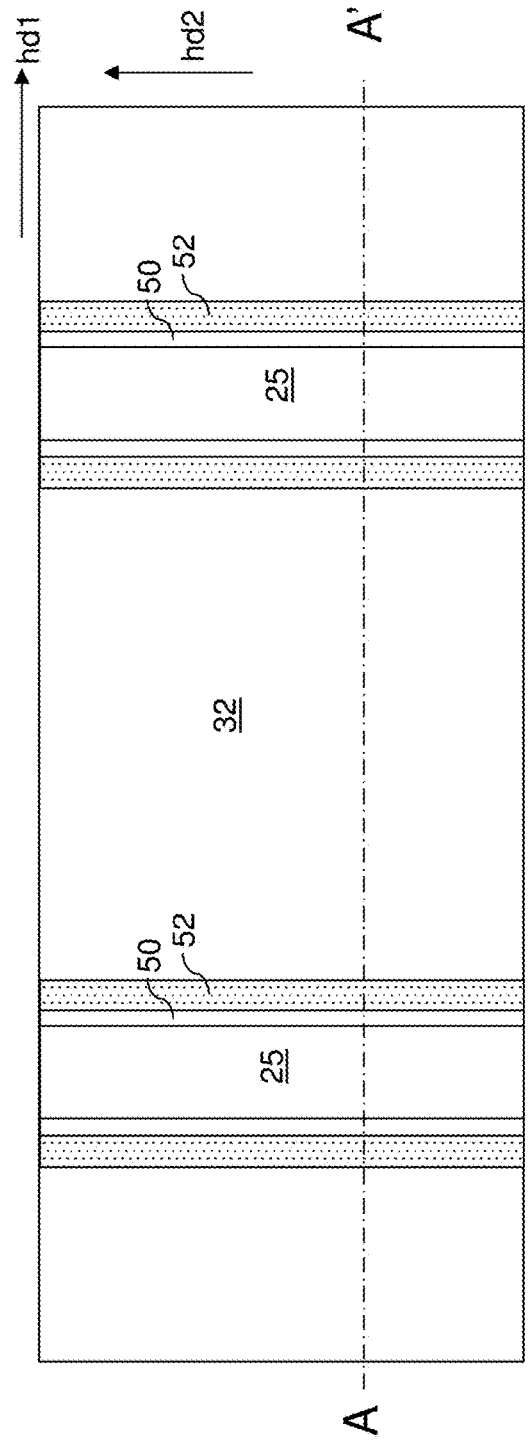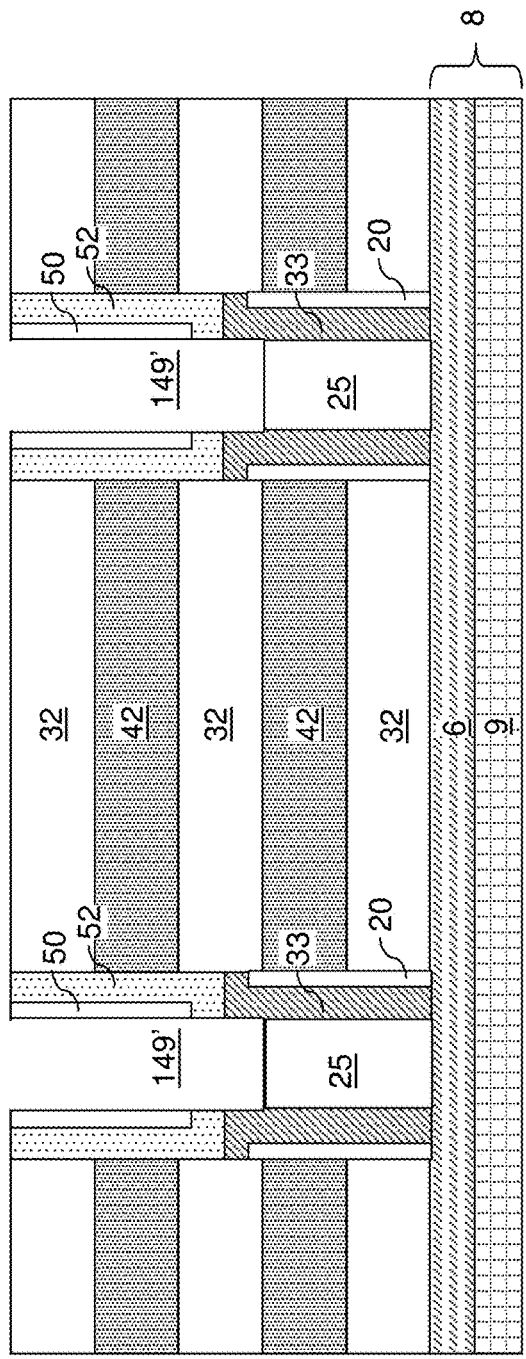

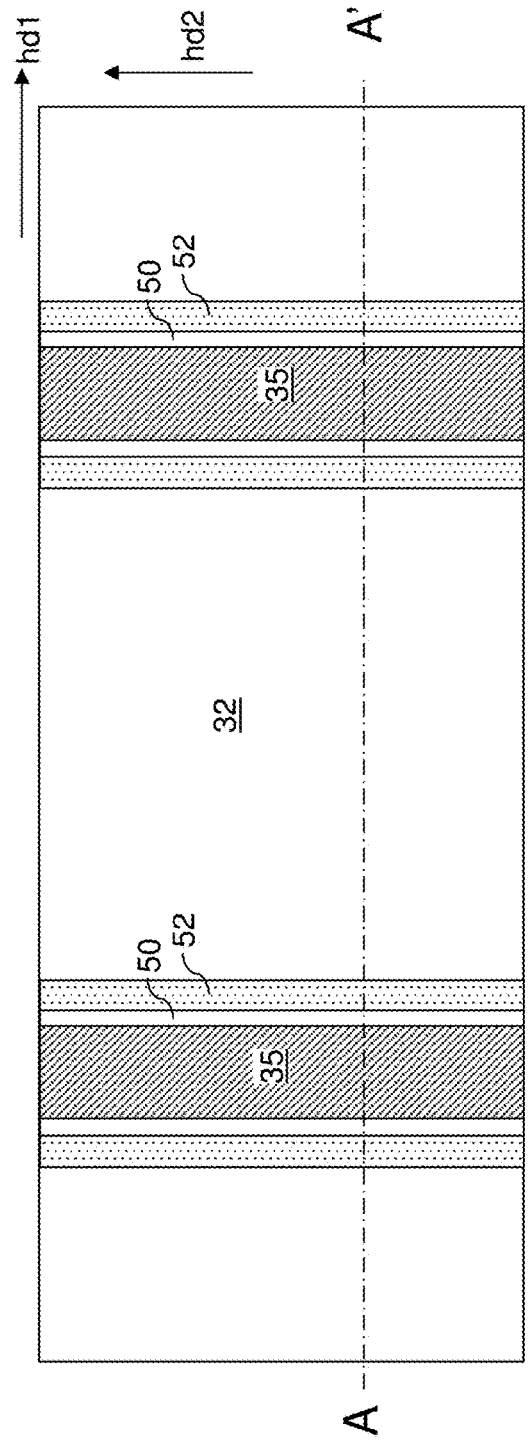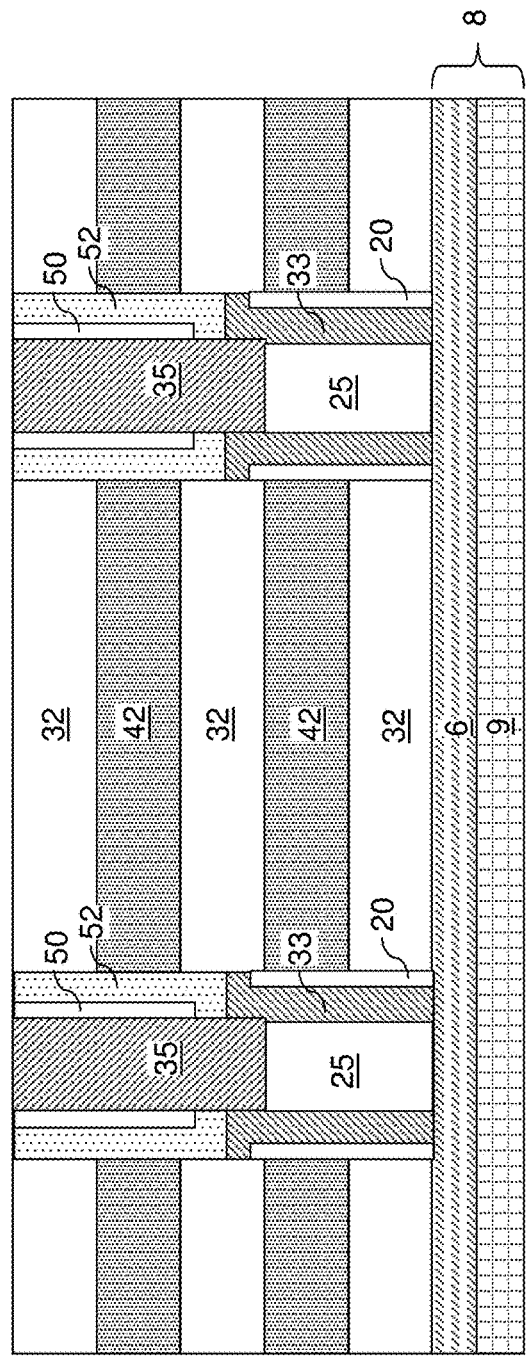

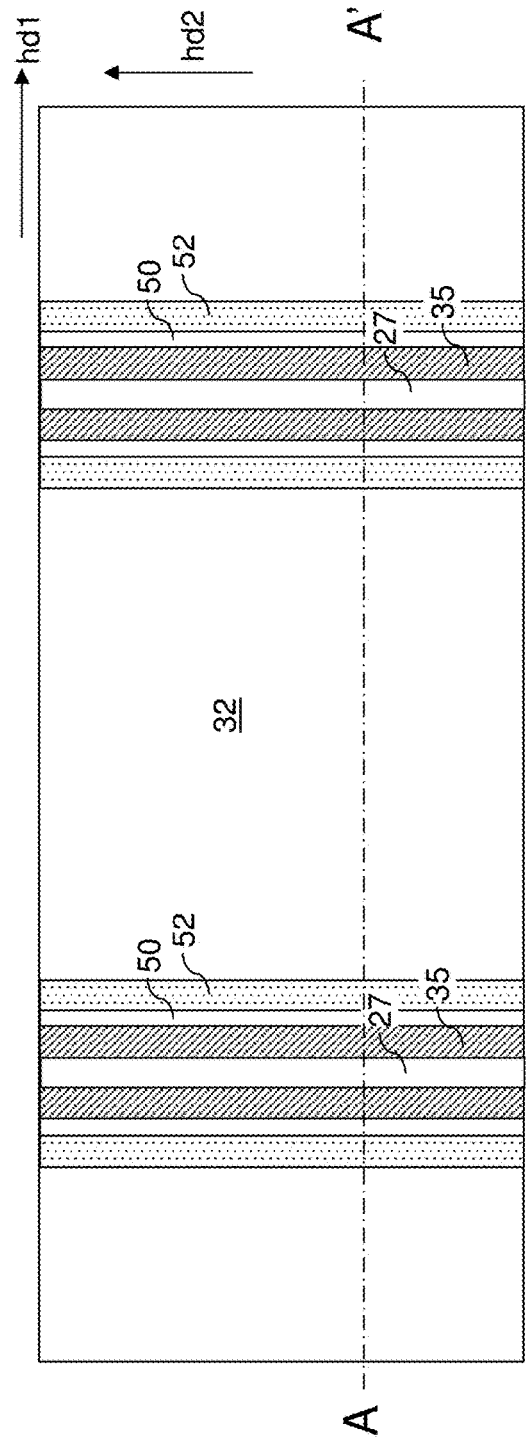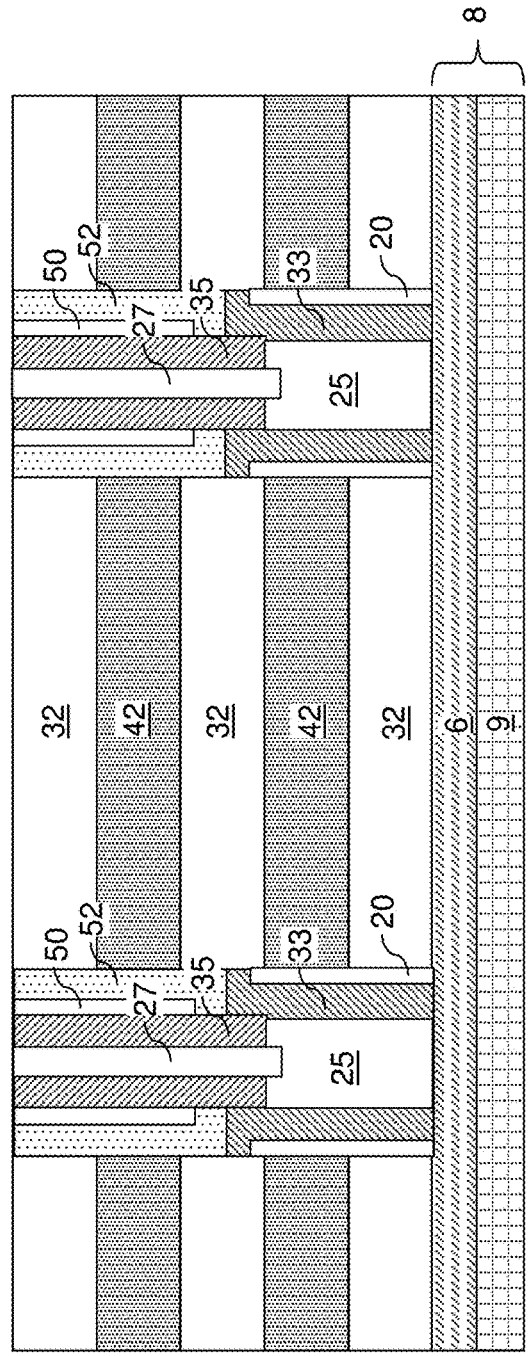

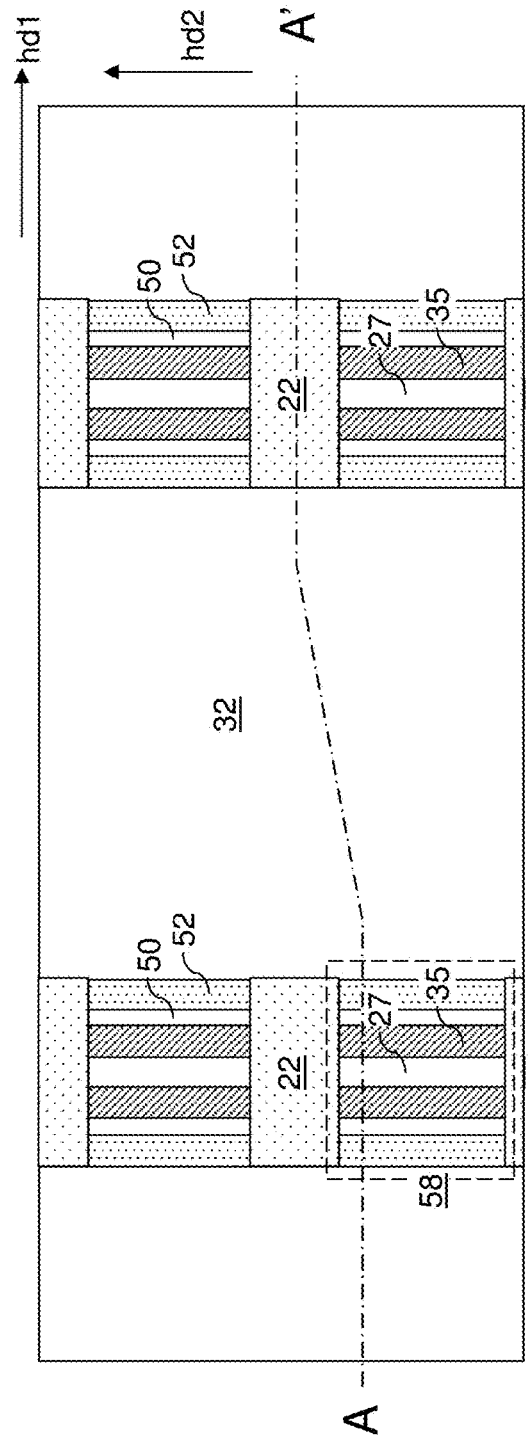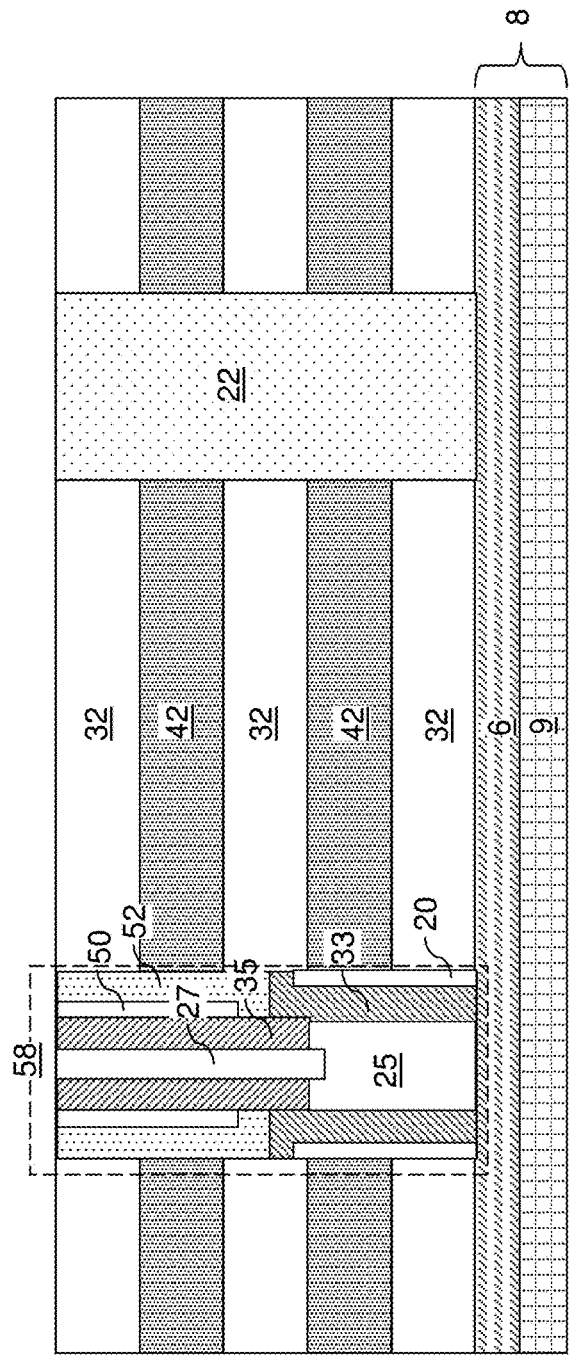

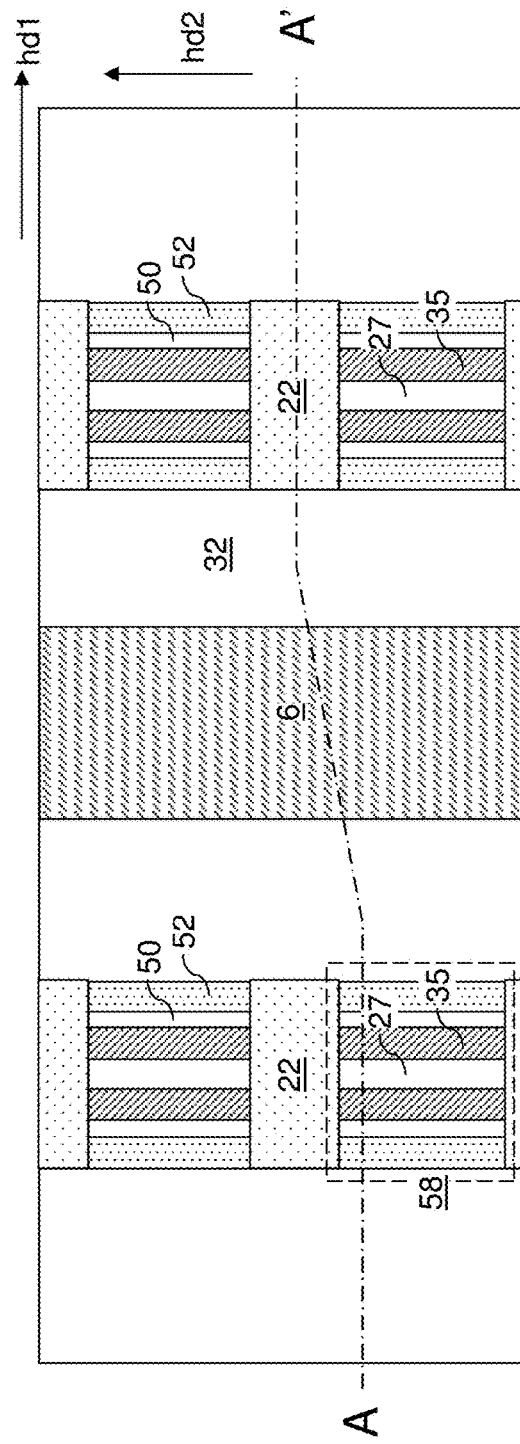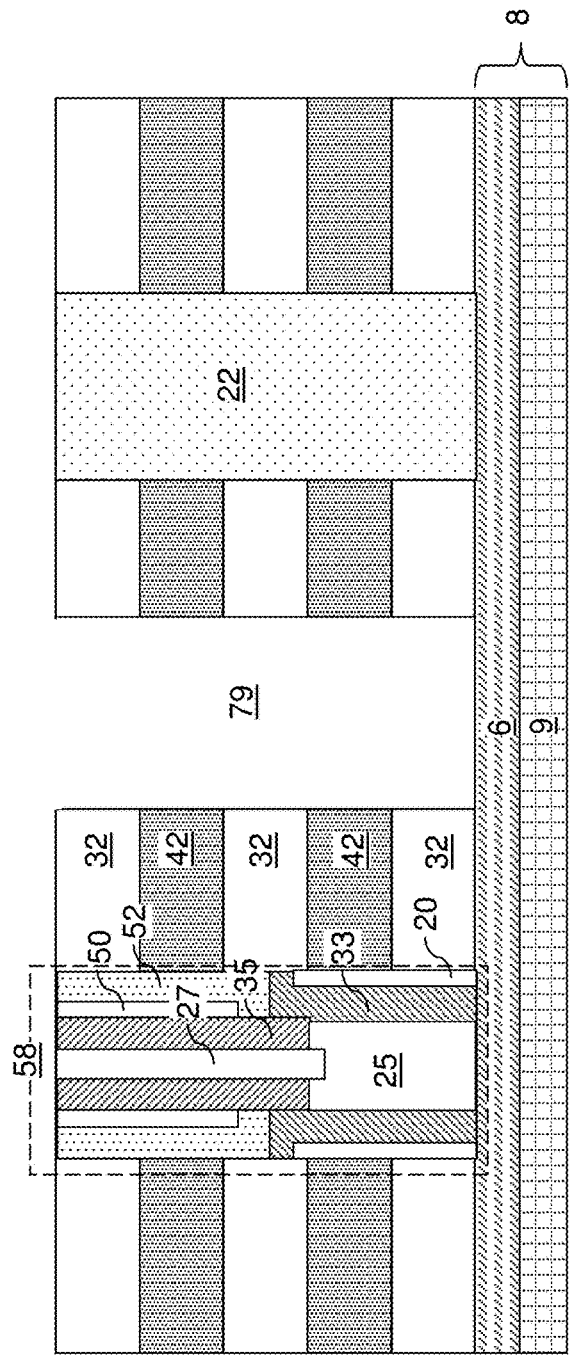

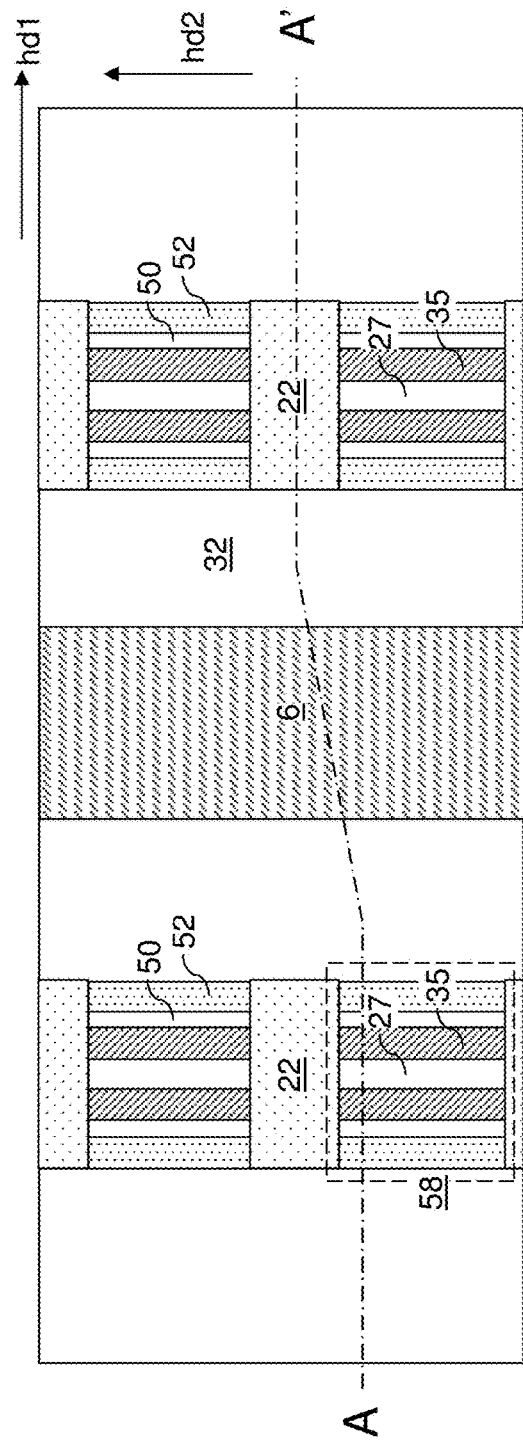
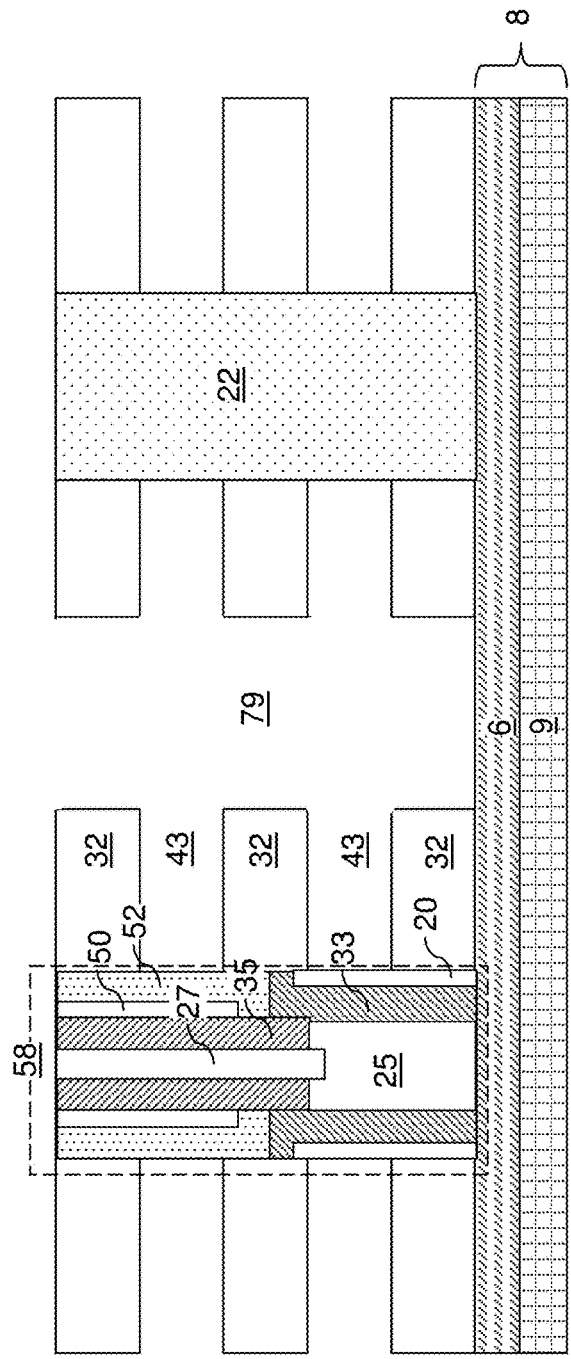
FIG. 35B
FIG. 35A

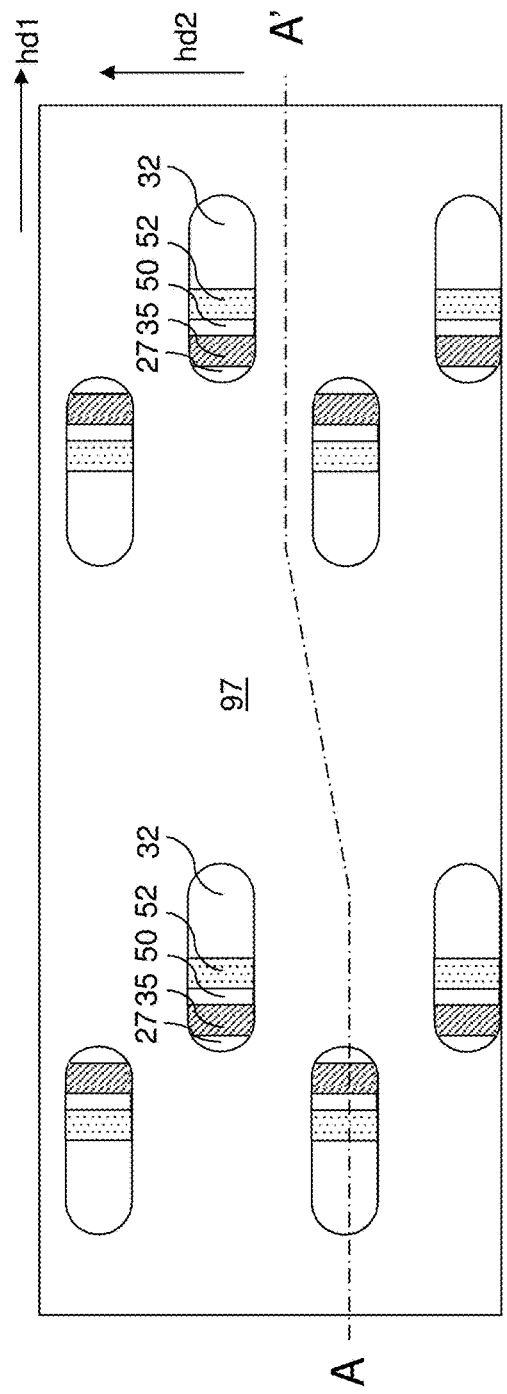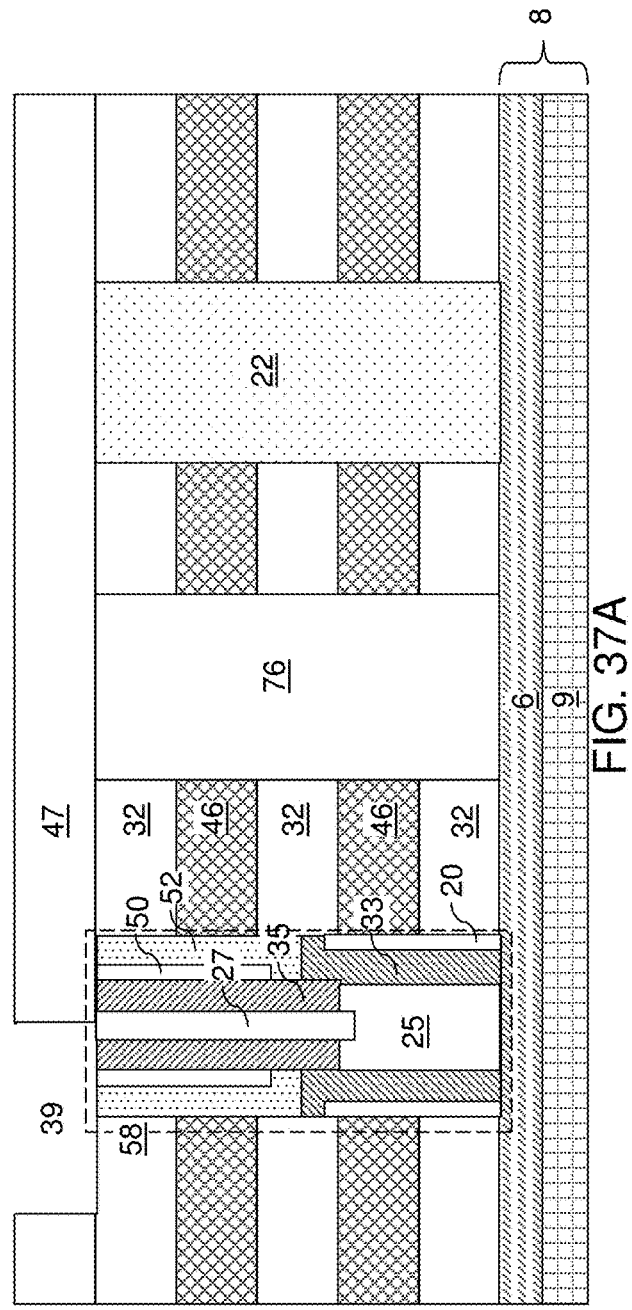
FIG. 37B
FIG. 37A

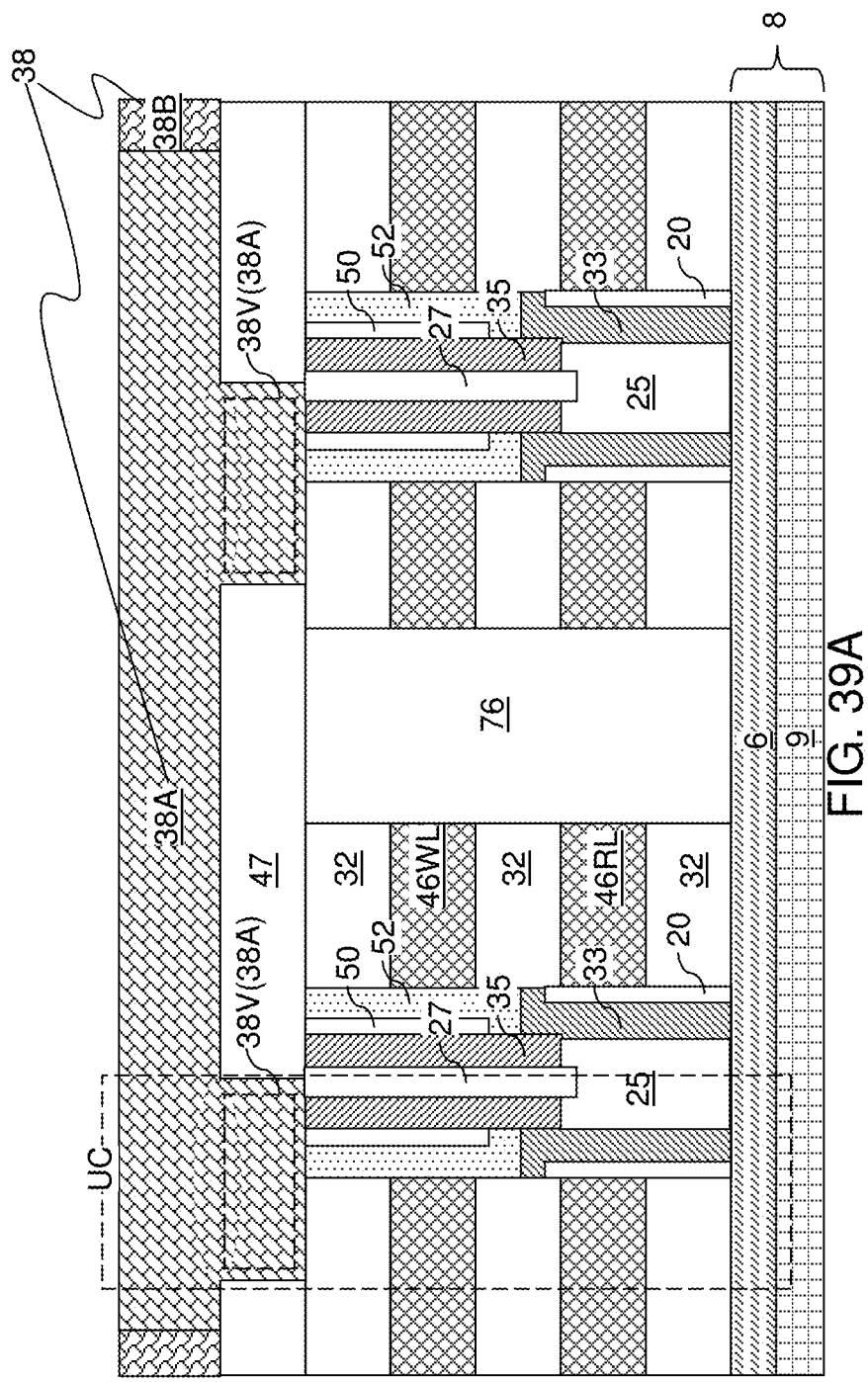

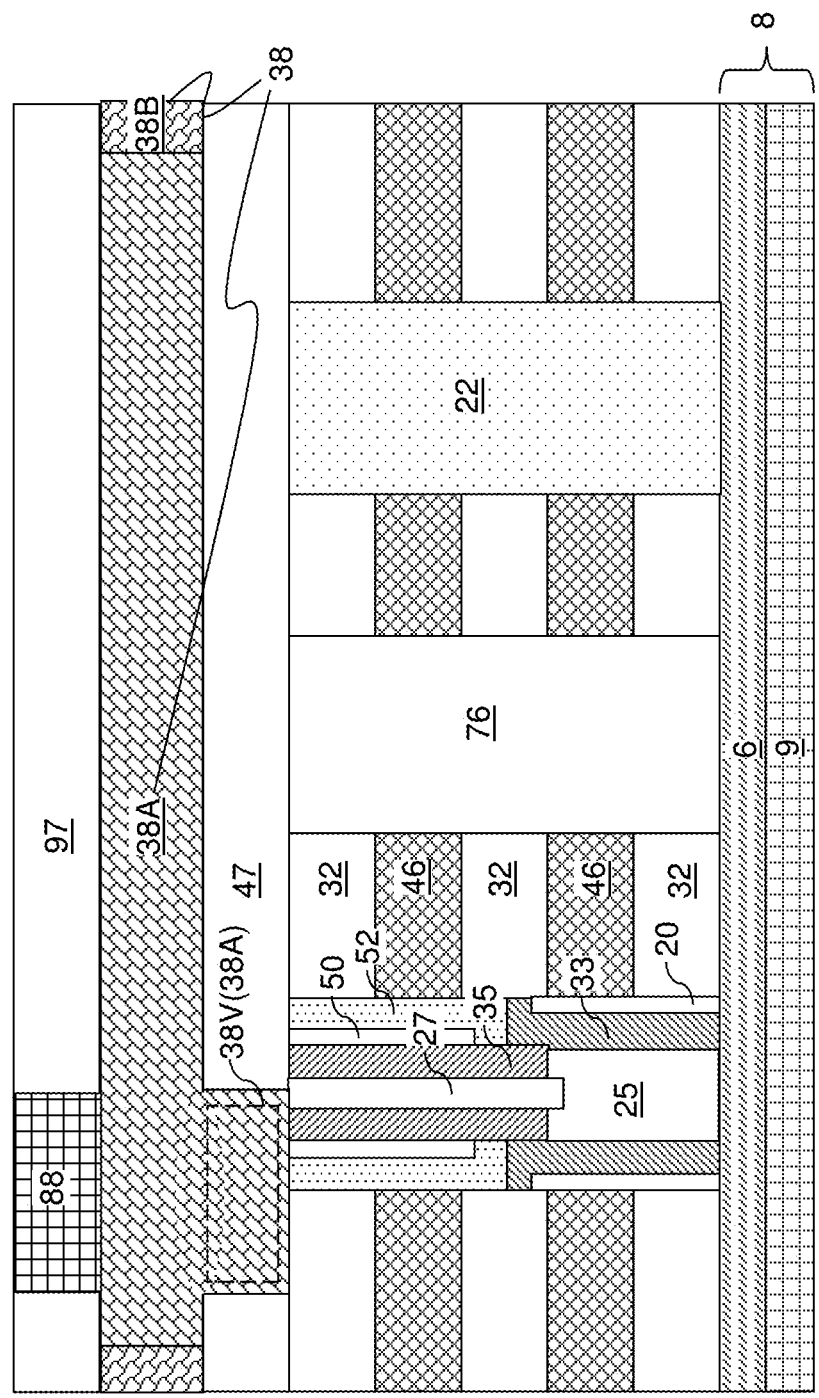

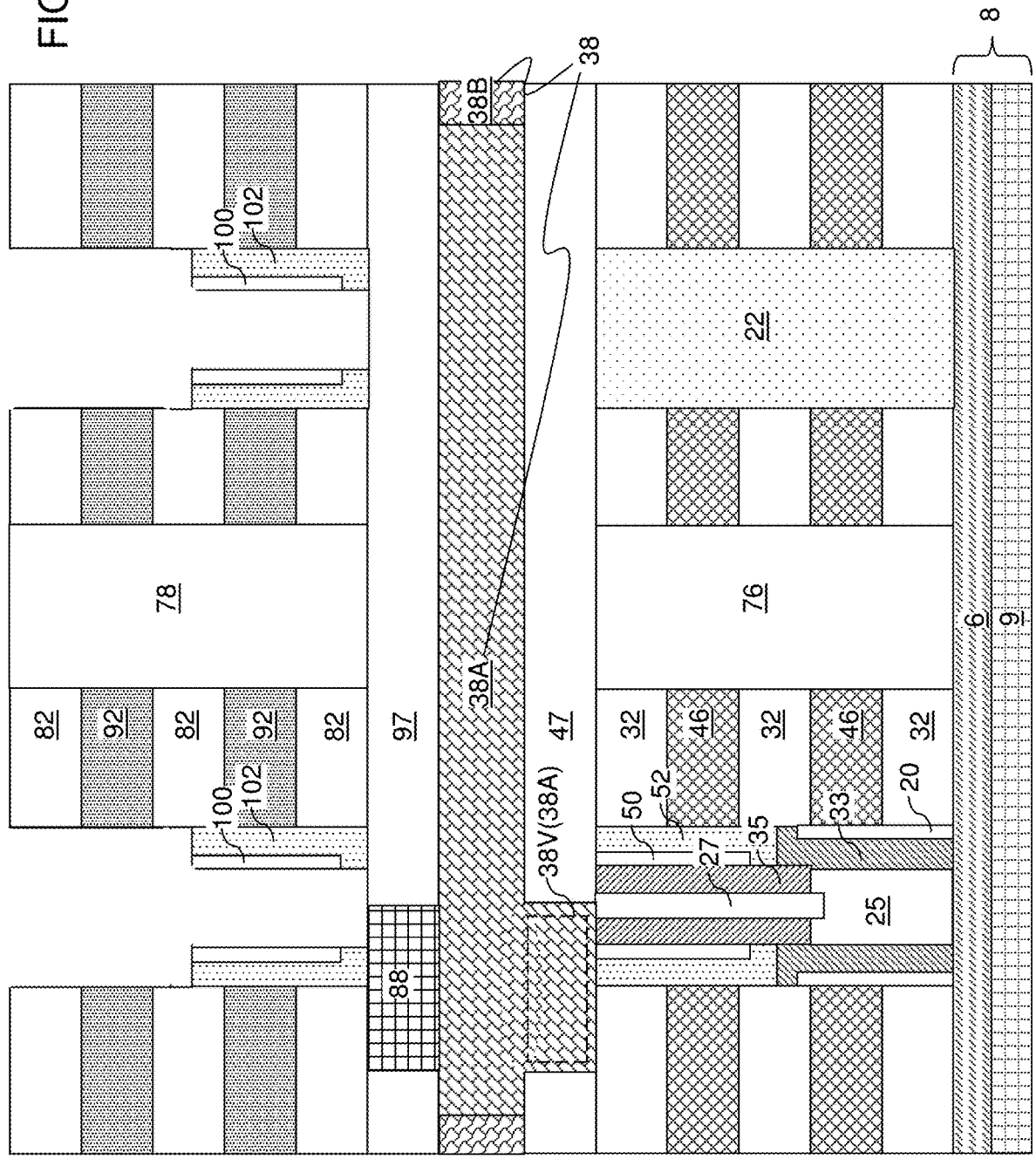

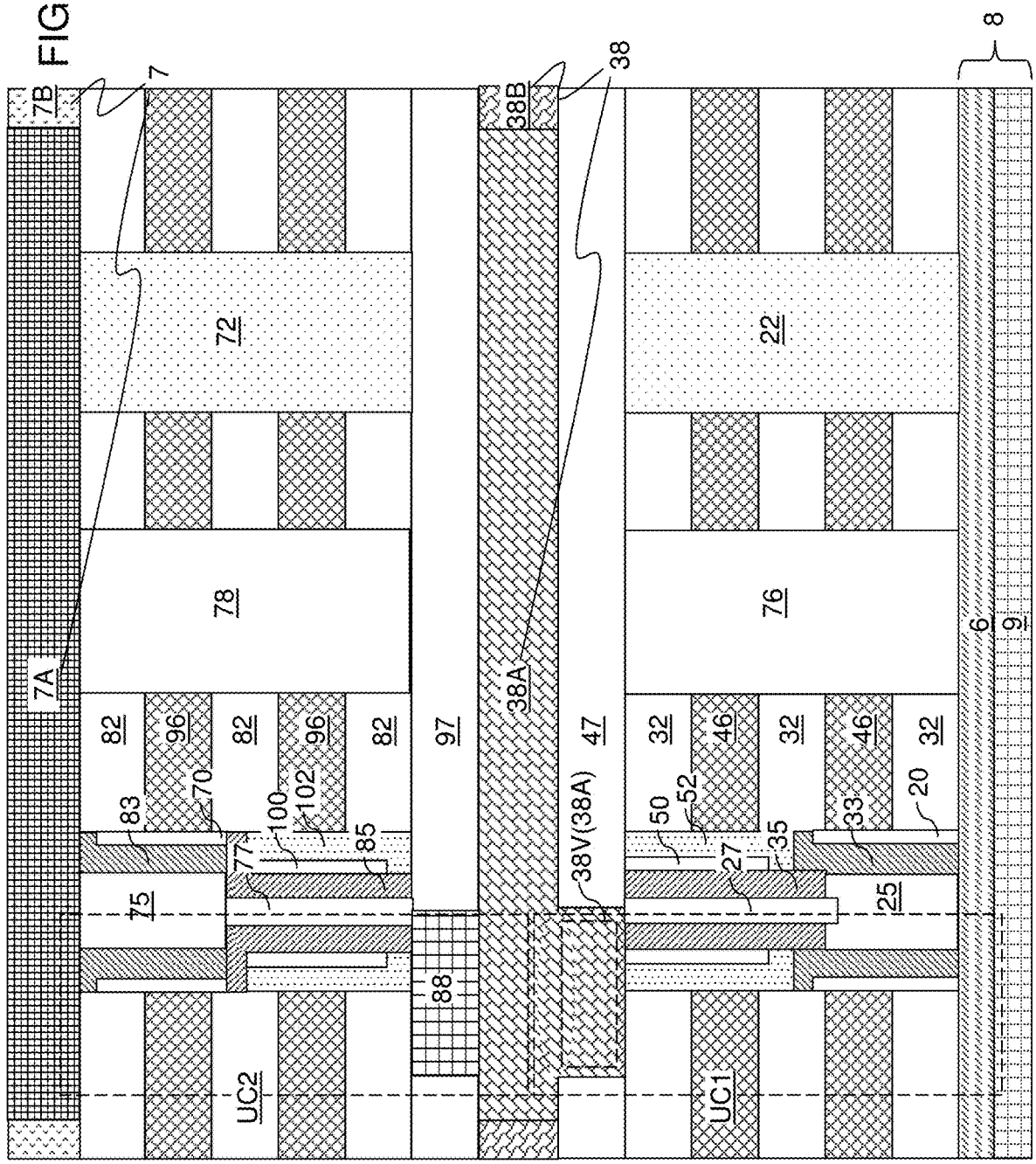

FERROELECTRIC MEMORY DEVICE CONTAINING A SERIES CONNECTED SELECT GATE TRANSISTOR AND METHOD OF FORMING THE SAME

FIELD

The present disclosure relates generally to the field of semiconductor memory devices, and in particular to ferroelectric memory device containing a series connected select gate transistor and method of forming the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material in a field effect transistor ferroelectric memory device.

SUMMARY

According to an embodiment of the present disclosure, a memory device comprising at least one ferroelectric memory unit cell is provided. Each of the at least one ferroelectric memory unit cell comprises: a respective first field effect transistor including a first semiconductor channel that extends between a first active region and a second active region that are located in a semiconductor substrate, a first gate dielectric disposed at a peripheral region of a trench extending downward from a top surface of the semiconductor substrate and located between the first active region and the second active region, and a first gate electrode located inside the trench over the first gate dielectric, wherein a first semiconductor channel underlies a horizontal portion of the first gate dielectric; and a respective second field effect transistor including a second semiconductor channel extending between the second active region and a third active region, a second gate dielectric comprising a ferroelectric material layer overlying the second semiconductor channel, and a second gate electrode overlying the second gate dielectric.

According to another aspect of the present disclosure, a method of forming a memory device comprising at least one ferroelectric memory unit cell is provided. Each of the at least one ferroelectric memory unit cell is formed by: forming a trench, a first active region, a second active region, and a third active region in an upper portion of a semiconductor substrate, wherein the trench is formed between the first active region and the second active region; forming a stack of a first gate dielectric and a first gate electrode within the trench; and forming a stack of a second gate electrode and a second gate dielectric comprising a ferroelectric material layer over a portion of the semiconductor substrate located between the second active region and the third active region. A first semiconductor channel is formed underneath the first gate dielectric between the first active region and the second active region; and a second semiconductor channel is formed underneath the second gate dielectric between the second active region and the third active region.

According to yet another aspect of the present disclosure, a memory device comprising at least one ferroelectric memory unit cell is provided. Each of the at least one ferroelectric memory unit cell is located over a substrate and comprises: a respective first field effect transistor including a first vertical semiconductor channel, a first gate dielectric contacting a sidewall of the first vertical semiconductor channel, and a portion of a first electrically conductive layer that contacts the first gate dielectric; a respective second field effect transistor including a second vertical semiconductor channel, a second gate dielectric comprising a ferroelectric material layer and contacting a sidewall of the second vertical semiconductor channel and contacting a top end or a bottom end of the first vertical semiconductor channel, and a portion of a second electrically conductive layer that contacts the second gate dielectric; a respective first active region connected to a bottom end of a stack of the first vertical semiconductor channel and the second vertical semiconductor channel; and a respective second active region connected to a top end of the stack of the first vertical semiconductor channel and the second vertical semiconductor channel.

According to still another aspect of the present disclosure, a method of forming a memory device including at least one ferroelectric memory unit cell is provided. Each of the at least one ferroelectric memory unit cell is formed over a substrate by: forming a respective first active region; forming a respective stack of a first field effect transistor and a second field effect transistor that overlies or underlies the first field effect transistor over the first active region, wherein the first field effect transistor includes a first vertical semiconductor channel, a first gate dielectric contacting a sidewall of the first vertical semiconductor channel, and a portion of a first electrically conductive layer that contacts the first gate dielectric, and the second field effect transistor includes a second vertical semiconductor channel, a second gate dielectric comprising a ferroelectric material layer and contacting a sidewall of the second vertical semiconductor channel and contacting a top end or a bottom end of the first vertical semiconductor channel, and a portion of a second electrically conductive layer that contacts the second gate dielectric; and forming a respective second active region on a top end of the respective stack of the first vertical semiconductor channel and the second vertical semiconductor channel.

BRIEF DESCRIPTION OF THE DRAWINGS

FIGS. 1C and 1D are tables illustrating exemplary voltages that may be used to operate respective single level cells and multilevel cells in the circuits of FIGS. 1A and 1B.

FIG. 2A is a vertical cross-sectional view of a first exemplary structure after formation of dielectric isolation structures in an upper region of a semiconductor substrate according to the first embodiment of the present disclosure.

FIG. 2B is a top-down view of the first exemplary structure of FIG. 2A. The vertical plane A-A' is the plane of the vertical cross-sectional view of FIG. 2A.

FIG. 2C is a vertical cross-sectional view of the first exemplary structure along the vertical plane C-C' of FIG. 2B.

FIG. 3A is a vertical cross-sectional view of a first exemplary structure after formation of active regions according to the first embodiment of the present disclosure.

FIG. 3B is a top-down view of the first exemplary structure of FIG. 3A. The vertical plane A-A' is the plane of the vertical cross-sectional view of FIG. 3A.

FIG. 3C is a vertical cross-sectional view of the first exemplary structure along the vertical plane C-C' of FIG. 3B.

FIG. 4A is a vertical cross-sectional view of a first exemplary structure after formation of line trenches according to the first embodiment of the present disclosure.

FIG. 4B is a top-down view of the first exemplary structure of FIG. 4A. The vertical plane A-A' is the plane of the vertical cross-sectional view of FIG. 4A.

FIG. 5A is a vertical cross-sectional view of a first exemplary structure after formation of first gate dielectric strips and first gate electrode lines according to the first embodiment of the present disclosure.

FIG. 5B is a top-down view of the first exemplary structure of FIG. 5A. The vertical plane A-A' is the plane of the vertical cross-sectional view of FIG. 5A.

FIG. 5C is a vertical cross-sectional view of the first exemplary structure along the vertical plane C-C' of FIG. 5B.

FIG. 6A is a vertical cross-sectional view of a first exemplary structure after formation of second gate dielectric strips and second gate electrode lines according to the first embodiment of the present disclosure.

FIG. 6B is a top-down view of the first exemplary structure of FIG. 6A. The vertical plane A-A' is the plane of the vertical cross-sectional view of FIG. 6A.

FIG. 7A is a vertical cross-sectional view of a first exemplary structure after formation of a first interconnect-level dielectric layer, source contact via structures, and source lines according to the first embodiment of the present disclosure.

FIG. 7B is a top-down view of the first exemplary structure of FIG. 7A. The vertical plane A-A' is the plane of the vertical cross-sectional view of FIG. 7A.

FIG. 9A is a vertical cross-sectional view of a second exemplary structure after formation of first-level discrete memory openings through a first alternating stack of first-level insulating layers and first-level spacer material layers according to a second embodiment of the present disclosure.

FIG. 9B is a top-down view of the second exemplary structure of FIG. 9A. The plane A-A' is the plane of the vertical cross-sectional view of FIG. 9A.

FIG. 10A is a vertical cross-sectional view of the second exemplary structure after formation of first gate dielectrics according to the second embodiment of the present disclosure.

FIG. 10B is a top-down view of the second exemplary structure of FIG. 10A. The plane A-A' is the plane of the vertical cross-sectional view of FIG. 10A.

FIG. 12A is a vertical cross-sectional view of the second exemplary structure after formation of second gate dielectric material layers according to the second embodiment of the present disclosure.

FIG. 12B is a top-down view of the second exemplary structure of FIG. 12A. The plane A-A' is the plane of the vertical cross-sectional view of FIG. 12A.

FIG. 13A is a vertical cross-sectional view of the second exemplary structure after formation of second gate dielectrics according to the second embodiment of the present disclosure.

FIG. 13B is a top-down view of the second exemplary structure of FIG. 13A. The plane A-A' is the plane of the vertical cross-sectional view of FIG. 13A.

FIG. 14A is a vertical cross-sectional view of the second exemplary structure after formation of second vertical semiconductor channels according to the second embodiment of the present disclosure.

FIG. 14B is a top-down view of the second exemplary structure of FIG. 14A. The plane A-A' is the plane of the vertical cross-sectional view of FIG. 14A.

FIG. 15A is a vertical cross-sectional view of the second exemplary structure after formation of first backside trenches according to the second embodiment of the present disclosure.

FIG. 15B is a top-down view of the second exemplary structure of FIG. 15A. The plane A-A' is the plane of the vertical cross-sectional view of FIG. 15A.

FIG. 16A is a vertical cross-sectional view of the second exemplary structure after formation of first backside recesses according to the second embodiment of the present disclosure.

FIG. 16B is a top-down view of the second exemplary structure of FIG. 16A. The plane A-A' is the plane of the vertical cross-sectional view of FIG. 16A.

FIG. 19A is a vertical cross-sectional view of the second exemplary structure after formation of a bit-line-level conductive material layer including first contact via structures according to the second embodiment of the present disclosure.

FIG. 21B is a top-down view of the second exemplary structure of FIG. 21A. The plane A-A' is the plane of the vertical cross-sectional view of FIG. 21A.

FIG. 22A is a vertical cross-sectional view of the second exemplary structure after formation of second-level discrete memory openings through a second alternating stack of second-level insulting layers and second-level spacer material layers according to the second embodiment of the present disclosure.

FIG. 23 is a vertical cross-sectional view of the second exemplary structure after formation of third gate dielectrics and third vertical semiconductor channels according to the second embodiment of the present disclosure.

FIG. 27A is a vertical cross-sectional view of a third exemplary structure after formation of first-level line trenches through a first alternating stack of first-level insulating layers and first-level spacer material layers according to a third embodiment of the present disclosure.

FIG. 27B is a top-down view of the third exemplary structure of FIG. 27A. The plane A-A' is the plane of the vertical cross-sectional view of FIG. 27A.

FIG. 28A is a vertical cross-sectional view of the third exemplary structure after formation of first gate dielectrics and first vertical semiconductor channel material portions according to the third embodiment of the present disclosure.

FIG. 28B is a top-down view of the third exemplary structure of FIG. 28A. The plane A-A' is the plane of the vertical cross-sectional view of FIG. 28A.

FIGS. 28C, 28D and 28E are vertical cross-sectional views of steps in forming the alternative configuration of the third exemplary structure.

FIG. 29A is a vertical cross-sectional view of the third exemplary structure after formation of first vertical semiconductor channels and first dielectric cores according to the third embodiment of the present disclosure. FIG. 29B is a top-down view of the third exemplary structure of FIG. 29A. The plane A-A' is the plane of the vertical cross-sectional view of FIG. 29A.

FIG. 30A is a vertical cross-sectional view of the third exemplary structure after formation of second gate dielectrics according to the third embodiment of the present disclosure.

FIG. 30B is a top-down view of the third exemplary structure of FIG. 30A. The plane A-A' is the plane of the vertical cross-sectional view of FIG. 30A.

FIG. 31A is a vertical cross-sectional view of the third exemplary structure after formation of second vertical semiconductor channels according to the third embodiment of the present disclosure.

FIG. 31B is a top-down view of the third exemplary structure of FIG. 31A. The plane A-A' is the plane of the vertical cross-sectional view of FIG. 31A.

FIG. 32A is a vertical cross-sectional view of the third exemplary structure after formation of second dielectric cores according to the third embodiment of the present disclosure.

FIG. 32B is a top-down view of the third exemplary structure of FIG. 32A. The plane A-A' is the plane of the vertical cross-sectional view of FIG. 32A.

FIG. 33A is a vertical cross-sectional view of the third exemplary structure after formation of laterally alternating sequences of memory pillar structures and dielectric pillar structures according to the third embodiment of the present disclosure.

FIG. 33B is a top-down view of the third exemplary structure of FIG. 33A. The plane A-A' is the plane of the vertical cross-sectional view of FIG. 33A.

FIG. 34A is a vertical cross-sectional view of the third exemplary structure after formation of first backside trenches according to the third embodiment of the present disclosure.

FIG. 34B is a top-down view of the third exemplary structure of FIG. 34A. The plane A-A' is the plane of the vertical cross-sectional view of FIG. 34A.

FIG. 35A is a vertical cross-sectional view of the third exemplary structure after formation of first backside recesses according to the third embodiment of the present disclosure.

FIG. 35B is a top-down view of the third exemplary structure of FIG. 35A. The plane A-A' is the plane of the vertical cross-sectional view of FIG. 35A.

FIG. 37A is a vertical cross-sectional view of the third exemplary structure after formation of a first contact-level dielectric layer and first contact via cavities according to the third embodiment of the present disclosure.

FIG. 37B is a top-down view of the third exemplary structure of FIG. 37A. The plane A-A' is the plane of the vertical cross-sectional view of FIG. 37A.

FIG. 39A is a vertical cross-sectional view of the third exemplary structure after formation of bit lines according to the third embodiment of the present disclosure.

FIG. 40A is a vertical cross-sectional view of the third exemplary structure after formation of a second contact-level dielectric layer and second contact via structures according to the third embodiment of the present disclosure.

FIG. 42 is a vertical cross-sectional view of the third exemplary structure after formation of third gate dielectrics according to the third embodiment of the present disclosure.

FIG. 46A is a vertical cross-sectional view of the third exemplary structure after formation of a conductive material layer according to the third embodiment of the present disclosure.

DETAILED DESCRIPTION

Figure 1A:
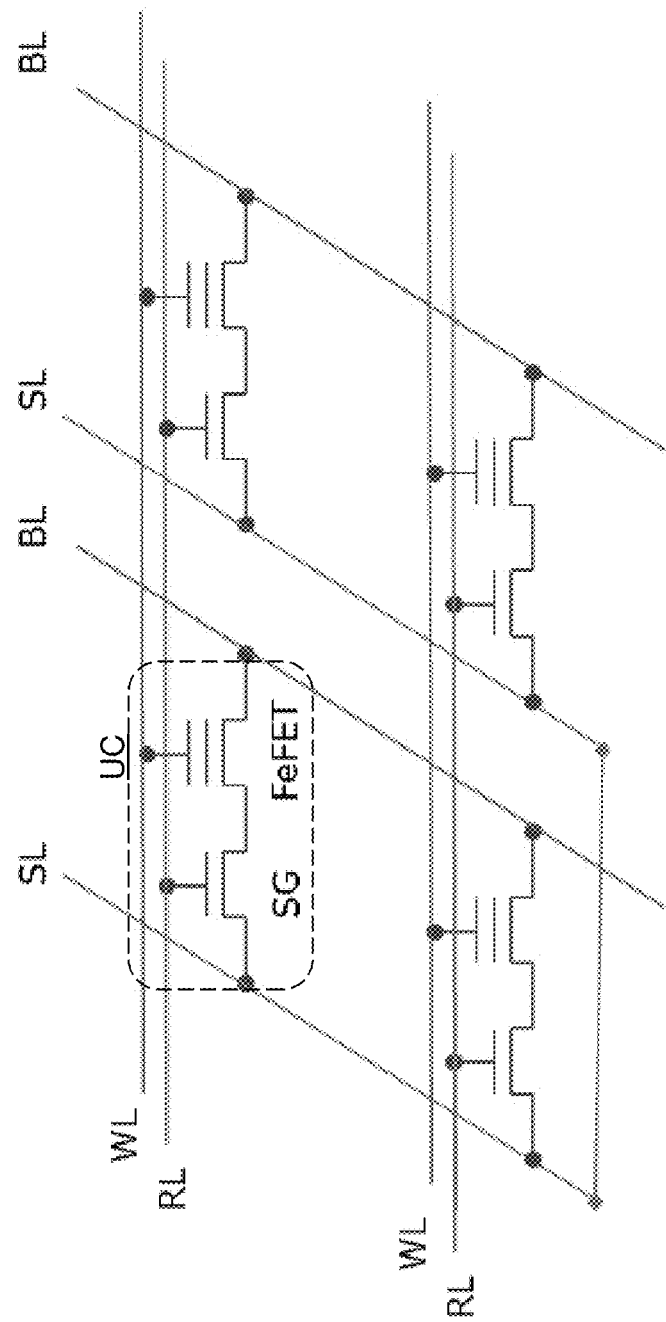
FIGS. 1A and 1B are circuit diagrams of exemplary memory arrays including ferroelectric memory unit cells of embodiments of the present disclosure.

As discussed above, the embodiments of the present disclosure are directed to a ferroelectric memory transistor containing a series connected select gate transistor connected to a read line and method of forming the same, the various aspect of which are described herein in detail. The select gate transistor reduces the disturb of the ferroelectric memory transistor during operation of the device.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function, and are presumed to have a same thickness range unless indicated otherwise. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Figure 1B:
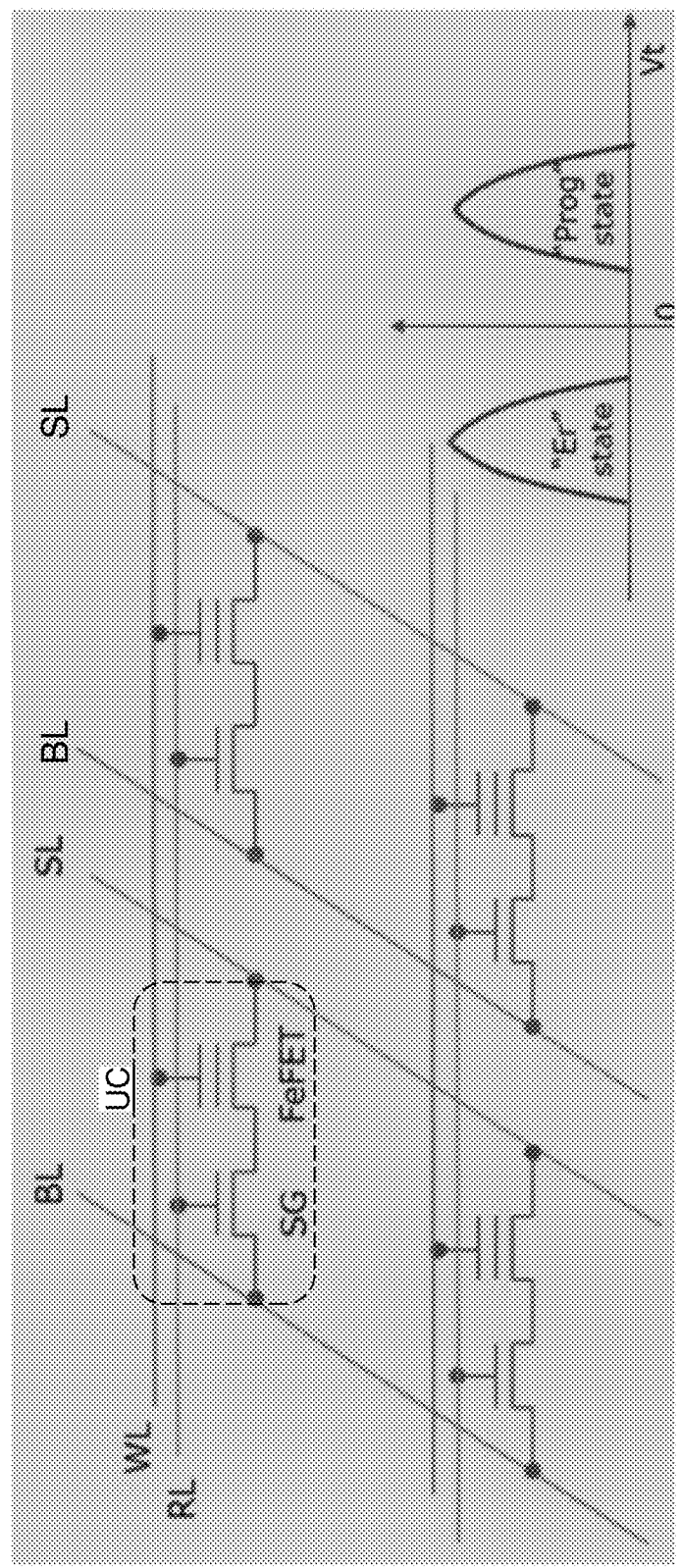

Referring to FIGS. 1A and 1B, circuit diagrams for exemplary memory arrays of the embodiments of the present disclosure is illustrated. A ferroelectric memory unit cell (e.g., memory cell) UC includes a series connection of a first field effect transistor, which is herein referred to as a select gate transistor (labeled "SG"), and a second field effect transistor, which is herein referred to as a ferroelectric memory transistor (labeled "FeFET"). The gate dielectric of the first field effect transistor SG is herein referred to as a first gate dielectric, and includes a non-ferroelectric gate dielectric material, and preferably excludes a ferroelectric material. The gate dielectric of the second field effect transistor FeFET is herein referred to as a second gate dielectric, and includes a ferroelectric gate dielectric material. The first field effect transistor SG includes a first semiconductor channel that extends between a first active region and a second active region. As used herein, an "active region" of a field effect transistor can be a source region or a drain region. The second field effect transistor FeFET includes a second semiconductor channel. The active regions of second field effect transistor FeFET can include the same first and second active regions as in the first field effect transistor SG if there is no active region between the first and second field effect transistors (e.g., as will be described with respect to the second and third embodiments in which the first and second field effect transistors share the same channel). Alternatively, the active regions of the second field effect transistor can include a third active region and the second active region, which also functions as an active region of the first field effect transistor, if an active region is located between the first and second field effect transistors (e.g., the second active region may be a common doped semiconductor material portion that functions as an active region of the first field effect transistor and the second field effect transistor, as will be described with respect to the first embodiment below).

Each first active region (e.g., source region) of the ferroelectric memory unit cells UC can be connected to a respective source line SL, which is an electrically conductive line that laterally extends along a horizontal direction. In the circuit of FIG. 1A, all unit cells (e.g., memory cells) UC share the same source line SL. In the circuit of FIG. 1B, the unit cells UC in the same column share the same source line SL, but unit cells in different columns are connected to different source lines SL. Another active region (e.g., drain region which may correspond to the second or third active region) of the ferroelectric memory unit cells UC can be connected to a respective bit line BL, which is an electrically conductive line and may laterally extend along a direction parallel to the lengthwise direction of the bit lines BL.

In one embodiment, each first gate electrode of the first field effect transistor SG contacting a first gate dielectric may comprise portion of a respective electrically conductive line, which is herein referred to as a read line RL, which is activated during the read operation, as will be described below with respect to FIGS. 1C and 1D. The read line RL may also be referred to as a select gate electrode line, a pass gate electrode line, or an access gate electrode line.

Each second gate electrode of the second field effect transistor FeFET contacting a second gate dielectric may comprise a portion of a respective electrically conductive line, which is herein referred to as a word line WL. In one embodiment, the word lines can be parallel to the read lines, and may, or may not, be perpendicular to the source lines SL and the bit lines BL. In a first embodiment, a two-dimensional array of ferroelectric memory unit cells UC can be provided. Alternatively, in second and third embodiments, multiple two-dimensional arrays of ferroelectric memory unit cells UC can be vertically stacked to provide a three-dimensional array of ferroelectric memory unit cells UC.

Figures 1C, 1D:
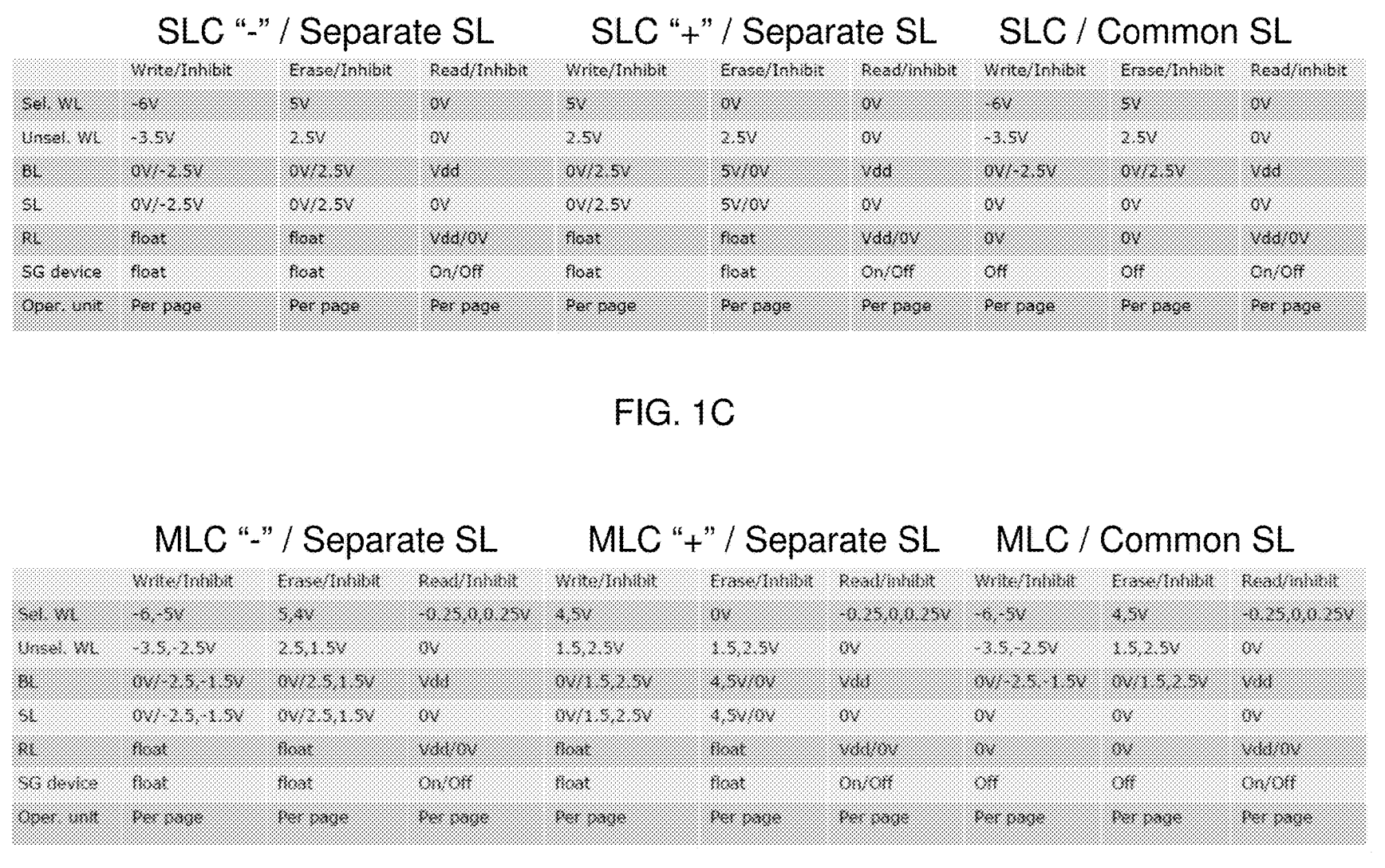

FIGS. 1C and 1D are tables illustrating exemplary voltages that may be used to operate the circuits of FIGS. 1A and 1B. FIG. 1C illustrates the exemplary voltages that may be used to operate a single level (SLC) memory cell (UC) of FIG. 1B in a negative voltage control scheme (columns 2, 3 and 4), the single level memory cell (UC) of FIG. 1B in a positive voltage control scheme (columns 5, 6 and 7), a single level memory cell (UC) of FIG. 1A in a negative voltage control scheme (columns 8, 9 and 10). FIG. 1D illustrates the exemplary voltages that may be used to operate a multi-level (MLC) memory cell (UC) of FIG. 1B in a negative voltage control scheme (columns 2, 3 and 4), the multi-level memory cell (UC) of FIG. 1B in a positive voltage control scheme (columns 5, 6 and 7), a multi-level memory cell (UC) of FIG. 1A in a negative voltage control scheme (columns 8, 9 and 10). The voltages shown are exemplary and other suitable voltages may be used for different device dimensions and materials.

As shown in columns 2, 3 and 4 the tables in FIGS. 1C and 1D, for the negative voltage control scheme of the separate source line circuit of FIG. 1B, the selected word line WL (i.e., the word line of the selected memory cell UC) is set to a high negative voltage for write/inhibit, to a high positive voltage for erase/inhibit and to 0V or a low positive/negative voltage for read/inhibit. The unselected word lines WL are set to a lower negative voltage for write/inhibit, a lower positive voltage for erase/inhibit, and to 0V for read/inhibit. The bit lines BL are set to 0V/low negative voltage for write/inhibit, to 0V/low positive voltage for erase/inhibit, and to $V_{dd}$ for read/inhibit. The source line SL is set to 0V/lower negative voltage for write/inhibit, to 0V/lower positive voltage for erase/inhibit and to 0V for read/inhibit. The selected read lines RL (i.e., the select gate electrode line of the selected memory cell) are allowed to float during write and erase and are set to $V_{dd}$ for read/inhibit. Thus, the select gate transistor floats during write and erase, and is either on or off during read. The operating units are per page of the device.

As shown in columns 5, 6 and 7 these tables, for the positive voltage control scheme of the separate source line circuit of FIG. 1B, the selected word line WL is set to a high positive voltage for write/inhibit, to 0V for erase/inhibit and to 0V or a low positive/negative voltage for read/inhibit. The unselected word lines WL are set to a lower positive voltage for write/inhibit, a lower positive voltage for erase/inhibit, and to 0V for read/inhibit. The bit lines BL are set to 0V/low positive voltage for write/inhibit, to a high positive voltage/ 0V for erase/inhibit, and to $V_{dd}$ for read/inhibit. The source line SL is set to 0V/low positive voltage for write/inhibit, to high positive voltage/0V for erase/inhibit and to 0V read/inhibit. The selected read lines RL (i.e., the select gate electrode line of the selected memory cell) are allowed to float during write and erase and are set to $V_{dd}$ for read/inhibit. Thus, the select gate transistor floats during write and erase, and is either on or off during read. The operating units are per page of the device.

As shown in columns 8, 9 and 10 of the tables in FIGS. 1C and 1D, for the negative voltage control scheme for the common source line circuit of FIG. 1A, the selected word line WL is set to a high negative voltage for write/inhibit, to a high positive voltage for erase/inhibit and to 0V or a low positive/negative voltage for read/inhibit. The unselected word lines WL are set to a lower negative voltage for write/inhibit, a lower positive voltage for erase/inhibit, and to 0V for read/inhibit. The bit lines BL are set to 0V/low negative voltage for write/inhibit, to 0V/low positive voltage for erase/inhibit, and to $V_{dd}$ for read/inhibit. The source line SL is set to 0V/lower negative voltage for write/inhibit, to 0V/lower positive voltage for erase/inhibit and to 0V for read/inhibit. The selected read lines RL (i.e., the select gate electrode line of the selected memory cell) are set to 0V write and erase and are set to $V_{dd}$/0V for read/inhibit. Thus, the select gate transistor SG is off during write and erase, and is either on or off during read. The operating units are per page of the device.

Referring to FIGS. 2A-2C, a first exemplary structure according to the first embodiment of the present disclosure includes a semiconductor substrate 108 that contains a substrate semiconductor layer 109 at least at an upper portion thereof. The substrate semiconductor layer 109 includes a semiconductor material having a doping of a first conductivity type. Atomic concentration of dopants of the first conductivity type in the substrate semiconductor layer 109 can be in a range from $1.0\times10^{14}/cm^3$ to $1.0\times10^{18}/cm^3$, although lesser and greater dopant concentrations can also be employed. For example, the semiconductor substrate 108 can include a commercially available silicon wafer. The substrate semiconductor layer 109 may comprise a doped well in the upper surface of the semiconductor substrate 108 or an epaxial semiconductor layer located over the upper surface of the semiconductor substrate 108.

At least one optional pad dielectric layer (not shown) can be deposited on the top surface of the substrate semiconductor layer 109. The at least one pad dielectric material layer can include a dielectric material that can be employed as a stopping layer during a subsequent planarization process. For example, the at least one pad dielectric material layer can include a silicon nitride layer.

First line trenches laterally extending along a first horizontal direction hd1 (e.g., bit line direction) can be formed in an upper region of the substrate semiconductor layer 109. The first line trenches can have a uniform width, and can be laterally spaced apart along a second horizontal direction hd2 (e.g., word line direction) that is perpendicular to the first horizontal direction hd1. The depth of the first line trenches can be in a range from 50 nm to 300 nm, although lesser and greater depths can also be employed. The width of the first line trenches can be a lithographic critical dimension, i.e., a minimum dimension that can be printed for a given lithographic tool with a single exposure process and a development process. For example, the width of the first line trenches can be in a range from 20 nm to 200 nm, although lesser and greater widths can also be employed.

A dielectric material such as silicon oxide may be deposited in the first line trenches by a conformal deposition process or a self-planarizing deposition process. Excess portions of the dielectric material overlying the at least one pad dielectric layer can be removed by a planarization process, which may employ chemical mechanical polishing (CMP) and/or a recess etch. Top surfaces of remaining portions of the dielectric material can be vertically recessed such that each remaining portion of the dielectric material has a top surface that is substantially coplanar with the top surface of the substrate semiconductor layer 109. Each remaining portion of the dielectric material fills a respective first line trench, and is herein referred to as a dielectric isolation structure 12. The at least one pad dielectric layer can be subsequently removed selective to the dielectric isolation structures 12 and the substrate semiconductor layer 109. Removal of a first material is "selective" to a second material if the removal rate of the first material is at least three times the removal rate of the second material. Each portion of the substrate semiconductor layer 109 located between a neighboring pair of dielectric isolation structures 12 is herein referred to as a semiconductor rail region, in which semiconductor channels and active regions of transistors are subsequently formed.

Referring to FIGS. 3A-3C, a photoresist layer can be applied over the top surface of the substrate semiconductor layer 109, and can be lithographically patterned to form linear openings that extend along the second horizontal direction hd2. The width of each linear opening in the patterned photoresist layer may be a lithographic critical dimension so that a high-density ferroelectric memory unit cells can be formed. Dopants of a second conductivity type that is the opposite of the first conductivity type can be implanted into the line openings in the patterned photoresist layer. Each implanted region of the substrate semiconductor layer 109 constitutes an active region (132, 134, 136). Each active region (132, 134, 136) can include dopants of the second conductivity type at an atomic concentration in a range from $5.0\times10^{18}/cm^3$ to $2.0\times10^{21}/cm^3$, although lesser and greater dopant concentrations can also be employed.

The active regions (132, 134, 136) are laterally spaced apart along the first horizontal direction. In one embodiment, a neighboring pair of ferroelectric memory unit cells can be laterally spaced apart along the first horizontal direction hd1, and can have a pair of mirror image layouts with a plane of symmetry that is perpendicular to the first horizontal direction hd1. In this case, a repetition unit including a third active region 136, a second active region 134, a first active region 132, a second active region 134, and a third active region 136 can be repeated along the first horizontal direction hd1 between each neighboring pair of dielectric isolation structures 12 such that first active regions 132 are shared between neighboring pairs of repetition units. In this configuration, the first active regions 132 comprise the source regions of adjacent first field effect transistors SG, the second active regions 134 comprise shared source/drain regions of both the first and second field effect transistors, and the third active region 136 comprise drain regions of the second field effect transistors FeFET. The source regions 132 are electrically connected to the source lines SL, the drain regions 136 are connected to the bit lines BL, and the shared source/drain regions 134 may comprise dummy regions which are not connected to any external line or electrode. The patterned photoresist layer can be subsequently removed, for example, by ashing.

The area corresponding the location of a ferroelectric memory unit cell (i.e., memory cell) UC of FIGS. 1A and 1B is herein referred to as a unit cell area UCA. Each unit cell area UCA includes areas of at least a portion of a first active region 132, a second active region 134, and at least a portion of a third active region 136 in an upper portion of the semiconductor substrate 108. The first active region 132, the second active region 134, and the third active region 136 of each ferroelectric memory unit cell are laterally spaced apart along the first horizontal direction hd1. In one embodiment, each of the first active region 132, the second active region 134, and the third active region 136 in each ferroelectric memory unit cell can be formed with a respective pair of sidewalls that laterally extend along the second horizontal direction hd2 that is perpendicular to the first horizontal direction hd1.

Figure 4C:
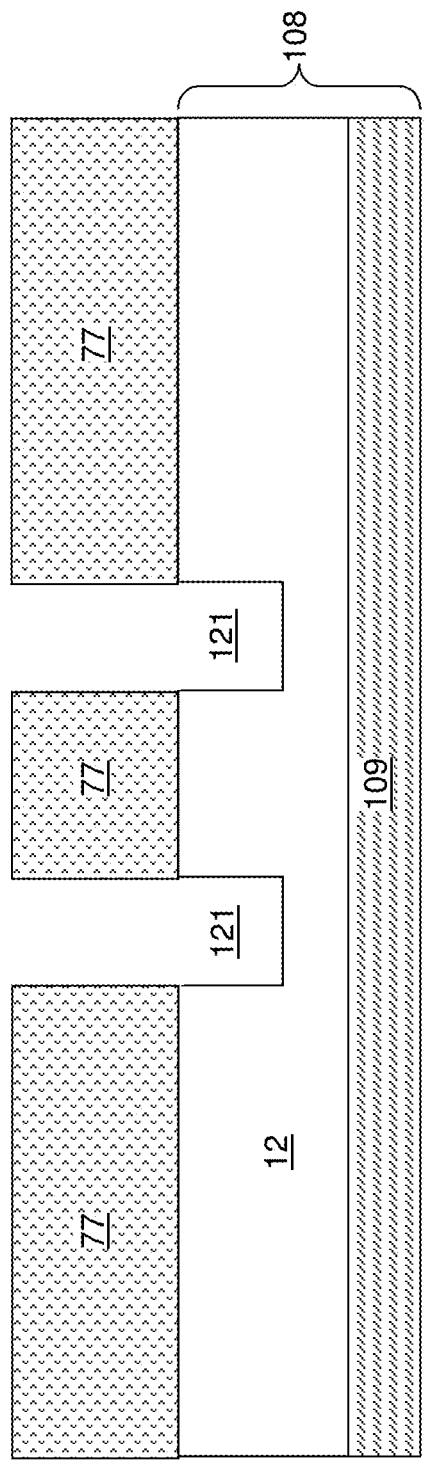
FIG. 4C is a vertical cross-sectional view of the first exemplary structure along the vertical plane C-C' of FIG. 4B.

Referring to FIGS. 4A-4C, a trench can be formed between each neighboring pair of a first active region 132 and a second active region 134. In one embodiment, a patterned etch mask layer 77 can be applied over the semiconductor substrate 108, and can be lithographically patterned to form linear openings that extend along the second horizontal direction hd2. In one embodiment, the patterned etch mask layer 77 can include a patterned photoresist layer. The linear openings overlie regions between a row of first active regions 132 and an adjacent row of second active regions 134. The pattern in the patterned etch mask layer 77 can be transferred through an upper portion of each semiconductor rail region (i.e., each portion of the substrate semiconductor layer 109 located between a neighboring pair of dielectric isolation structures 12) and through each unmasked portion of the dielectric isolation structures 12 by an anisotropic etch process to form second line trenches 121. The anisotropic etch process may etch the semiconductor material of the substrate semiconductor layer 108 and the dielectric material of the dielectric isolation structures 12 with a substantially same etch rate. Alternatively, the anisotropic etch process may include multiple anisotropic etch steps that etch the semiconductor material of the substrate semiconductor layer 108 and/or the dielectric material of the dielectric isolation structures 12 such that each vertically recessed surface of the substrate semiconductor layer 108 and each vertically recessed surface of the dielectric isolation structures 12 are formed at approximately the same depth.

Generally, the second line trenches 121 can be formed between neighboring pairs of a first active region 132 and a second active region 134 by anisotropically etching an upper portion of the semiconductor substrate 108. Upper portions of the semiconductor rail regions and upper portions of the dielectric isolation structures 12 can be anisotropically etched during formation of the second line trenches 121. In one embodiment, sidewalls of the second line trenches 121 can be laterally spaced from adjacent first active regions 132 and from adjacent second active regions 134 by remaining portions of the semiconductor rail region having a doping of the first conductivity type. Alternatively, sidewalls of the first active regions 132 and/or the second active regions 134 can be physically exposed in each second line trench 121.

In one embodiment, the bottom surfaces of the first active regions 132, the second active regions 134, and the third active regions 136 can be located within a horizontal plane located above a horizontal plane including bottom surfaces of the dielectric isolation structures 12. In one embodiment, the bottom surfaces of the second line trenches 121 can be located within a horizontal plane located above the horizontal plane including bottom surfaces of the dielectric isolation structures 12. The bottom surfaces of the second line trenches 121 can be at a same depth as, located above, or located below, the horizontal plane including the bottom surfaces of the first active regions 132, the second active regions 134, and the third active regions 136. In one embodiment, the depth of the second line trenches 121, as measured from the top surfaces of the substrate semiconductor layer 109, can be in a range from 40 nm to 250 nm, although lesser and greater thicknesses can also be employed.

Referring to FIGS. 5A-5C, a conformal gate dielectric material layer can be formed on the physically exposed surfaces of the second line trenches and on top surfaces of the semiconductor substrate 108. The conformal gate dielectric material layer includes a non-ferroelectric gate dielectric material such as silicon oxide and/or a non-ferroelectric metal oxide material. The conformal gate dielectric material layer can be formed by a conformal formation process such as thermal oxidation and/or a chemical vapor deposition process. The thickness of the conformal gate dielectric material layer can be in a range from 1 nm to 10 nm, such as from 2 nm to 6 nm, although lesser and greater thicknesses can also be employed.

A first conductive gate electrode material layer can be formed on the conformal gate dielectric material layer. The first conductive gate electrode material layer includes at least one gate electrode material such as a heavily doped semiconductor material, a metal, an metal alloy, a metal-semiconductor alloy (e.g., silicide), or a conductive metallic compound (such as a metal nitride). The first conductive gate electrode material layer can fill the entire volume of each second line trench 121.

A planarization process can be performed to remove portions of the first conductive gate electrode material layer and the conformal gate dielectric material layer from above a horizontal plane including the top surfaces of the semiconductor substrate 108. A chemical mechanical polishing process and/or a recess etch process can be employed for the planarization process. Each remaining portion of the conductive gate electrode layer constitutes a continuous electrically conductive line, which is herein referred to as a first gate electrode line 126. The first gate electrode line 126 corresponds to the read line RL shown in FIGS. 1A and 1B. Each portion of a first gate electrode line 126 that overlies a semiconductor rail region of the substrate semiconductor layer 108 constitutes a first gate electrode. Each first gate electrode liner 126 includes a plurality of first gate electrodes.

Portions of the conformal gate dielectric material layer that overlies the top surfaces of the semiconductor substrate 108 can be removed by the planarization process. Each remaining portion of the conformal gate dielectric material layer located in a respective second line trench constitutes a first gate dielectric strip 120. Each first gate dielectric strip 120 includes multiple gate dielectrics that contact a respective one of the semiconductor rail regions of the substrate semiconductor layer 108.

A first gate dielectric strip 120 and a first gate electrode line 126 can be formed within each second line trench 121. The first gate dielectric strip 120 can comprise all of first gate dielectrics within a respective row of ferroelectric memory unit cells that are arranged along the second horizontal direction and have a respective area that overlaps with the area of the second line trench 121. The first gate electrode line 126 can comprise all of first gate electrodes within the respective row of ferroelectric memory unit cells. Multiple stacks of a first gate dielectric and a first gate electrode within each second line trench 121.

Each region of the substrate semiconductor layer 109 that underlies a first gate dielectric (i.e., a portion of a first gate dielectric strip 120) constitutes a first semiconductor channel 133. The first semiconductor channel 133 is formed underneath each first gate dielectric between a respective neighboring pair of a first active region 132 and a second active region 134.

Each first gate dielectric strip 120, and thus, each first gate dielectric, can be disposed at a peripheral region of a second line trench 121, which extends downward from a top surface of the semiconductor substrate 108 and is located between neighboring pairs of a first active region 132 and a second active region 134 that are arranged along the second horizontal direction hd2. A first gate electrode line 126 including a plurality of first gate electrodes can be located over each first gate dielectric strip 120. Each first gate electrode is located inside a second line trench 121. Each first semiconductor channel 133 underlies a horizontal portion of a first gate dielectric.

First field effect transistors (i.e., the select gate transistors SG) are formed on the semiconductor substrate 108. Each first field effect transistor includes a first semiconductor channel 133 that extends between a first active region 132 and a second active region 134 that are located in the semiconductor substrate 108 (e.g., in the substrate semiconductor layer 109), a first gate dielectric comprising a portion of to first gate dielectric strip 120 and having a U-shaped vertical cross-sectional profile, and a first gate electrode comprising a portion of a first gate electrode line 126.

Referring to FIGS. 6A and 6B, an optional gate dielectric material layer can be formed on the top surface of the semiconductor substrate 108 (e.g., in the substrate semiconductor layer 109). The optional gate dielectric material layer can include a non-ferroelectric dielectric material such as silicon oxide and/or a dielectric metal oxide material. The optional gate dielectric material layer can be formed by oxidation of surface portions of the substrate semiconductor layer 109 and/or by deposition of a gate dielectric material. The thickness of the gate dielectric material layer, if present, can be in a range from 0.5 nm to 6 nm, such as from 1 nm to 3 nm, although lesser and greater thicknesses can also be employed.

A continuous ferroelectric material layer can be formed over the top surface of the semiconductor substrate 108 as a continuous material layer. As used herein, a "ferroelectric material" refers to a crystalline material that exhibits spontaneous electrical polarization in the absence of an external electric field. The ferroelectric material may be an insulating ferroelectric material. In one embodiment, the continuous ferroelectric material layer comprises an orthorhombic phase hafnium oxide layer including at least one dopant selected from Al, Zr, and/or Si. Other suitable ferroelectric materials may also be used, as such as titanate ferroelectric materials (e.g., barium titanate, lead titanate, lead zirconate titanate, lead lanthanum zirconate titanate ("PLZT"), etc.). The continuous ferroelectric material layer can have a thickness in a range from 3 nm to 60 nm, such as from 6 nm to 30 nm, although lesser and greater thicknesses can also be employed. In one embodiment, the continuous ferroelectric material layer can be deposited by a conformal deposition process such as chemical vapor deposition (CVD) or atomic layer deposition (ALD).

In one embodiment, the continuous ferroelectric material layer can be formed directly on a top surface of the optional gate dielectric material layer. Alternatively, the optional gate dielectric material layer may be omitted and the continuous ferroelectric material layer may be formed directly on the top surface of the substrate semiconductor layer 109. Generally, the continuous ferroelectric material layer can be formed over the top surface of the semiconductor substrate 108 and the first gate electrodes (which comprise portions of the first gate electrode lines 126).

A second conductive gate electrode material layer can be formed over the continuous ferroelectric material layer by depositing a conductive gate electrode material. The conductive gate electrode material can include a heavily doped semiconductor material, a metal, an metal alloy, a metal-semiconductor alloy, and/or a conductive metallic compound (such as a metal nitride).

The second conductive gate electrode material layer, the continuous ferroelectric material layer, and the optional gate dielectric material layer can be patterned into gate stack structures. For example, a photoresist layer can be applied over the second conductive gate electrode material layer, and can be lithographically patterned to form patterns (e.g., rectangles) located between a respective neighboring pair of a row of second active regions 134 and a row of third active regions 136. Each row of second active regions 134 laterally extends along the second horizontal direction hd2, and each row of third active regions 136 laterally extends along the second horizontal direction hd2. Each patterned rectangle of the photoresist layer can have a uniform width along the first horizontal direction. An anisotropic etch process is performed to etch portions of the second conductive gate electrode material layer, the continuous ferroelectric material layer, and the optional gate dielectric material layer that are not masked by the photoresist layer. Each contiguous set of remaining portions of the second conductive gate electrode material layer, the continuous ferroelectric material layer, and the optional gate dielectric material layer constitutes a gate stack structure (150, 156).

Each gate stack structure (150, 156) includes a second gate dielectric 150 and a second gate electrode 156. Each second gate electrode 156 includes a patterned remaining portion of the second conductive gate electrode material layer. Each second gate dielectric 150 includes a ferroelectric material layer 152 and an optional non-ferroelectric dielectric layer 151. Each ferroelectric material layer 152 is a remaining patterned portion of the continuous ferroelectric material layer 152. Each non-ferroelectric dielectric layer 151 is a remaining patterned portion of the optional gate dielectric material layer. Each surface portion of the substrate semiconductor layer 109 that underlies a second gate dielectric 150 constitutes a second semiconductor channel 135.

A stack of a second gate dielectric 150 and a second gate electrode 156 can continuously extend over a respective row of second semiconductor channels 135 that are arranged along the second horizontal direction hd2. The second gate dielectric 150 can comprise all of second gate dielectrics within a respective row of ferroelectric memory unit cells that are arranged along the second horizontal direction hd2. The second gate electrode 156 can comprise all of second gate electrodes within the respective row of ferroelectric memory unit cells.

Each second gate electrode comprises a patterned portion of the second conductive gate electrode material layer, and each second gate dielectric comprises a patterned portion of the continuous ferroelectric material layer. A second semiconductor channel 135 is formed underneath each second gate dielectric between a respective second active region 134 and a respective third active region 136. A stack of the second gate electrode 156 and the second gate dielectric 150 comprising a ferroelectric material layer 152 is formed over a portion of the semiconductor substrate 108 located between each neighboring pair of a second active region 134 and the third active region 136.

Second field effect transistors (e.g., ferroelectric memory transistors, FeFET) are provided on the semiconductor substrate 108. Each second field effect transistor includes a second semiconductor channel 135 extending between a respective second active region 134 and a respective third active region 136, a second gate dielectric 150 overlying the second semiconductor channel 135 and comprising a ferroelectric material layer 152, and a second gate electrode 156 overlying the second gate dielectric 150.

A two-dimensional array of ferroelectric memory unit cells is provided. The two-dimensional array of ferroelectric memory unit cells can include a plurality of rows of ferroelectric memory unit cells. Each row of ferroelectric memory unit cells can include a plurality of ferroelectric memory unit cells that are arranged along the second horizontal direction hd2. The plurality of rows of ferroelectric memory unit cells can be arranged along the first horizontal direction hd1 to provide the two-dimensional array of ferroelectric memory unit cells.

A subset of the first active regions 132 of the two-dimensional array of ferroelectric memory unit cells can be shared by a respective neighboring pair of ferroelectric memory unit cells that are arranged along the first horizontal direction hd1. The first active region 132, the second active region 134, and the third active region 136 within each ferroelectric memory unit cell are laterally spaced apart along the first horizontal direction hd1.

Referring to FIGS. 7A and 7B, a first interconnect-level dielectric layer 160 can be deposited over the first exemplary structure. The first interconnect-level dielectric layer 160 can include a single dielectric material layer, or may include multiple dielectric material layers. The first interconnect-level dielectric layer 160 includes an interlayer dielectric material such as undoped silicate glass, a doped silicate glass, and/or organosilicate glass. Optionally, the first interconnect-level dielectric layer 160 a dielectric liner such as a silicon nitride liner or a dielectric metal oxide liner.

Via cavities can be formed through the first interconnect-level dielectric layer 160. The via cavities include source contact via cavities that extend to the first active regions 132 or to the third active regions 136, and gate contact via cavities that extend to the second gate electrodes 156.

Further, line cavities can be formed in an upper portion of the first interconnect-level dielectric layer 160. The line cavities include source line cavities that overlie a respective row of source contact via cavities, and word line cavities that overlie a respective row of gate contact via cavities. The line cavities can laterally extend along the second horizontal direction hd2.

At least one conductive material can be deposited in the via cavities and the line cavities. The at least one conductive material can include a metallic liner (such as a TiN liner) and a metallic fill material (such as W). Excess portions of the at least one conductive material can be removed from above the horizontal plane including the top surface of the first interconnect-level dielectric layer 160 by a planarization process, which can employ chemical mechanical polishing and/or a recess etch. Each remaining portion of the at least one conductive material filling a respective one of the source contact via cavities constitutes a source contact via structure 172, and each remaining portion of the at least one conductive material filling a respective one of the gate contact via cavities constitutes a gate contact via structure 176. Each remaining portion of the at least one conductive material filling a respective one of the source line cavities constitutes a source line 182 (which corresponds to the source line SL in FIGS. 1A and 1B), and each remaining portion of the at least one conductive material filling a respective one of the word line cavities constitutes a word line 186 (which corresponds to the word line WL in FIGS. 1A and 1B).

The via cavities and the line cavities, and the respective contact via and line structures located in the cavities may be formed by a dual damascene patterning process employing two lithographic exposure processes, two lithographic development processes, two anisotropic etch processes and filling both cavities with a respective conductive via and line structures. Alternatively, the via cavities and the line cavities and the respective contact via and line structures located in the cavities may be formed by two single damascene processes, each of which employs a respective lithographic exposure process, a respective lithographic development process, a respective anisotropic etch process, and a respective separate fill process with a conductive via or line structure.

In one embodiment, the gate contact via structures 176 may be formed within the areas of the ferroelectric memory unit cells, i.e., within an array region including the ferroelectric memory unit cells. In this case, the word lines 186 can laterally extend along the second horizontal direction hd2 within the array region. In an alternative embodiment, the gate contact via structures 176 may be formed in a peripheral region at an end portion of a respective one of the second gate electrode liner 156. In this case, the word lines 186 can be formed in the peripheral region, and may, or may not, laterally extend over the memory array region. The source lines 182 laterally extend along the second horizontal direction hd2. The second horizontal direction hd2 can be perpendicular to the first horizontal direction hd1. In one embodiment, the source contact via structures 172 can contact a respective one of the first active regions 132, and each of the first active regions 132 within the plurality of ferroelectric memory unit cells can be connected to a respective one of the source lines 182. In an alternative embodiment, the source contact via structures 172 can contact a respective one of the third active regions 136, and each of the third active regions 136 within the plurality of ferroelectric memory unit cells can be connected to a respective one of the source lines 182

Figure 8A:
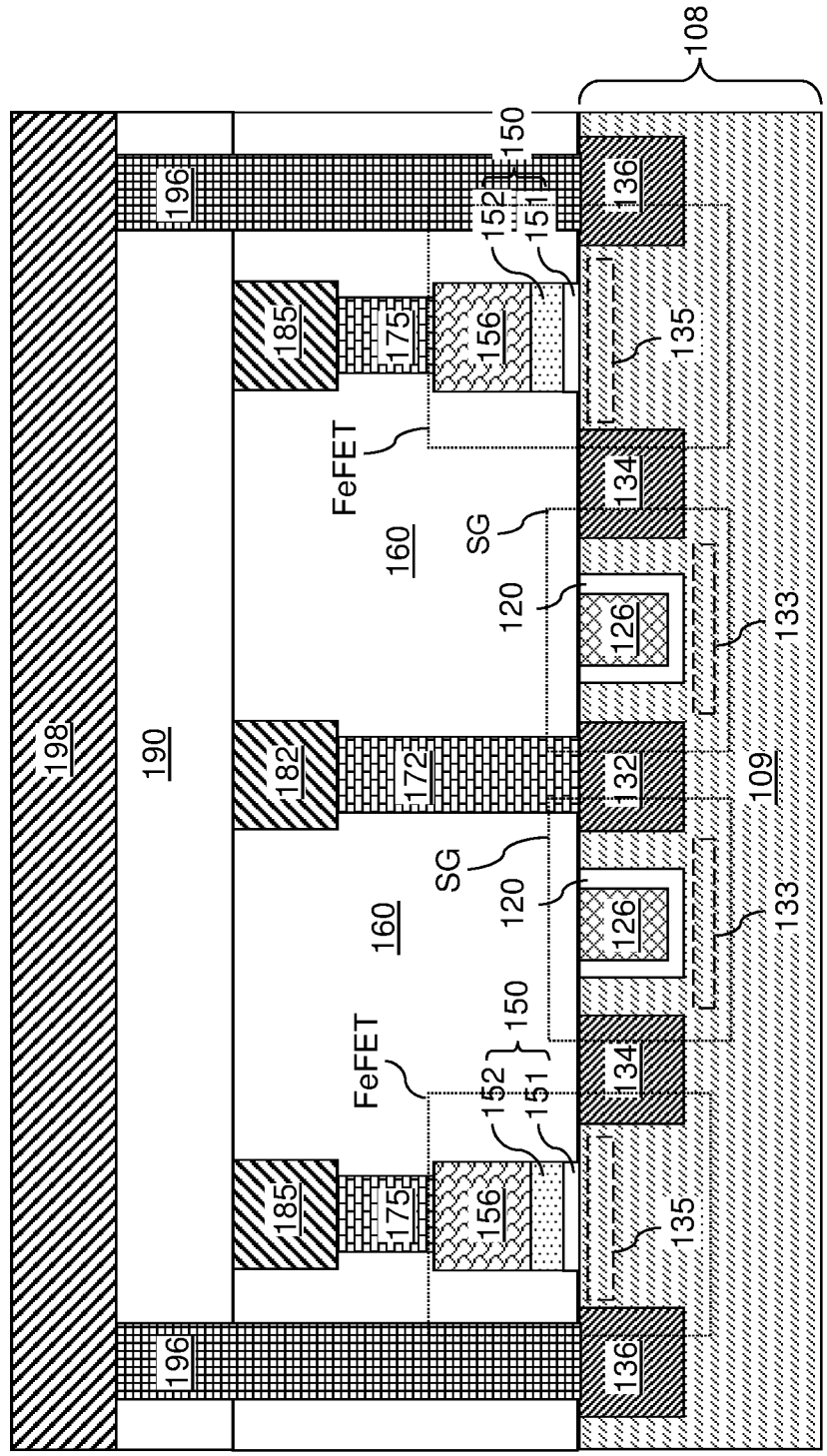
FIG. 8A is a vertical cross-sectional view of a first exemplary structure after formation of a second interconnect-level dielectric layer, drain contact via structures, and bit lines according to the first embodiment of the present disclosure.
Figure 8B:
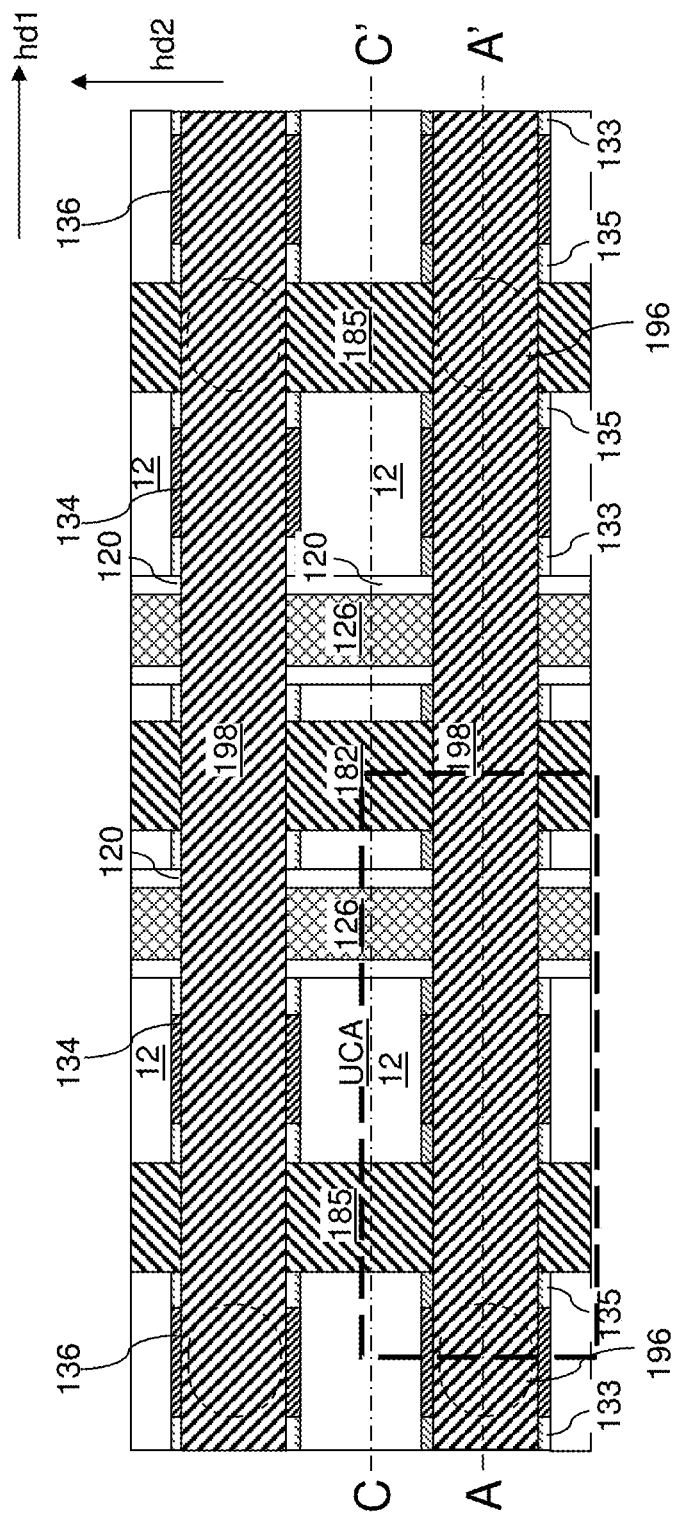
FIG. 8B is a top-down view of the first exemplary structure of FIG. 8A. The vertical plane A-A' is the plane of the vertical cross-sectional view of FIG. 8A.
Figure 8C:
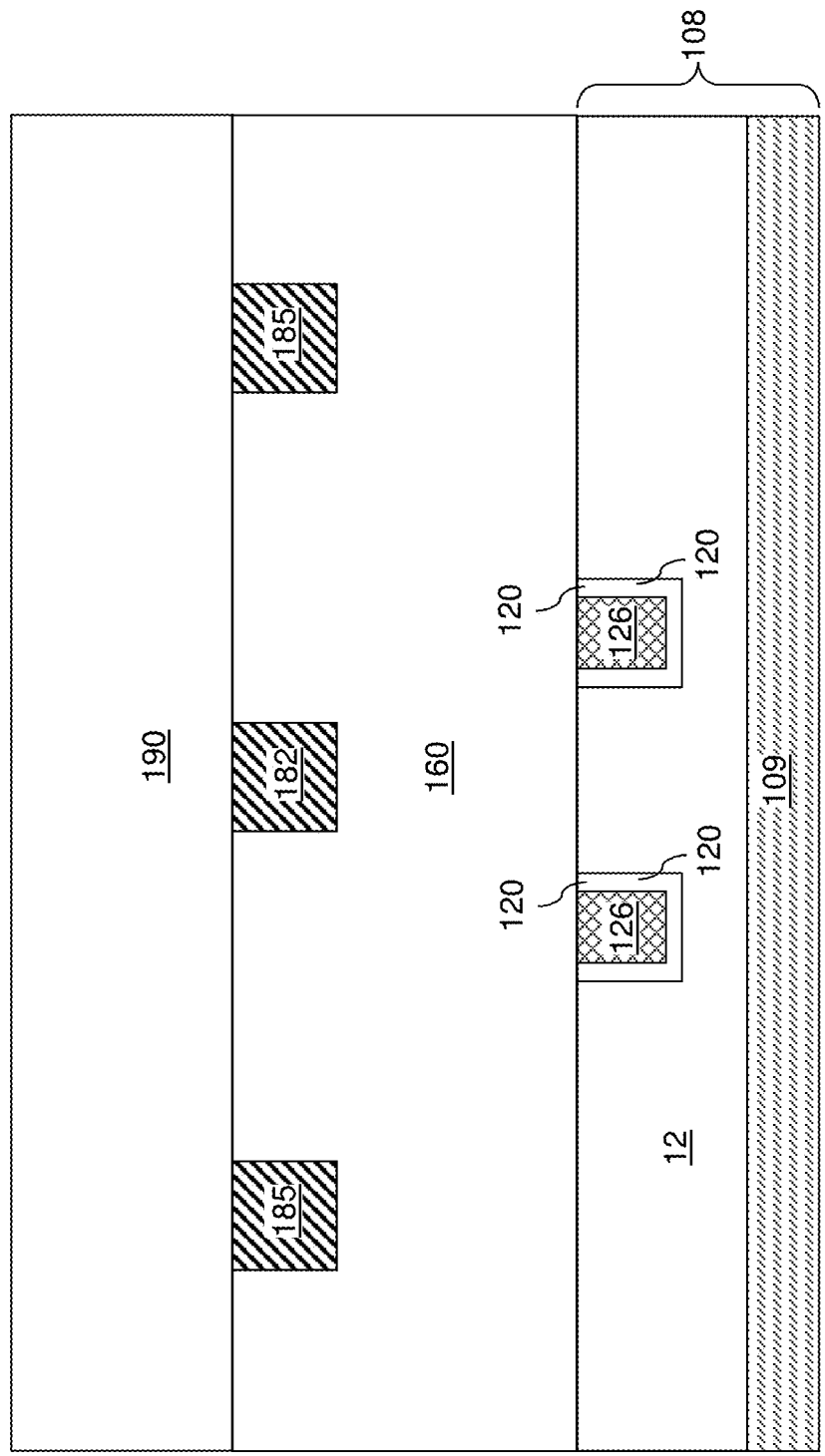
FIG. 8C is a vertical cross-sectional view of the first exemplary structure along the vertical plane C-C' of FIG. 8B.

Referring to FIGS. 8A-8C, a second interconnect-level dielectric layer 190 can be deposited over the first interconnect-level dielectric layer 160. The second interconnect-level dielectric layer 190 can include a single dielectric material layer, or may include multiple dielectric material layers. The second interconnect-level dielectric layer 190 includes an interlayer dielectric material such as undoped silicate glass, a doped silicate glass, and/or organosilicate glass. Optionally, the second interconnect-level dielectric layer 190 a dielectric liner such as a silicon nitride liner or a dielectric metal oxide liner.

Via cavities can be formed through the second interconnect-level dielectric layer 190. The via cavities include drain contact via cavities that extend to the third active regions 136 or alternatively to the first active regions 132 that are not contacted by the source contact via structures 172. For example, if the source contact via structures 172 contact the first active regions 132, the drain contact via cavities extend to the third active regions 136, and if the source contact via structures 172 contact the third active regions 136, then the drain contact via cavities extend to the first active regions 132.

Further, line cavities can be formed in an upper portion of the second interconnect-level dielectric layer 190. The line cavities include bit line cavities that overlie a respective one of the semiconductor rail regions. Each bit line cavity can laterally extend along a first horizontal direction hd1, and can overlie a respective set of first active regions 132, second active regions 134, third active regions 136, first semiconductor channels 133, and second semiconductor channels 135.

At least one conductive material can be deposited in the drain contact via cavities and the bit line cavities. The at least one conductive material can include a metallic liner (such as a TiN liner) and a metallic fill material (such as W). Excess portions of the at least one conductive material can be removed from above the horizontal plane including the top surface of the second interconnect-level dielectric layer 190 by a planarization process, which can employ chemical mechanical polishing and/or a recess etch. Each remaining portion of the at least one conductive material filling a respective one of the drain contact via cavities constitutes a drain contact via structure 196, and each remaining portion of the at least one conductive material filling a respective one of the bit line cavities constitutes a bit line 198 (which corresponds to the bit line BL in FIGS. 1A and 1B).

The via cavities and the line cavities, and the respective contact via and line structures located in the cavities may be formed by a dual damascene patterning process employing two lithographic exposure processes, two lithographic development processes, two anisotropic etch processes and filling both cavities with a respective conductive via and line structures. Alternatively, the via cavities and the line cavities and the respective contact via and line structures located in the cavities may be formed by two single damascene processes, each of which employs a respective lithographic exposure process, a respective lithographic development process, a respective anisotropic etch process, and a respective separate fill process with a conductive via or line structure.

In one embodiment, the source contact via structures 172 can contact a respective one of the first active regions 132, and the drain contact via structures 196 can contact a respective one of the third active regions 136. Alternatively, the source contact via structures 172 can contact a respective one of the third active regions 136, and the drain contact via structures 196 can contact a respective one of the first active regions 132. The bit lines 198 can laterally extend along the first horizontal direction hd1 over the semiconductor substrate 108. Each of the first active regions 132 within the plurality of ferroelectric memory unit cells is connected to a respective first element that is a source line 182 or a bit line 198. Each of the third active regions 136 within the row of ferroelectric memory unit cells is connected to a second element that is a bit line 198 or a source line 182. In this case, each first element is a source line 182 and each second element is a bit line 198, or each first element is a bit line 198 and each second element is a source line 182.

Referring to FIGS. 1A-8C, a memory device of the first embodiment comprises at least one ferroelectric memory unit cell, wherein each of the at least one ferroelectric memory unit cell comprises: a respective first field effect transistor SG including a first semiconductor channel 133 that extends between a first active region 132 and a second active region 134 that are located in a semiconductor substrate 108, a first gate dielectric (e.g., a portion of a first gate dielectric strip 120) disposed at a peripheral region of a trench (i.e., a second line trench 121) extending downward from a top surface of the semiconductor substrate 108 and located between the first active region 132 and the second active region 134, and a first gate electrode (e.g., a portion of a first gate electrode line 126) located inside the trench over the first gate dielectric, wherein a first semiconductor channel 133 underlies a horizontal portion of the first gate dielectric; and a respective second field effect transistor FeFET including a second semiconductor channel 135 extending between the second active region 134 and a third active region 136, a second gate dielectric 150 comprising a ferroelectric material layer 152 overlying the second semiconductor channel 135, and a second gate electrode 156 overlying the second gate dielectric.

In one embodiment, a top surface of the first gate electrode is located within a same horizontal plane as a top surface of the semiconductor substrate 108. In one embodiment, the first gate dielectric has a U-shaped vertical cross-sectional profile and comprises a pair of vertical portions and a horizontal portion adjoined to a bottom end of each of the pair of vertical portions. In one embodiment, each of the pair of vertical portions of the first gate dielectric and the horizontal portion of the first gate dielectric have a same material composition and a same thickness throughout.

In one embodiment, each of the first active region 132, the second active region 134, and the third active region 136 has a top surface within a horizontal plane that includes the top surface of the semiconductor substrate 108 (which may comprise the top surface of the substrate semiconductor layer 109).

In one embodiment, a bottom surface of the second gate dielectric is located within the horizontal plane that includes the top surface of the semiconductor substrate 108; and a top surface of the first gate dielectric is located within the horizontal plane that includes the top surface of the semiconductor substrate 108.

In one embodiment, the at least one ferroelectric memory unit cell comprises at least one row of ferroelectric memory unit cells (that can be arranged along the second horizontal direction hd2); and the row of ferroelectric memory unit cells comprises: a first gate dielectric strip 120 that includes each of the first gate dielectrics within the row of ferroelectric memory unit cells; a first gate electrode line 126 that includes each of the first gate electrodes within the row of ferroelectric memory unit cells; second gate dielectrics 150 within the row of ferroelectric memory unit cells; and the second gate electrodes 156 within the row of ferroelectric memory unit cells.

The first active region 132, the second active region 134, and the third active region 136 within each ferroelectric memory unit cell are laterally spaced apart along a first horizontal direction hd1; and ferroelectric memory unit cells within the row of ferroelectric memory unit cells are laterally spaced apart along a second horizontal direction hd2 that is perpendicular to the first horizontal direction hd1 by dielectric isolation structures 12 located in the semiconductor substrate 108 and laterally extending along the first horizontal direction hd1.

In one embodiment, the first semiconductor channel 133 and the second semiconductor channel 135 have a respective doping of a first conductivity type; and the first active region 132, the second active region 134, and the third active region 136 have a uniform width along the second horizontal direction hd1 and have a doping of a second conductivity that is the opposite of the first conductivity type.

In one embodiment, each of the first active regions 132 within the row of ferroelectric memory unit cells is connected to a respective first element selected from a source line 182 and a respective one of bit lines 198; each of the third active regions 136 within the row of ferroelectric memory unit cells is connected to a respective second element selected from the respective one of bit lines 198 and the source line 182, the respective second element being different from the respective first element; the source line 182 overlies the semiconductor substrate 108 and laterally extends along the second horizontal direction hd2; and the bit lines 198 overlie the semiconductor substrate 108 and laterally extend along the first horizontal direction hd1.

In one embodiment, the at least one row of ferroelectric memory unit cells comprises a plurality of rows of ferroelectric memory unit cells that are arranged along the first horizontal direction hd1; the plurality of rows of ferroelectric memory unit cells constitute a two-dimensional array of ferroelectric memory unit cells; and a subset of the first active regions 132 of the two-dimensional array of ferroelectric memory unit cells is shared by a respective neighboring pair of ferroelectric memory unit cells that are arranged along the first horizontal direction hd1.

In one embodiment, the second gate dielectric and the second gate electrode have vertically coincident sidewalls that overlie the top surface of the semiconductor substrate 108; and the first gate dielectric has a greater lateral extent than the first gate electrode by twice a thickness of a vertical portion of the first gate dielectric.

Referring to FIGS. 9A and 9B, a second exemplary structure according to a second embodiment of the present disclosure includes a substrate 8 and a first alternating stack of first-level insulating layers 32 and first-level spacer material layers located between a respective vertically neighboring pair of first-level insulating layers 32. The substrate 8 can include a substrate semiconductor layer 9 and a single crystalline doped semiconductor material layer 6 that functions as a common active region for vertical field effect transistors to be subsequently formed through the first alternating stack.

The substrate semiconductor layer 9 may comprise a top portion of a semiconductor substrate (e.g., silicon wafer), a doped well in a top portion of the semiconductor substrate, or a semiconductor layer located over a substrate. For example, the substrate semiconductor layer 9 includes a semiconductor material having a doping of a first conductivity type. In one embodiment, the substrate semiconductor layer 9 can include a single crystalline doped semiconductor material having a doping of the first conductivity type. Atomic concentration of dopants of the first conductivity type in the substrate semiconductor layer 9 can be in a range from $1.0 \times 10^{14}/cm^3$ to $1.0 \times 10^{18}/cm^3$, although lesser and greater dopant concentrations can also be employed. The single crystalline doped semiconductor material layer 6 may comprise a doped well in a top portion of the semiconductor substrate or a doped semiconductor layer located over a substrate. The doped semiconductor material layer 6 includes a semiconductor material having a doping of a second conductivity type that is the opposite of the first conductivity type. Atomic concentration of dopants of the second conductivity type in the single crystalline doped semiconductor material layer 6 can be in a range from $5.0 \times 10^{18}/cm^3$ to $2.0 \times 10^{21}/cm^3$, although lesser and greater dopant concentrations can also be employed. The thickness of the single crystalline doped semiconductor material layer 6 may be in a range from 50 nm to 500 nm, although lesser and greater thicknesses can also be employed. In one embodiment, each of the substrate semiconductor layer 9 and the single crystalline doped semiconductor material layer 6 can include a respective single crystalline doped silicon that is epitaxially aligned to each other. In one embodiment, the single crystalline doped semiconductor material layer 6 can be formed by implanting or diffusing dopants of the second conductivity type into an upper portion of a semiconductor substrate including the substrate semiconductor layer 9, and by converting the implanted upper portion of the substrate semiconductor layer 9 into the single crystalline doped semiconductor material layer 6. Alternatively, the single crystalline doped semiconductor material layer 6 may be epitaxially grown on top of the substrate semiconductor layer 9.

The first-level insulating layers 32 includes an insulating material such as undoped silicate glass, a doped silicate glass, or organosilicate glass. The thickness of each first-level insulating layer 32 can be in a range from 20 nm to 200 nm, although lesser and greater thicknesses can also be employed. The first-level spacer material layers can be formed as first-level sacrificial material layers 42, which can be subsequently replaced with first-level electrically conductive layers. Alternatively, the first-level spacer material layers can be formed as first-level electrically conductive layers. While the present disclosure is described employing an embodiment in which the first-level spacer material layers are formed as first-level sacrificial material layers 42, embodiments are expressly contemplated herein in which the first-level spacer material layers are formed as first-level electrically conductive layers. In this case, processing steps for replacement of the first-level sacrificial material layers 42 with first-level electrically conductive layers are not necessary. The thickness of each first-level spacer material layer can be in a range from 20 nm to 200 nm, although lesser and greater thicknesses can also be employed.

In one embodiment, the first alternating stack (32, 42) can include three first-level insulating layers 32 and two first-level sacrificial material layers 42. A two-dimensional array of discrete openings can be formed through the first alternating stack (32, 42), for example, by applying and patterning a photoresist layer, and by transferring the pattern in the photoresist layer though the first alternating stack (32, 42) employing an anisotropic etch process. The two-dimensional array of discrete openings is herein referred to as a two-dimensional array of first-level discrete memory openings 49. Each first-level discrete memory opening 49 can have a respective circular or elliptical horizontal cross-sectional shape. The maximum lateral dimension of each first-level discrete memory opening 49 can be in a range from 20 nm to 400 nm, such as from 40 nm to 200 nm, although lesser and greater maximum lateral dimensions can also be employed. A portion of the top surface of the single crystalline doped semiconductor material layer 6 can be physically exposed at the bottom of each first-level discrete memory opening 49.

Generally, a vertical layer stack of a first insulating layer 32, a first spacer material layer (such as a first sacrificial material layer 42), a second insulating layer 32, a second spacer material layer (such as a second sacrificial material layer 42), and a third insulating layer 32 can be formed over the single crystalline doped semiconductor material layer 6. Each of the first spacer material layer and the second spacer material layer may be formed as, or may be subsequently replaced with, a respective electrically conductive layer. Each portion of the single crystalline doped semiconductor material layer 6 that underlies a first-level discrete memory opening 49 constitutes a first active region, which can be a source region or a drain region of a respective vertical field effect transistor. At least one opening can be formed through the vertical layer stack such that a top surface of the respective first active region is physically exposed the underneath each of the at least one opening. The at least one opening through the vertical layer stack can comprise a plurality of first-level discrete memory openings 49 that are laterally spaced apart among one another.

Referring to FIGS. 10A and 10B, a first gate dielectric 20 can be formed at a bottom portion of each first-level discrete memory opening 49 by conformal deposition of a first gate dielectric material layer and an anisotropic etch process. Optionally, a sacrificial fill material (such as a photoresist material) can be deposited in the first-level discrete memory openings 49 and can be vertically recessed such that the recessed surfaces of the sacrificial fill material is located between the first sacrificial material layer 42 and the second sacrificial material layer 42. In this case, an isotropic etch process can be employed to remove a cylindrical portion of the first gate dielectric material layer from above the top surfaces of the portions of the sacrificial fill material. The sacrificial fill material can be subsequently removed, for example, by ashing. Each remaining portion of the first gate dielectric material layer constitutes a first gate dielectric 20, which can have a respective tubular shape.

Figure 11B:
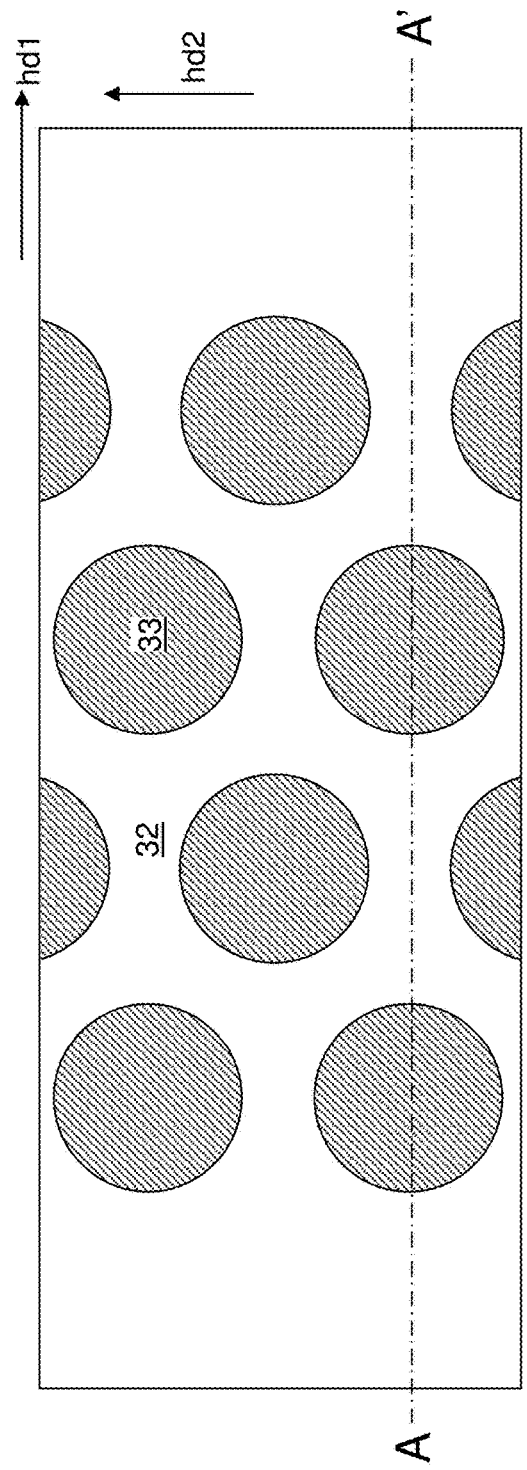
FIG. 11B is a top-down view of the second exemplary structure of FIG. 11A. The plane A-A' is the plane of the vertical cross-sectional view of FIG. 11A.
Figure 11A:
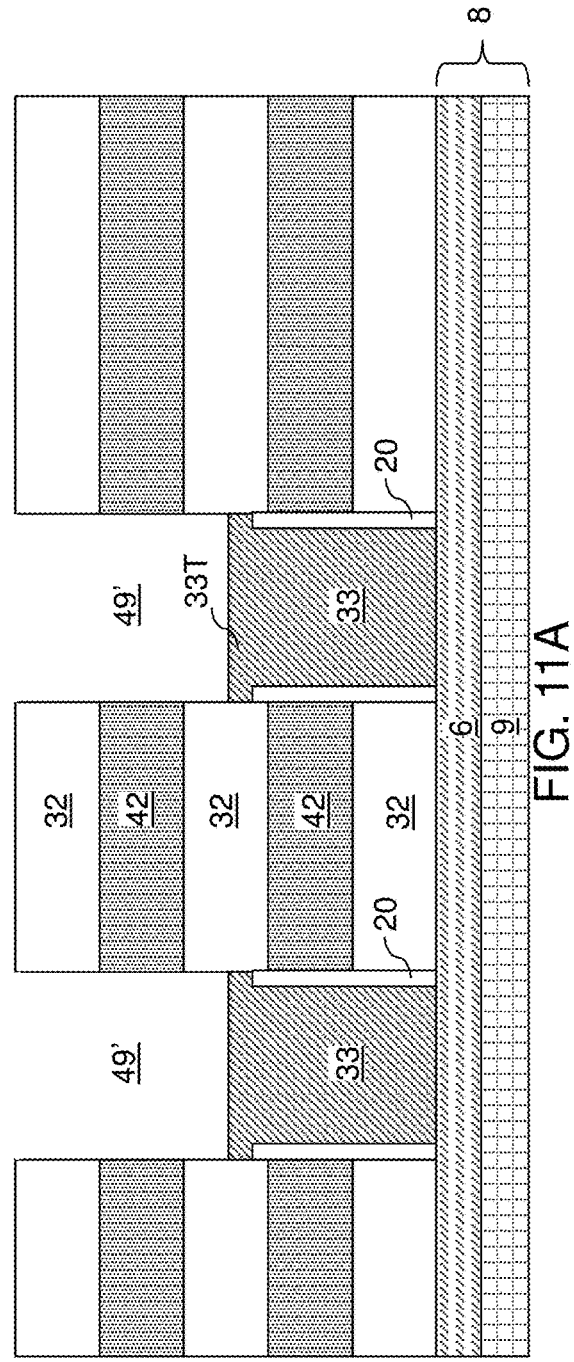
FIG. 11A is a vertical cross-sectional view of the second exemplary structure after formation of first vertical semiconductor channels according to the second embodiment of the present disclosure.

Referring to FIGS. 11A and 11B, first vertical semiconductor channels 33 can be formed by depositing a first semiconductor material having a doping of the first conductivity type in a lower portion of each of the first-level discrete memory openings 49. In one embodiment, each first vertical semiconductor channel 33 can be formed by a selective epitaxy process that grows the first semiconductor material from the physically exposed surfaces of the single crystalline doped semiconductor material layer 6. In this case, each first vertical semiconductor channel 33 can comprise a first single crystalline epitaxial semiconductor material that is epitaxially aligned to the single crystalline doped semiconductor material layer 6. If the first gate dielectric material layer has not been recessed before forming the first vertical semiconductor channel 33, then the first gate dielectric material layer is recessed by a selective etch to be even with the top of the first vertical semiconductor channel 33. A top portion 33T of the first vertical semiconductor channel 33 is then epitaxially grown on the first vertical semiconductor channel 33 over the first gate dielectric 20. The top portion 33T of the first vertical semiconductor channel 33 contacts the sidewall of an insulating layer 32 exposed in the memory opening 49. The top surface of each first vertical semiconductor channel 33 (e.g., the top surface of its top portion 33T) can be located at, or above, the topmost surface of a first gate dielectric 20 within a same first-level discrete memory opening 49. A first memory cavity 49' is present within each unfilled volume of the first-tier discrete memory openings 49.

Referring to FIGS. 12A and 12B, at least one second gate dielectric material layer (52L, 50L) can be formed by a respective conformal deposition process. The at least one second gate dielectric material layer (52L, 50L) can include a continuous ferroelectric material layer 52L and an optional non-ferroelectric gate dielectric material layer 50L. The continuous ferroelectric material layer 52L can include any material that can be employed for the ferroelectric material layer 152 of the first exemplary structure. The non-ferroelectric gate dielectric material layer 50L, if present, can include any non-ferroelectric gate dielectric material.

Referring to FIGS. 13A and 13B, an anisotropic etch process can be performed to remove horizontal portions of the at least one second gate dielectric material layer (52L, 50L). Each remaining cylindrical portion of the at least one second gate dielectric material layer (52L, 50L) constitutes a second gate dielectric (52, 50). Each second gate dielectric (52, 50) includes a ferroelectric material layer 52 and an optional non-ferroelectric gate dielectric 50. The top surface of the first vertical semiconductor channel 33 is exposed in the first memory cavity 49'.

Referring to FIGS. 14A and 14B, a second vertical semiconductor channel 35 can be formed within each first memory cavity 49' by deposition of a second semiconductor material. In one embodiment, each second vertical semiconductor channel 35 can be formed by a selective epitaxy process that grows the second semiconductor material from the physically exposed surfaces of a respective first vertical semiconductor channel 33. In this case, each second vertical semiconductor channel 35 can comprise a second single crystalline epitaxial semiconductor material (e.g., single crystal silicon) that is epitaxially aligned to the single crystalline doped semiconductor material layer 6 through a respective first single crystalline epitaxial semiconductor material of a first vertical semiconductor channel 33. Each second vertical semiconductor channel 35 can comprise a second single crystalline epitaxial semiconductor material that is epitaxially aligned to a respective first single crystalline epitaxial semiconductor material.

Each second gate dielectric (52, 50) can comprise a ferroelectric material layer 52, and can contact a bottom part of a sidewall of a second vertical semiconductor channel 35. Generally, the order of processing steps of FIGS. 10A-11B and the processing steps of FIGS. 12A-14B may be reversed. Thus, the second vertical semiconductor channels 35 can be formed over, or under, the first vertical semiconductor channels 33. Each second gate dielectric (52, 50) can contact a top end or a bottom end of the first vertical semiconductor channel 33. Each second vertical semiconductor channel 35 can comprise a second single crystalline epitaxial semiconductor material that is epitaxially aligned to a respective first single crystalline epitaxial semiconductor material of an overlying or underlying first vertical semiconductor channel 33. Each vertical stack of a first vertical semiconductor channel 33 and a second vertical semiconductor channel 33 constitutes a portion of a ferroelectric memory unit cell.

Referring to FIGS. 15A and 15B, first backside trenches 79 vertically extending through the first alternating stack (32, 42) can be formed by applying and patterning a photoresist layer over the first alternating stack (32, 42) to form linear openings that extend along a horizontal direction (such as the second horizontal direction hd2) in the photoresist layer, and by transferring the pattern of the linear openings through the first alternating stack (32, 42) by performing an anisotropic etch process.

Referring to FIGS. 16A and 16B, first backside recesses 43 can be formed by etching the first-level sacrificial material layers 42 selective to the first-level insulating layers 32, the first gate dielectrics 20, the second gate dielectrics (52, 50), and the single crystalline doped semiconductor material layer 6. For example, if the first-level sacrificial material layers 42 include silicon nitride, a wet etch employing hot phosphoric acid can be performed to form the first backside recesses 43.

Figure 17A:
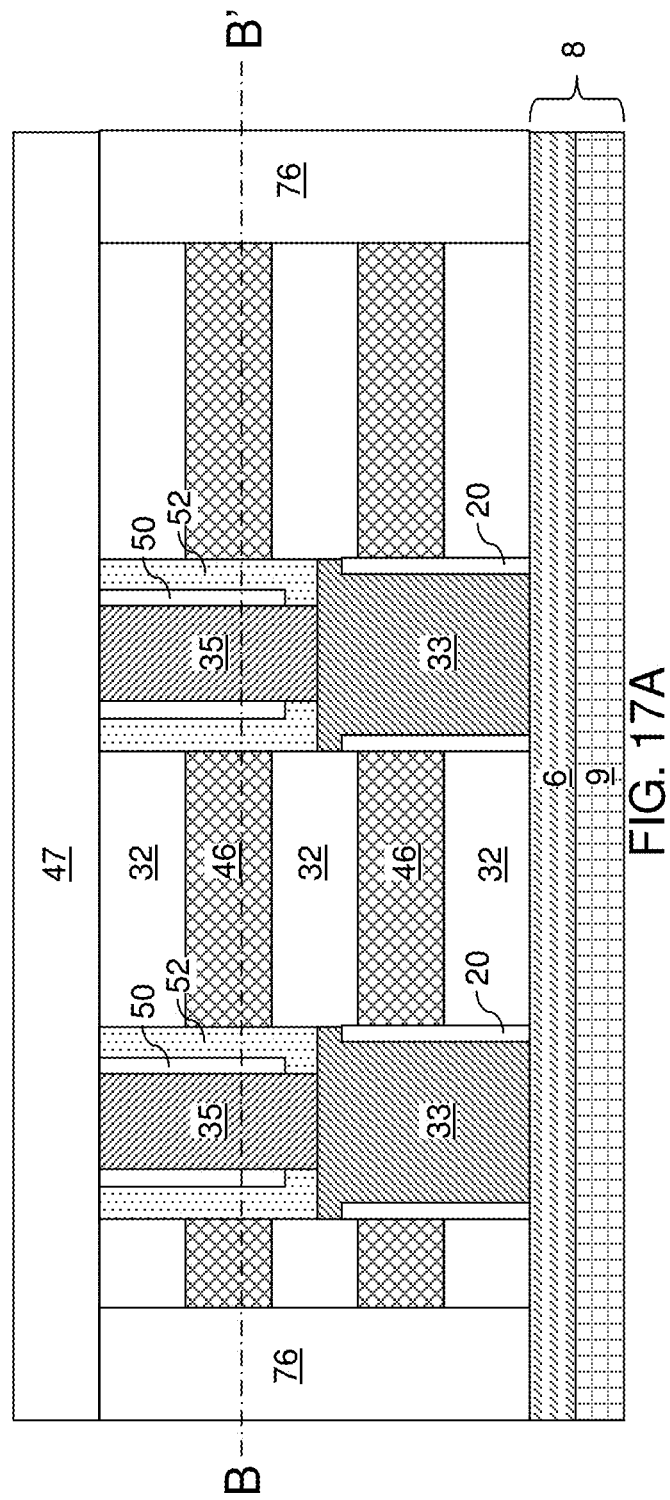
FIG. 17A is a vertical cross-sectional view of the second exemplary structure after formation of first-level electrically conductive layers, first backside trench fill structures, and a first contact-level dielectric layer according to the second embodiment of the present disclosure.
Figure 17B:
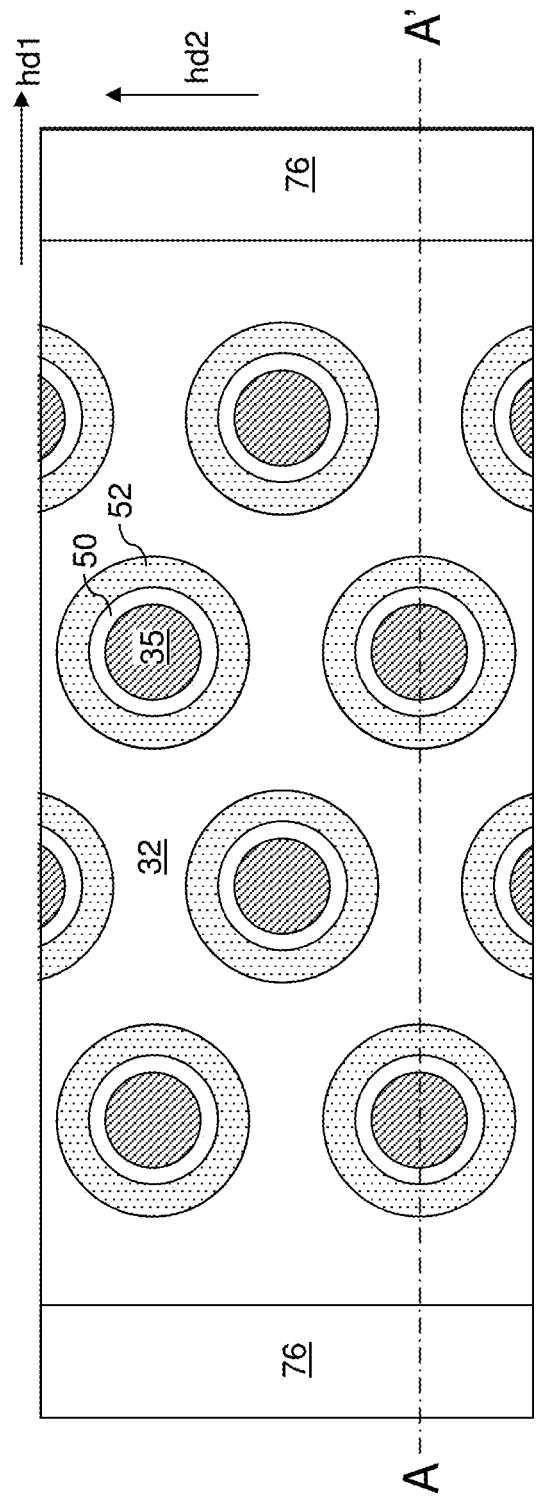
FIG. 17B is a vertical cross-sectional view of the second exemplary structure along plane B-B' in FIG. 17A. The plane A-A' is the plane of the vertical cross-sectional view of FIG. 17A.

Referring to FIGS. 17A and 17B, first-level electrically conductive layers 46 can be formed by depositing at least one conductive material in the first backside recesses 43 by a conformal deposition process. The at least one conductive material can include, for example, a metallic liner material (such as TiN) and a metallic fill material (such as W). Excess portions of the at least one conductive material in the first backside trenches 79 and over the topmost first-level insulating layer 32 can be removed by an isotropic recess etch process.

A dielectric material can be deposited in the first backside trenches 79 and over the topmost first-level insulating layer 32. Each portion of the dielectric material that fills a first backside trench 79 constitutes a first backside trench fill structure 76. The planar portion of the dielectric material that is deposited over the topmost first-level insulating layer 32 constitutes a first contact-level dielectric layer 47.

Figure 18A:
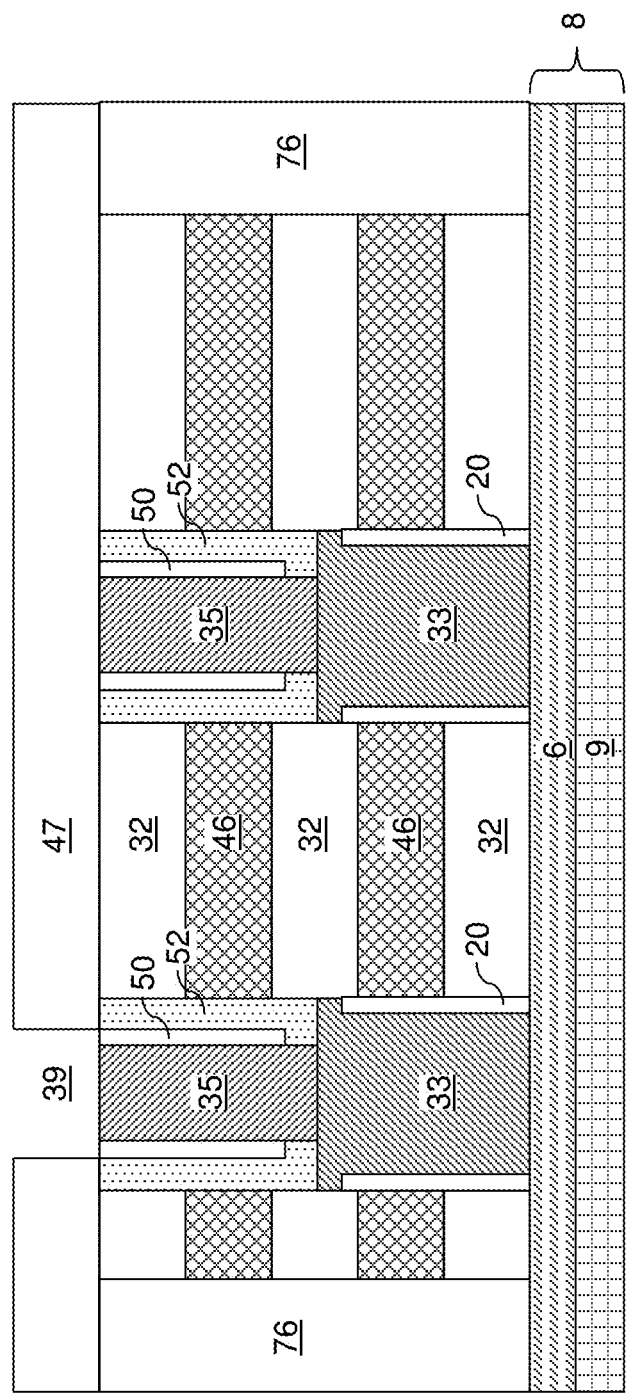
FIG. 18A is a vertical cross-sectional view of the second exemplary structure after formation of first contact via cavities according to the second embodiment of the present disclosure.
Figure 18B:
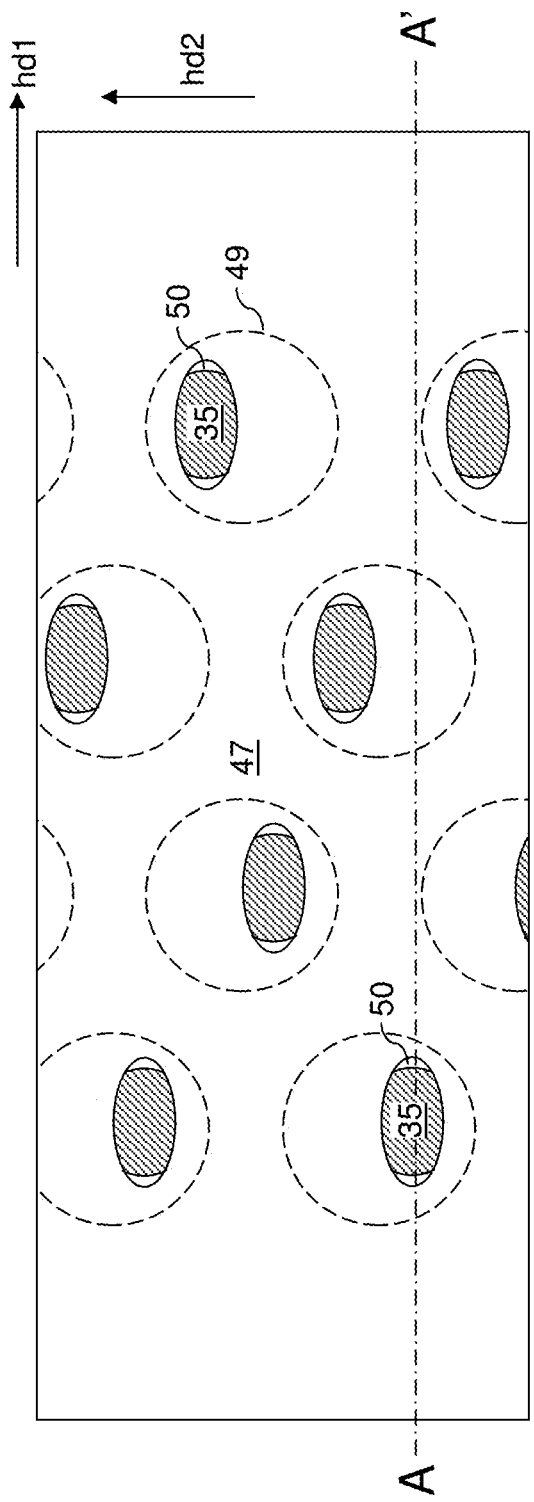
FIG. 18B is a top-down view of the second exemplary structure of FIG. 18A. The plane A-A' is the plane of the vertical cross-sectional view of FIG. 18A.

Referring to FIGS. 18A and 18B, first contact via cavities 39 can be formed through the first contact-level dielectric layer 47 over a respective one of the second vertical semiconductor channels 35. A top surface of a second vertical semiconductor channel 35 can be physically exposed at the bottom of each first contact via cavity 39. In one embodiment, the first contact via cavities 39 can be elongated along a horizontal direction such as the first horizontal direction hd1. In one embodiment, the first contact via cavities 39 can be laterally offset along the second horizontal direction hd2 such that the lateral extent of the first contact via cavities 39 between a neighboring pair of first backside trench fill structures 76 do not have an overlap in the lateral extent along the second horizontal direction hd2, or have a minimal overlap along the second horizontal direction hd2.

Figure 19B:
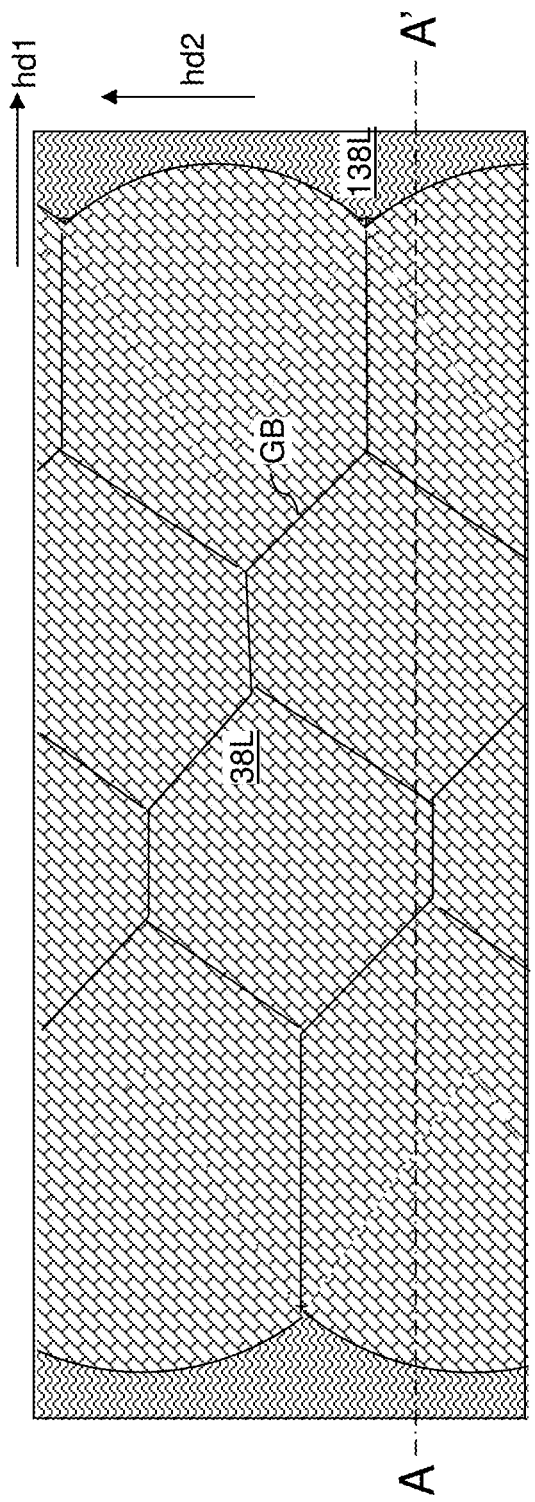
FIG. 19B is a top-down view of the second exemplary structure of FIG. 19A. The plane A-A' is the plane of the vertical cross-sectional view of FIG. 19A.

Referring to FIGS. 19A and 19B, a conductive material can be deposited in the first contact via cavities 39 and over the top surface of the first contact-level dielectric layer 47. The deposited conductive material filling the first contact via cavities 39 and overlying the first contact-level dielectric layer 47 constitutes a bit-line-level conductive material layer (38L, 138L). The bit-line-level conductive material layer (38L, 138L) includes first contact via structures 38V that fill the first contact via cavities 39 and a planar conductive material layer that overlies the first contact-level dielectric layer 47.

In one embodiment, the bit-line-level conductive material layer (38L, 138L) can be formed by performing a selective epitaxy process that grows a single crystalline semiconductor material from the physically exposed surfaces of the second vertical semiconductor channels 35. Single crystalline semiconductor material portions can grow from the physically exposed surfaces of the second vertical semiconductor channels 35 and fills each of the first contact via cavities 39 and grows over the top surface of the first contact-level dielectric layer 47. Single crystalline grains that grow through different first contact via cavities 39 can contact one another and form a crystalline epitaxial semiconductor material layer 38L including multiple single crystalline semiconductor material grains that are epitaxially aligned to a respective one of the second vertical semiconductor channels 35, and contact one another at grain boundaries GB that are located between areas of the first contact via cavities 39. In one embodiment, the grain boundaries GB do not overlie any of the first contact via cavities 39. The set of all single crystalline grains, i.e., the single crystalline semiconductor material portions, constitutes a multi-grained epitaxial semiconductor layer 38L that includes multiple epitaxial semiconductor material grains, each of which is epitaxially aligned to an underlying second vertical semiconductor channel 35.

Optionally, peripheral portions of the bit-line-level conductive material layer (38L, 138L) are formed by a nonselective semiconductor deposition process to form a polycrystalline semiconductor layer 138L. The multi-grained epitaxial semiconductor layer 38L and the optional polycrystalline semiconductor layer 138L can be planarized, for example, by chemical mechanical polishing, to provide a planar top surface. The multi-grained epitaxial semiconductor layer 38L and the optional polycrystalline semiconductor layer 138L can be doped with dopants of the second conductivity type by in-situ doping or by ion implantation. The multi-grained epitaxial semiconductor layer 38L and the optional polycrystalline semiconductor layer 138L can include dopants of the second conductivity type at an atomic concentration in a range from $5.0 \times 10^{18}/cm^3$ to $2.0 \times 10^{21}/cm^3$, although lesser and greater dopant concentrations can also be employed. The set of the multi-grained epitaxial semiconductor layer 38L and the polycrystalline semiconductor layer 138L constitutes the bit-line-level conductive material layer (38L, 138L).

Figure 20A:
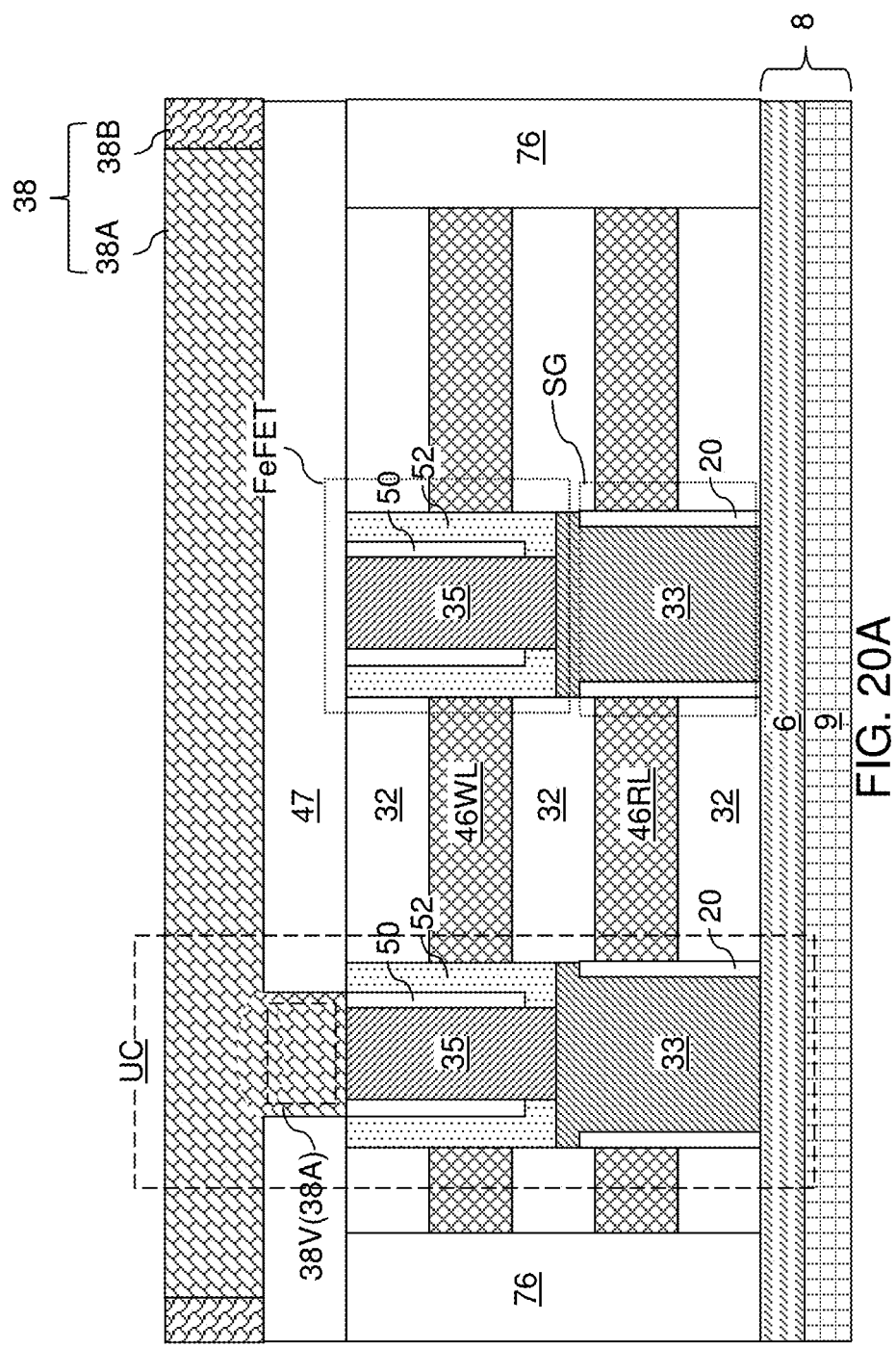
FIG. 20A is a vertical cross-sectional view of the second exemplary structure after formation of bit lines according to the second embodiment of the present disclosure.
Figure 20B:
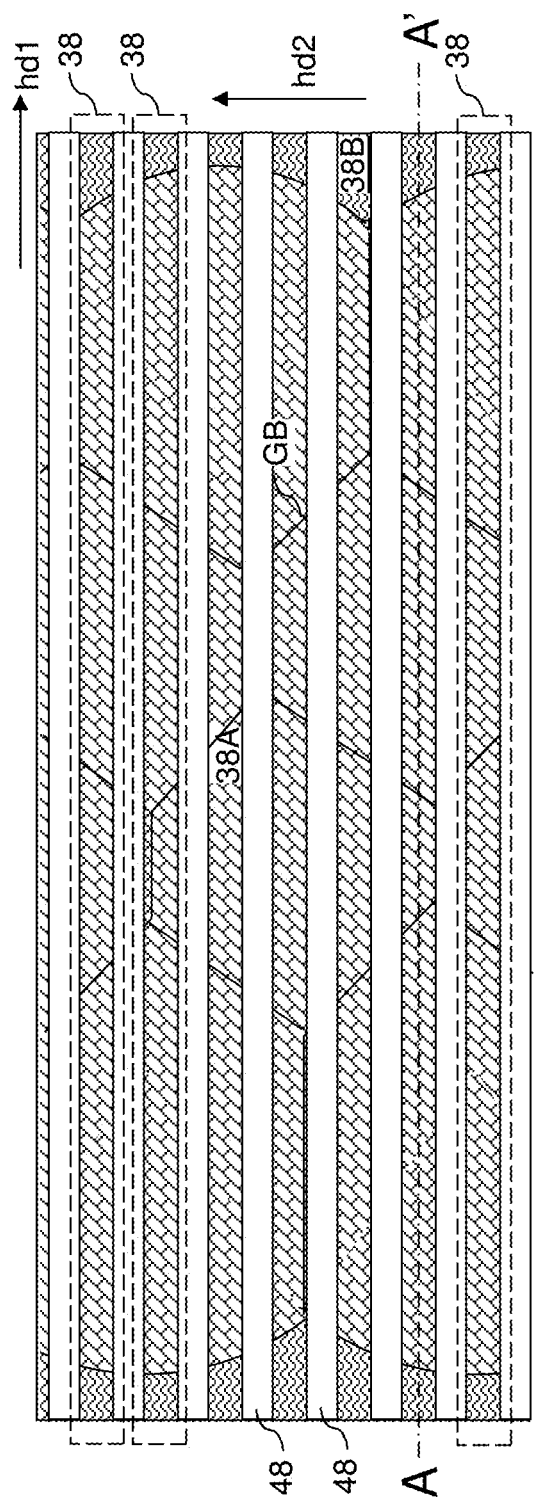
FIG. 20B is a top-down view of the second exemplary structure of FIG. 20A. The plane A-A' is the plane of the vertical cross-sectional view of FIG. 20A.

Referring to FIGS. 20A and 20B, a photoresist layer (not shown) can be applied over the bit-line-level conductive material layer (38L, 138L), and can be lithographically patterned to form line patterns that laterally extend along the first horizontal direction hd1. Each line pattern can cover a respective one of the first contact via structures 38V. In one embodiment, each line pattern of the photoresist layer can cover only one first conductive via structure 38V between each laterally neighboring pair of first backside trench fill structures 76.

An anisotropic etch process can be performed to transfer the line patterns through the bit-line-level conductive material layer (38L, 138L). The bit-line-level conductive material layer (38L, 138L) can be patterned into multiple discrete portions, each of which includes a bit line 38 and a first contact via structure 38V. Each bit line 38 is a conductive line structure that includes a plurality of single crystalline grains 38A that are epitaxially aligned to a respective one of the single crystalline epitaxial semiconductor material portions of underlying ferroelectric memory unit cells, and optionally includes polycrystalline line portions 38B including a doped semiconductor material having a doping of the second conductivity type.

Generally, a ferroelectric memory unit cell UC includes a vertical stack of an underlying field effect transistor and an overlying field effect transistor. The underlying field effect transistor and the overlying field effect transistor can be formed in each of the at least one opening, i.e., the first-level discrete memory openings 49, through the vertical layer stack (32, 42). The underlying field effect transistor comprises one of a first field effect transistor (e.g., the select gate transistor SG shown in FIGS. 1A and 1B) and a second field effect transistor (e.g., the ferroelectric memory transistor FeFET shown in FIGS. 1A and 1B), and the overlying field effect transistor comprises another of the first field effect transistor and the second field effect transistor. The second field effect transistor overlies or underlies the first field effect transistor.

The first field effect transistor SG includes a first vertical semiconductor channel 33, a first gate dielectric 20 contacting a sidewall of the first vertical semiconductor channel 33, and a portion of a first-level electrically conductive layer 46 that contacts the first gate dielectric 20. Each first vertical semiconductor channel 33 and each second vertical semiconductor channel 35 of each ferroelectric memory unit cell UC comprises respective single crystalline epitaxial semiconductor material portion that is epitaxially aligned to the single crystalline doped semiconductor material layer 6. The vertical stack of the first field effect transistor SG and the second field effect transistor FeFET is formed over a first active region, which may be a source region connected to a conductive source line or a doped semiconductor source line. For example, the source line SL shown in FIGS. 1A and 1B may comprise the single crystalline doped semiconductor material layer 6. A respective second active region can be formed on a top end of the respective stack of the first vertical semiconductor channel 33 and the second vertical semiconductor channel 35. Each second active region may be a drain region located in the first contact via structure 38V which is connected to the bit line 38. The bit line 38 corresponds to the bit line BL in FIGS. 1A and 1B.

A plurality of ferroelectric memory unit cells UC can be formed within a plurality of first-level discrete memory openings 49. Each of the first-level discrete memory openings 49 can have a closed horizontal cross-sectional shape, and can continuously extend through each of the three insulating layers 32, the first electrically conductive layer 46RL, and the second electrically conductive layer 46WL. Each of the first gate dielectric 20 and the second gate dielectric (52, 50) is located inside a respective first-level discrete memory opening 49. The first electrically conductive layer 46RL may correspond to the read line RL of FIGS. 1A and 1B, and may encircle the first vertical semiconductor channel 33. The second electrically conductive layer 46WL may correspond to the word line WL of FIGS. 1A and 1B, and may encircle the second vertical semiconductor channel 35.

The first active region (which can be embodied as the single crystalline doped semiconductor material layer 6), the first electrically conductive layer 46, the second electrically conductive layer 46, and the second active region (as embodied as a first contact via structure 38V and/or a bit line 38) are vertically spaced among one another by three insulating layers 32 that are vertically spaced apart among one another. In one embodiment, outer sidewalls of the second gate dielectric (52, 50) are vertically coincident with outer sidewalls of the first gate dielectric 20.

In one embodiment, an interface between the first electrically conductive layer 46RL and the first gate dielectric 20 is vertically coincident with an interface between the second electrically conductive layer 46WL and the second gate dielectric (52, 50). Each of the insulating layers 32 has a sidewall that contacts the first gate dielectric 20 or the second gate dielectric (52, 50) and is vertically coincident with the interface between the first electrically conductive layer 46RL and the first gate dielectric 20. The fabrication process of the second exemplary device of the second embodiment may stop at this point.

Figure 21A:
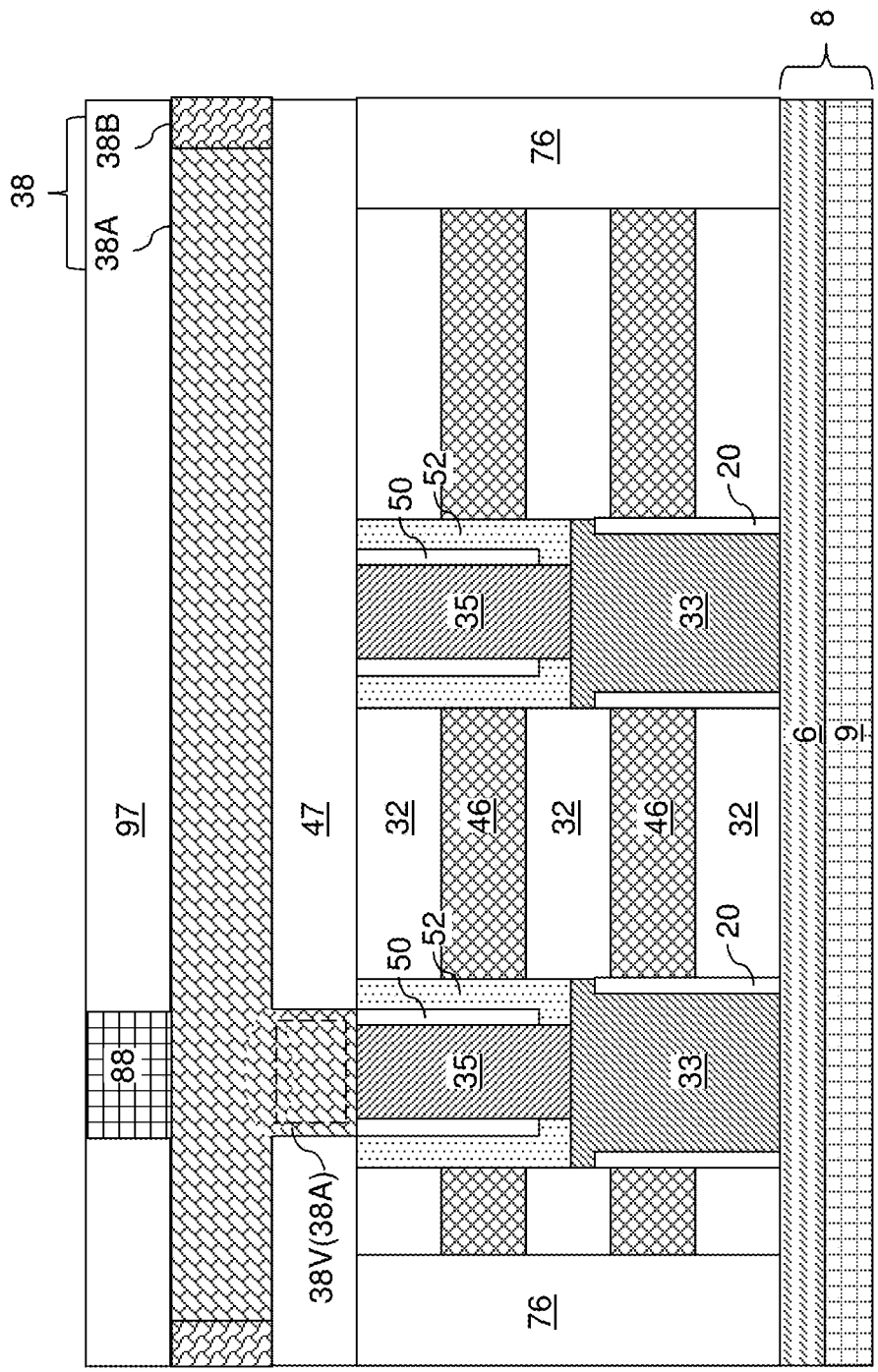
FIG. 21A is a vertical cross-sectional view of the second exemplary structure after formation of a second contact-level dielectric layer and second contact via structures according to the second embodiment of the present disclosure.

Optionally, another device level containing another array of unit cells is formed over the device shown in FIGS. 20A and 20B. Referring to FIGS. 21A and 21B, a second contact-level dielectric layer 97 can be formed over, and between, the bit lines 38. Second contact via cavities can be formed through the second contact-level dielectric layer 97 such that a top surface of an underlying bit line 38 is physically exposed. Second contact via structures 88 can be formed in the second contact via cavities by deposition and planarization of at least one conductive material.

In one embodiment, the second contact via structures 88 can include a doped semiconductor material having a doping of the second conductivity type. The second contact via structures 88 can include dopants of the second conductivity type at an atomic concentration in a range from $5.0 \times 10^{18}/\text{cm}^3$ to $2.0 \times 10^{21}/\text{cm}^3$, although lesser and greater dopant concentrations can also be employed. In one embodiment, the second contact via structures 88 can include a single crystalline doped semiconductor material within an underlying single crystalline grain of the underlying bit line 38. In this case, the second contact via structures 88 can be formed by a selective epitaxy process that grows single crystalline semiconductor material portions from the physically exposed single crystalline surfaces of the bit lines 38. In one embodiment, each second contact via structure 88 can have an areal overlap as, and/or can be located within a same area as, an underlying one of the first contact via structures 38V.

Figure 22B:
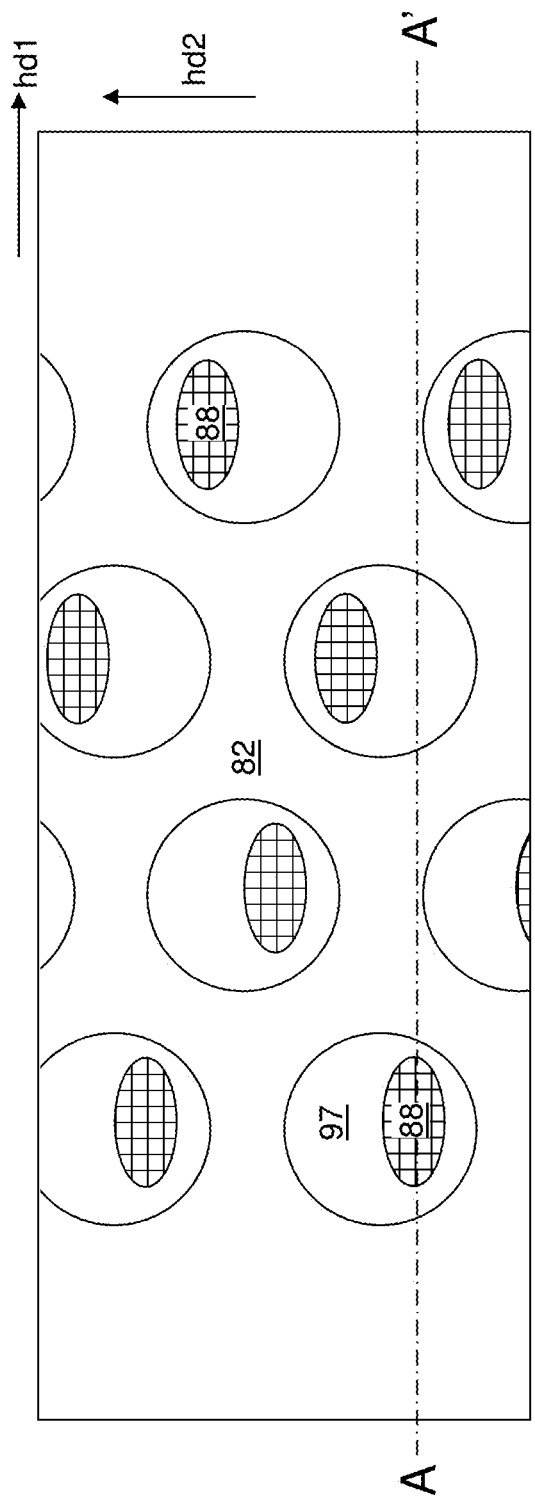
FIG. 22B is a top-down view of the second exemplary structure of FIG. 22A. The plane A-A' is the plane of the vertical cross-sectional view of FIG. 22A.

Referring to FIGS. 22A and 22B, a second alternating stack (82, 92) of second-level insulating layers 82 and second-level spacer material layers can be formed over the second contact-level dielectric layer 97. The second-level insulating layers 82 includes an insulating material such as undoped silicate glass, a doped silicate glass, or organosilicate glass. The thickness of each second-level insulating layer 82 can be in a range from 20 nm to 200 nm, although lesser and greater thicknesses can also be employed. The second-level spacer material layers can be formed as second-level sacrificial material layers 92, which can be subsequently replaced with second-level electrically conductive layers. Alternatively, the second-level spacer material layers can be formed as second-level electrically conductive layers. While the present disclosure is described employing an embodiment in which the second-level spacer material layers are formed as second-level sacrificial material layers 92, embodiments are expressly contemplated herein in which the second-level spacer material layers are formed as second-level electrically conductive layers. In this case, processing steps for replacement of the second-level sacrificial material layers 92 with second-level electrically conductive layers are not necessary. The thickness of each second-level spacer material layer can be in a range from 20 nm to 200 nm, although lesser and greater thicknesses can also be employed.

In one embodiment, the second alternating stack (82, 92) can include three second-level insulating layers 82 and two second-level sacrificial material layers 92. A two-dimensional array of discrete openings can be formed through the second alternating stack (82, 92), for example, by applying and patterning a photoresist layer, and by transferring the pattern in the photoresist layer though the second alternating stack (82, 92) employing an anisotropic etch process. The two-dimensional array of discrete openings is herein referred to as a two-dimensional array of second-level discrete memory openings 99. Each second-level discrete memory opening 99 can have a respective circular or elliptical horizontal cross-sectional shape. The maximum lateral dimension of each second-level discrete memory opening 99 can be in a range from 20 nm to 400 nm, such as from 40 nm to 200 nm, although lesser and greater maximum lateral dimensions can also be employed. A portion of the top surface of a second contact via structure 88 can be physically exposed at the bottom of each second-level discrete memory opening 99.

Referring to FIG. 23, a third gate dielectric (102, 100) can be formed at a lower portion of each second-level discrete memory opening 99. Each third gate dielectric (102, 100) includes ferroelectric material layer 102 and an optional non-ferroelectric gate dielectric 100, and can be formed by deposition and anisotropic etching of a continuous ferroelectric material layer and a non-ferroelectric gate dielectric layer. An upper region of each remaining tubular portion of the continuous ferroelectric material layer and the non-ferroelectric gate dielectric layer can be removed, for example, by deposition and recessing a sacrificial fill material such that top surfaces of sacrificial fill material portions are located at the level of a middle second-level insulating layer 82 of the three second-level insulating layers 82, and by isotropically etching unmasked portions of the remaining portions of the continuous ferroelectric material layer and the non-ferroelectric gate dielectric layer. The sacrificial fill material portions can be subsequently removed, for example, by ashing.

Third vertical semiconductor channels 85 can be grown from the physically exposed surfaces of the second contact via structures 88. In one embodiment, the third vertical semiconductor channels 85 can include a single crystalline semiconductor material having a doping of the first conductivity type. Each third vertical semiconductor channel 85 can provide the same functionality as the second vertical semiconductor channels 35, and each third gate dielectric (102, 100) can provide the same functionality as the second gate dielectrics (52, 50).

Figure 24:
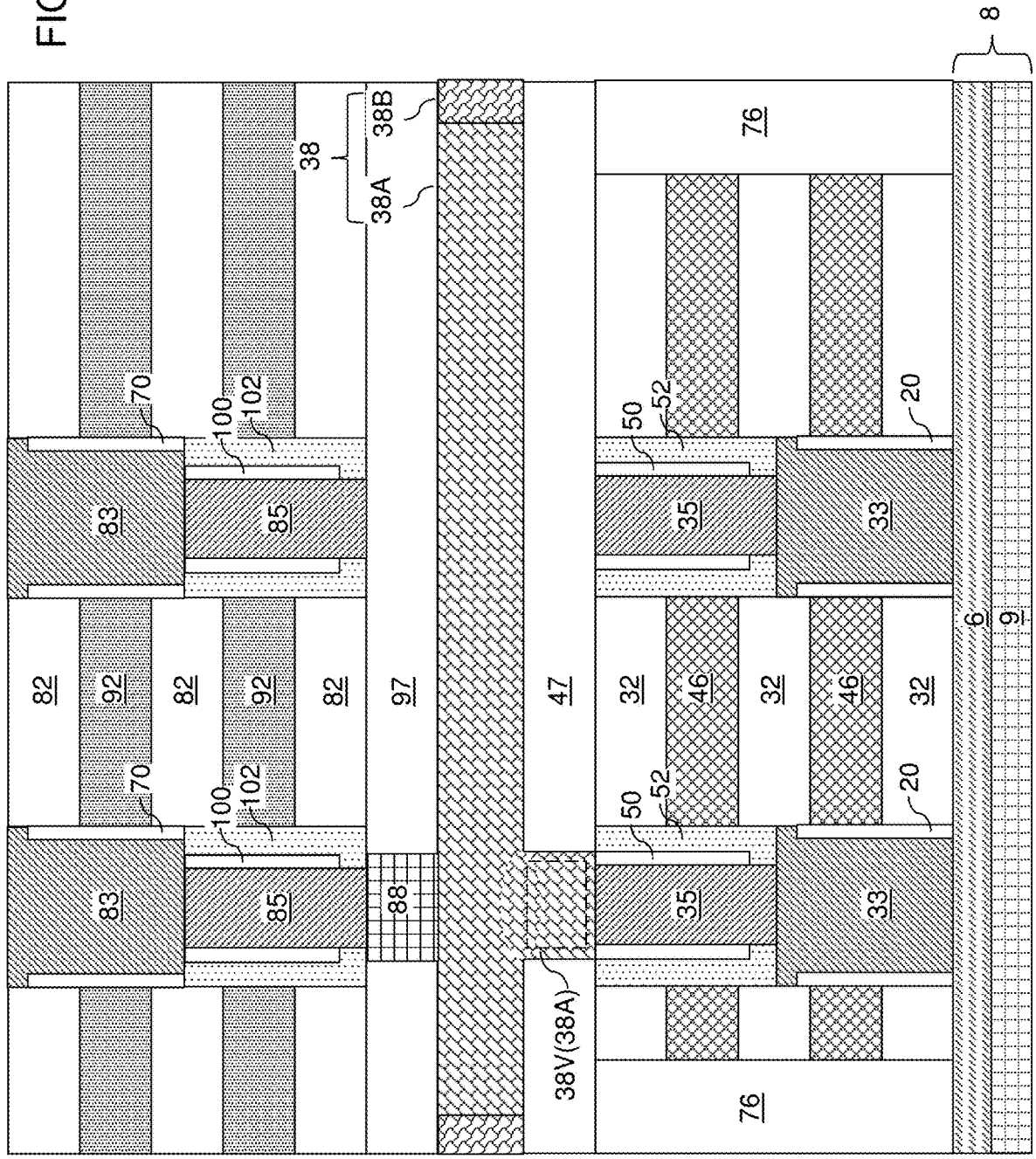
FIG. 24 is a vertical cross-sectional view of the second exemplary structure after formation of fourth vertical semiconductor channels according to the second embodiment of the present disclosure.

Referring to FIG. 24, the processing steps of FIGS. 10A, 10B, 11A, and 11B can be performed to form fourth gate dielectrics 70 and fourth vertical semiconductor channels 83. The fourth gate dielectrics 70 can include any material that may be employed for the first gate dielectrics 20. The fourth vertical semiconductor channels 83 can include a single crystalline semiconductor material having a doping of the first conductivity type, and can be formed by selective epitaxy. Top surfaces of the fourth vertical semiconductor channels 83 can be coplanar with the top surface of the topmost one of the second-level insulating layers 82. according to the second embodiment of the present disclosure.

Figure 25:
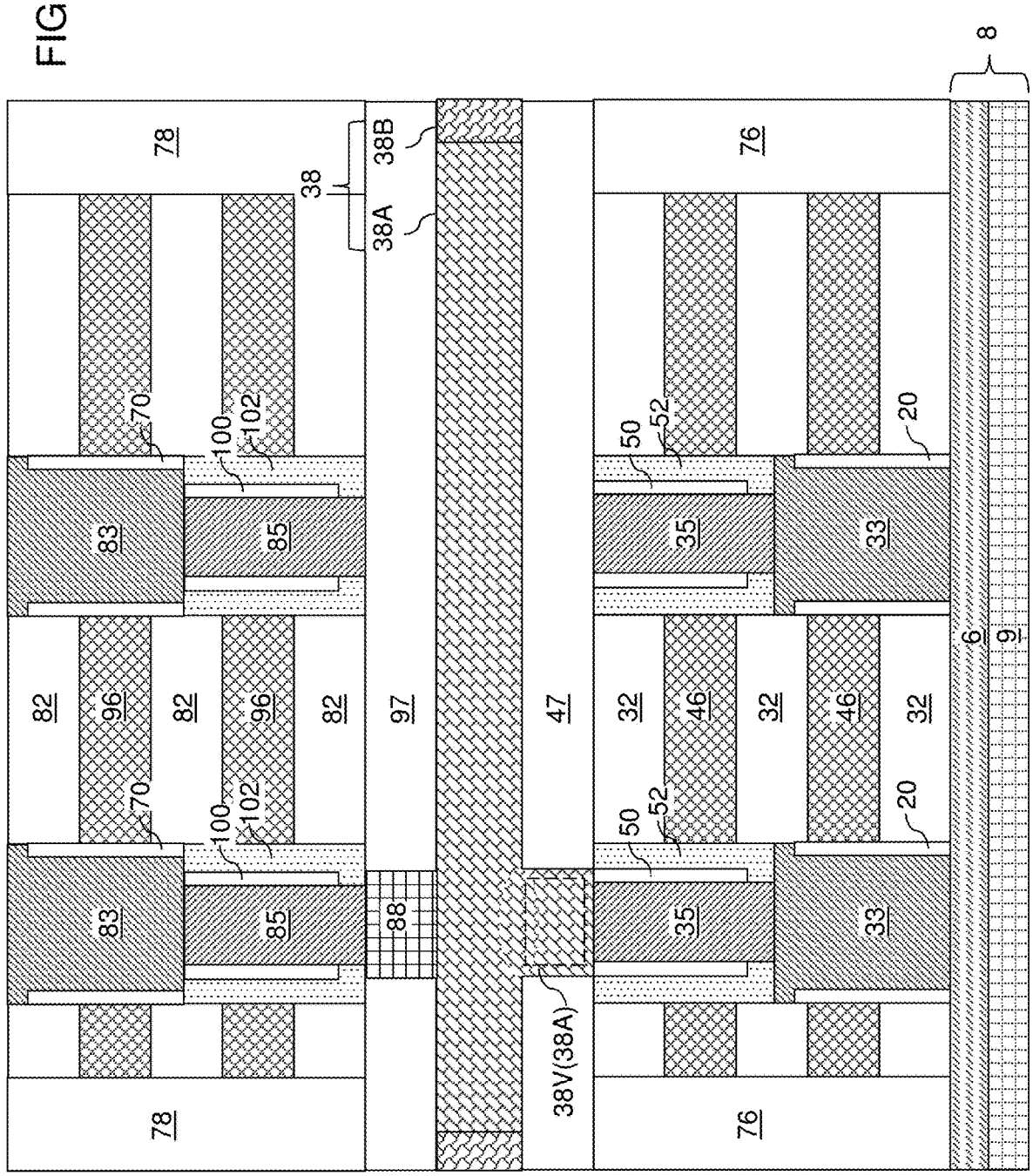
FIG. 25 is a vertical cross-sectional view of the second exemplary structure after formation of second backside trenches, replacement of the second-level spacer material layers with second electrically conductive layers, and formation of second backside trench fill structures according to the second embodiment of the present disclosure.

Referring to FIG. 25, second backside trenches vertically extending through the second alternating stack (82, 92) can be formed by applying and patterning a photoresist layer over the second alternating stack (82, 92) to form linear openings that extend along a horizontal direction (such as the second horizontal direction hd2) in the photoresist layer, and by transferring the pattern of the linear openings through the second alternating stack (82, 92) by performing an anisotropic etch process.

Second backside recesses can be formed by etching the second-level sacrificial material layers 92 selective to the second-level insulating layers 82, the third gate dielectrics (102, 100), the fourth gate dielectrics 70, and the second contact-level dielectric layer 97. For example, if the second-level sacrificial material layers 82 include silicon nitride, a wet etch employing hot phosphoric acid can be performed to form the second backside recesses.

Second-level electrically conductive layers 96 can be formed by depositing at least one conductive material in the second backside recesses by a conformal deposition process. The at least one conductive material can include, for example, a metallic liner material (such as TiN) and a metallic fill material (such as W). Excess portions of the at least one conductive material in the second backside trenches and over the topmost second insulating layer 82 can be removed by an isotropic recess etch process.

A dielectric material can be deposited in the second backside trenches and over the topmost second insulating layer 82. Each portion of the dielectric material that fills a second backside trench constitutes a second backside trench fill structure 78. The planar portion of the dielectric material that is deposited over the topmost second insulating layer 82 may be removed by a planarization process such as a recess etch and/or chemical mechanical polishing.

Figure 26A:
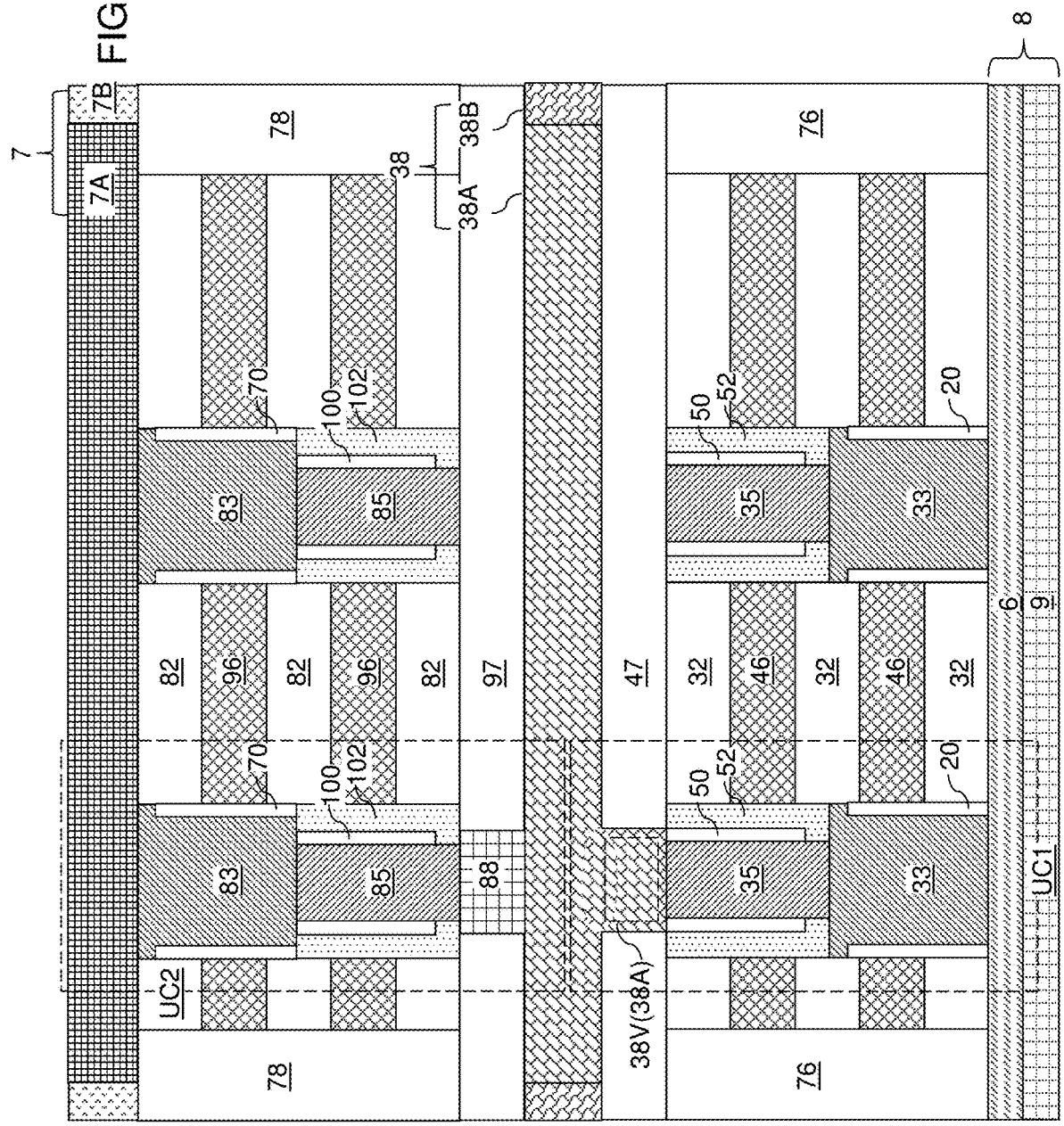
FIG. 26A is a vertical cross-sectional view of the second exemplary structure after formation of a source-level conductive material layer according to the second embodiment of the present disclosure.
Figure 26B:
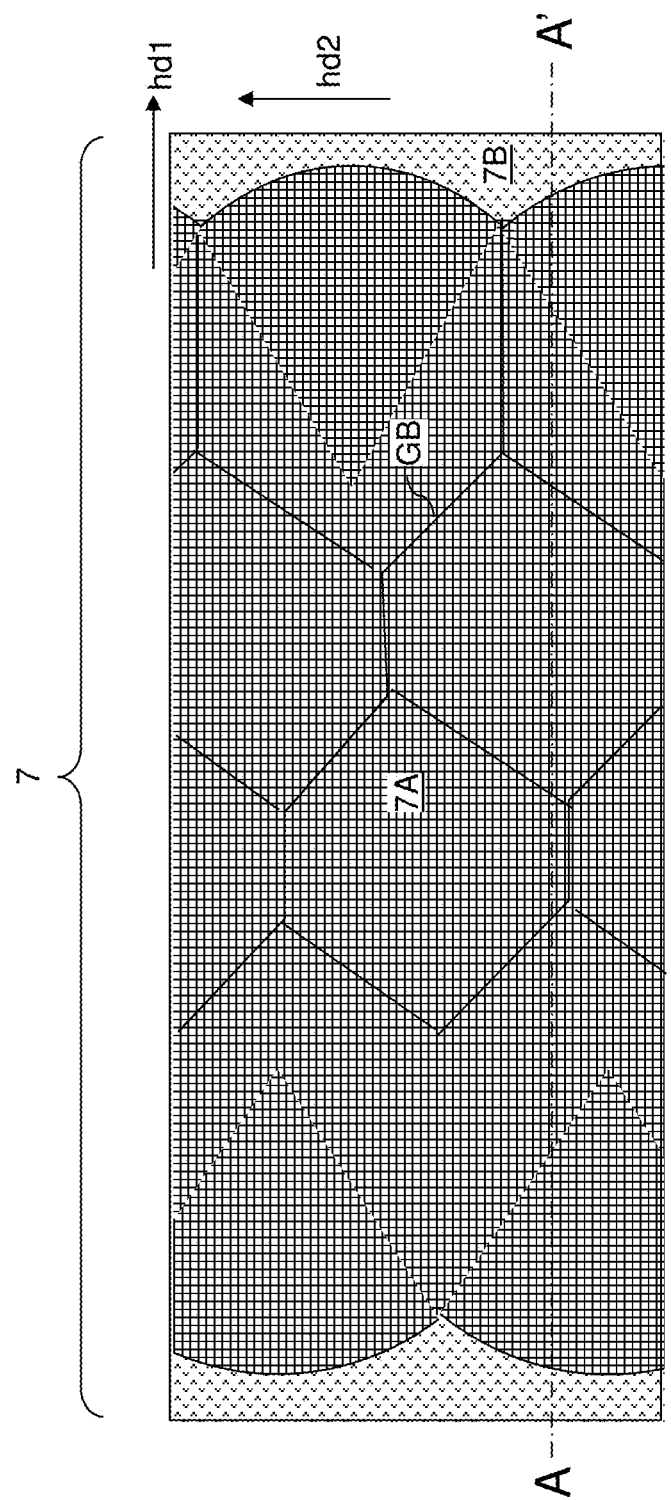
FIG. 26B is a top-down view of the second exemplary structure of FIG. 26A. The plane A-A' is the plane of the vertical cross-sectional view of FIG. 26A.

Referring to FIGS. 26A and 26B, a conductive material can be deposited on the physically exposed top surfaces of the fourth vertical semiconductor channels 83. The deposited conductive material overlying the fourth vertical semiconductor channels 83 constitutes a source-line-level conductive material layer 7.

In one embodiment, the source-line-level conductive material layer 7 can be formed by performing a selective epitaxy process that grows a single crystalline semiconductor material from the physically exposed surfaces of the fourth vertical semiconductor channels 83. Single crystalline semiconductor material portions can grow from the physically exposed surfaces of the fourth vertical semiconductor channels 83. Single crystalline grains that grow from different fourth vertical semiconductor channels 83 can contact one another and form a crystalline epitaxial semiconductor material layer including multiple single crystalline semiconductor material grains that are epitaxially aligned to a respective one of the fourth vertical semiconductor channels 83, and contact one another at grain boundaries GB that are located between areas of the fourth vertical semiconductor channels 83. In one embodiment, the grain boundaries GB do not overlie any of the fourth vertical semiconductor channels 83. The set of all single crystalline grains, i.e., the single crystalline semiconductor material portions, constitutes a multi-grained epitaxial semiconductor layer 7A that includes multiple epitaxial semiconductor material grains, each of which is epitaxially aligned to an underlying fourth vertical semiconductor channel 83.

Optionally, a peripheral portion of the source-line-level conductive material layer 7 may be deposited by non-selective semiconductor deposition process to form a polycrystalline semiconductor layer 7B. The multi-grained epitaxial semiconductor layer 7A and the optional polycrystalline semiconductor layer 7B can be planarized, for example, by chemical mechanical polishing, to provide a planar top surface. The multi-grained epitaxial semiconductor layer 7A and the optional polycrystalline semiconductor layer 7B can be doped with dopants of the second conductivity type by in-situ doping or by ion implantation. The multi-grained epitaxial semiconductor layer 7A and the optional polycrystalline semiconductor layer 7B can include dopants of the second conductivity type at an atomic concentration in a range from $5.0 \times 10^{18}/cm^3$ to $2.0 \times 10^{21}/cm^3$, although lesser and greater dopant concentrations can also be employed. The set of the multi-grained epitaxial semiconductor layer 7A and the polycrystalline semiconductor layer 7B constitutes the source-line-level conductive material layer 7 (e.g., second source line shown in FIG. 1B).

A third active region (e.g., a source region or source line comprising a portion of the source-line-level conductive material layer 7) can be formed on a top end of the respective stack of the third vertical semiconductor channel 85 and the fourth vertical semiconductor channel 83. Each of the at least one ferroelectric memory unit cell (UC1, UC2) comprises a respective vertical stack of ferroelectric memory unit cells.

Generally, a stack of a third field effect transistor and a fourth field effect transistor can be formed over a second active region, which may comprise a combination of a first contact via structure 38V, a bit line 38, and a second contact via structure 88. The fourth field effect transistor can overlie or underlie the third field effect transistor. The third field effect transistor (e.g., another ferroelectric memory transistor FeFET) includes a third vertical semiconductor channel 85, a third gate dielectric (102, 100) comprising an additional ferroelectric material layer 102 and contacting a sidewall of the third vertical semiconductor channel 85, and a portion of a third electrically conductive layer 96 that contacts the third gate dielectric (102, 100). The fourth field effect transistor (e.g., another select gate transistor SG) includes a fourth vertical semiconductor channel 83, a fourth gate dielectric 70 contacting a sidewall of the fourth vertical semiconductor channel 83 and contacting a top end or a bottom end of the second vertical semiconductor channel 85, and a portion of a fourth electrically conductive layer 96 that contacts the fourth gate dielectric 70.

In one embodiment, the at least one ferroelectric memory unit cell (UC1, UC2) of a ferroelectric memory device of the present disclosure can comprises at least one vertical stack of a first-level ferroelectric memory unit cell UC1 and a second-level ferroelectric memory unit cell UC2. The second-level ferroelectric memory unit cell UC2 overlies or underlies the first-level ferroelectric memory unit cell UC1 and has an areal overlap with the first-level ferroelectric memory unit cell UC1 in a plan view along a vertical direction, which is a direction that is perpendicular to the top surface of the semiconductor substrate 8. In one embodiment, each vertical stack of the first-level ferroelectric memory unit cell UC1 and the second-level ferroelectric memory unit cell UC2 comprises an underlying ferroelectric memory unit cell and an overlying ferroelectric memory unit cell that is more distal from the substrate 8 than the underlying ferroelectric memory unit cell is from the substrate 8.

Each ferroelectric memory unit cell (UC1, UC2) can include a respective first field effect transistor (i.e., a select gate transistor SG, such as a first field effect transistor of a first-level ferroelectric memory unit cell UC1 or a fourth field effect transistor of a second-level ferroelectric memory unit cell UC2) and a respective second field effect transistor (i.e., a ferroelectric memory transistor FeFET, such as a second field effect transistor of a first-level ferroelectric memory unit cell UC1 or a third field effect transistor of a second-level ferroelectric memory unit cell UC2). In one embodiment, the second field effect transistor of the first-level ferroelectric memory unit cell UC1 overlies a first field effect transistor of the first-level ferroelectric memory unit cell UC1, and a second field effect transistor of the second-level ferroelectric memory unit cell UC2 (such as the third field effect transistor including a third gate dielectric (102, 100)) underlies a first field effect transistor (such as the fourth field effect transistor including a fourth gate dielectric 70) of the second-level ferroelectric memory unit cell UC2.

In one embodiment, the first active region (e.g., first source or first source line) of the underlying ferroelectric memory unit cell is located in the single crystalline doped semiconductor material layer 6 (e.g., first source line) having a greater lateral extent along a second horizontal direction hd2 than a width of a conductive line structure (such as a bit line 38) along the second horizontal direction hd2. The second horizontal direction hd2 can be perpendicular to the first horizontal direction hd1. The second active region of the overlying ferroelectric memory unit cell may comprise as a conductive material layer (such as the source-line-level conductive material layer 7, i.e., second source line) having a greater lateral extent along the second horizontal direction hd2 than the width of the conductive line structure (such as a bit line 38) along the second horizontal direction hd2. The first and second source lines may be electrically separate, as shown in FIG. 1B, or may be electrically connected to each other (not shown in FIGS. 26A and 26B) as shown in FIG. 1A.

The shared third active region (e.g., drain region) of the underlying ferroelectric memory unit cell and of the overlying ferroelectric memory unit cell comprise a common bit line 38 that laterally extends along a first horizontal direction between the underlying ferroelectric memory unit cell and the overlying ferroelectric memory unit cell. Alternatively, the separate drain regions 38V, 88 of each unit cell are electrically connected to a common bit line 38.

Referring to FIGS. 27A and 27B, a third exemplary structure according to a third embodiment of the present disclosure can be derived from the second exemplary structure illustrated in FIGS. 9A and 9B by forming first-level line trenches 149 in lieu of first-level discrete memory openings 49. The first-level line trenches 149 can have a respective uniform width throughout, and laterally extends along a horizontal direction. An embodiment is illustrated herein in which the first-level line trenches 149 laterally extend along the second horizontal direction.

Referring to FIGS. 28A and 28B, the processing steps of FIGS. 10A and 10B can be performed to form first gate dielectrics 20 and to epitaxially grow first vertical semiconductor channel material portions 33'. Each of the first vertical semiconductor channel material portions 33' comprises a single crystal semiconductor material (e.g., single crystal silicon) can be subsequently patterned to form a plurality of vertical semiconductor channels. A line cavity 149' is present within each unfilled volume of the first-level line trenches 149.

Figure 28E:
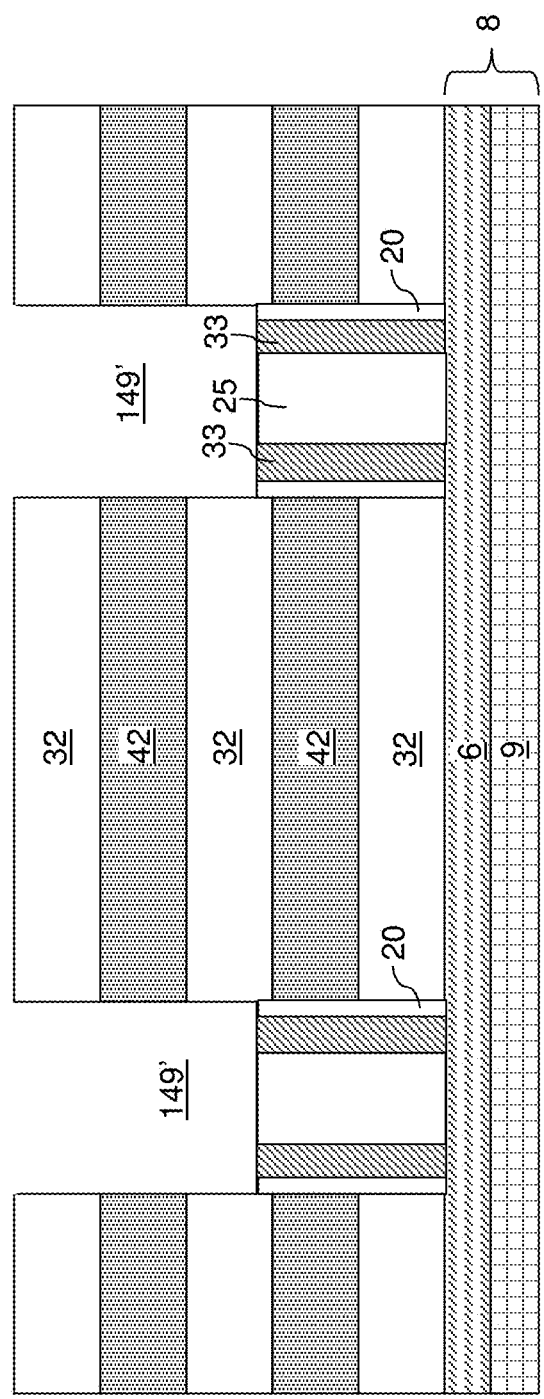

FIGS. 28C-28E illustrate steps in forming an alternative configuration of the third exemplary structure. In this alternative configuration, the first vertical semiconductor channels 33 comprise a polycrystalline semiconductor layer (e.g., polysilicon) that is deposited in the first-level line trenches 149, and then etched back. Specifically, as shown in FIG. 28C, a thin film polysilicon first vertical semiconductor channel material layer 33L is deposited in the first-level line trenches 149 and optionally recessed. As shown in FIG. 28D, the horizontal portion of the first vertical semiconductor channel material layer 33L is removed by anisotropic etching to form the first vertical semiconductor channels 33 and to expose layer 6 at the bottom of the first-level line trenches 149. As shown in FIG. 28E, first dielectric cores 25 are then deposited over the first vertical semiconductor channels 33 in the first-level line trenches 149, and recessed to be level with the top of the first vertical semiconductor channels 33. If the first vertical semiconductor channels 33 are not recessed in the prior steps, then the first vertical semiconductor channels 33 may be recessed together with the first dielectric cores 25.

Referring to FIGS. 29A and 29B, sacrificial spacers (not shown) can be formed on sidewalls of upper regions of the first-level line trenches 149 by conformal deposition and anisotropic etch of a sacrificial spacer material. The sacrificial spacer material can include a silicon oxide material having a high etch rate (such as borosilicate glass), a silicon-germanium alloy, a carbon-based material (such as amorphous carbon), or a polymer material. Center portions of the first vertical semiconductor channel material portions 33' can be removed by an anisotropic etch process to physically expose a top surface of the single crystalline doped semiconductor material layer 6. Remaining portions of the first vertical semiconductor channel material portions 33' constitute first vertical semiconductor channels 33.

A dielectric material such as undoped silicate glass, a doped silicate glass, or an organosilicate glass can be deposited in the cavities formed by removal of the center portions of the first vertical semiconductor channel material portions 33'. The dielectric material can be vertically recessed to form first dielectric cores 25. The sacrificial spacers can be removed selective to the first dielectric cores 25 and the first vertical semiconductor channels 33.

Figure 29C:
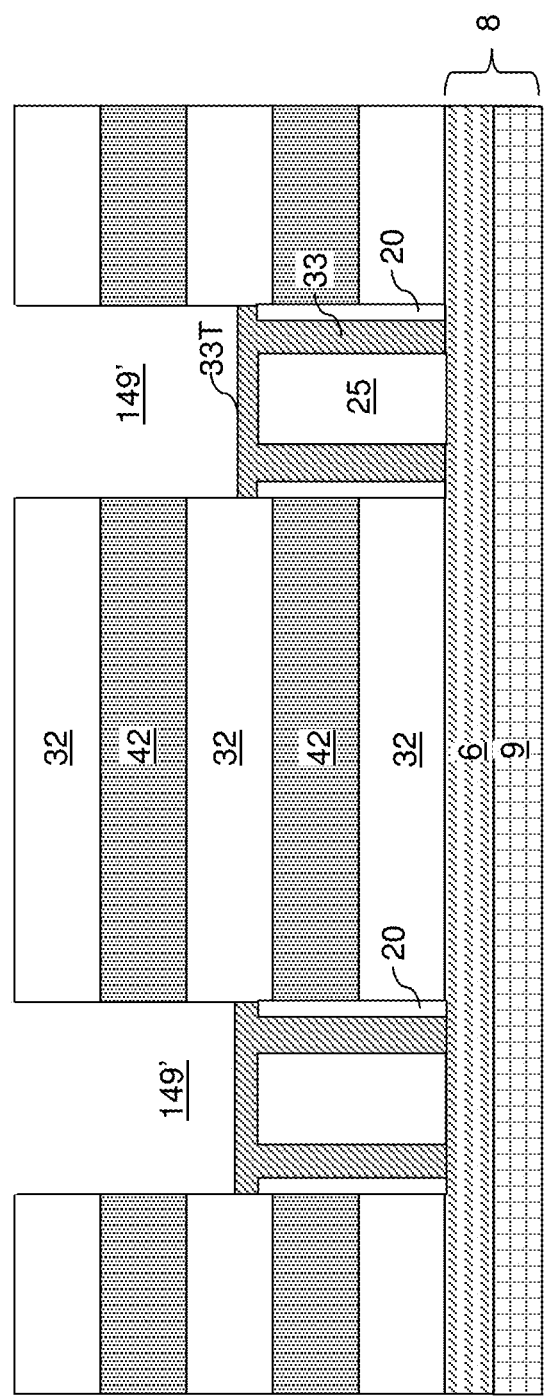
FIG. 29C is a vertical cross-sectional view of an alternative configuration of the third exemplary structure.

FIG. 29C illustrates the alternative configuration in which the vertical semiconductor channels 33 comprise a thin film polycrystalline semiconductor layer. After the step shown in FIG. 28E, a top portion 33T of the first vertical semiconductor channel 33 is grown on the first vertical semiconductor channel 33 over the first gate dielectric 20, as shown in FIG. 29C.

Referring to FIGS. 30A and 30B, the processing steps of FIGS. 12A, 12B, 13A, and 13B can be performed to form second gate dielectrics (50, 52). Each second gate dielectric (50, 52) includes a ferroelectric material layer 52 and an optional non-ferroelectric gate dielectric 50.

Referring to FIGS. 31A and 31B, the processing steps of FIGS. 14A and 14B can be performed to form second vertical semiconductor channels 35.

Referring to FIGS. 32A and 32B, a photoresist layer (not shown) can be applied over the topmost first-level insulating layer 32, and can be lithographically patterned to form openings that overlie center regions of the second vertical semiconductor channels 35. An anisotropic etch process can be performed to etch through the second vertical semiconductor channels 35 and to physically expose top surfaces of the first dielectric cores 25. A dielectric material can be deposited and planarized to form second dielectric cores 27. The second dielectric cores 27 can include undoped silicate glass, a doped silicate glass, or organosilicate glass.

Figure 32C:
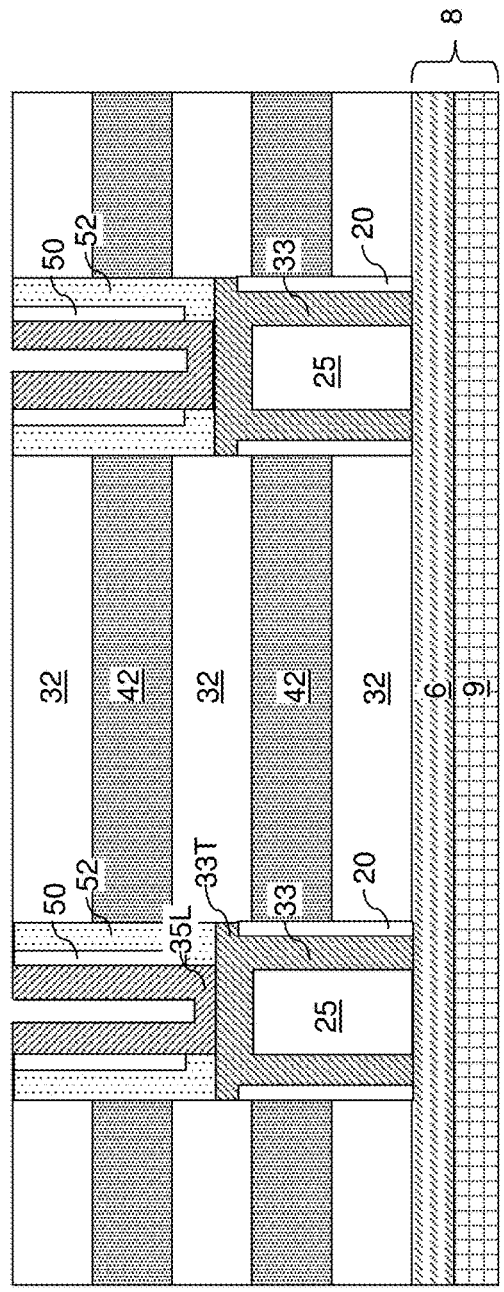
FIGS. 32C, 32D and 32E are vertical cross-sectional views of steps in forming the alternative configuration of the third exemplary structure.
Figure 32D:
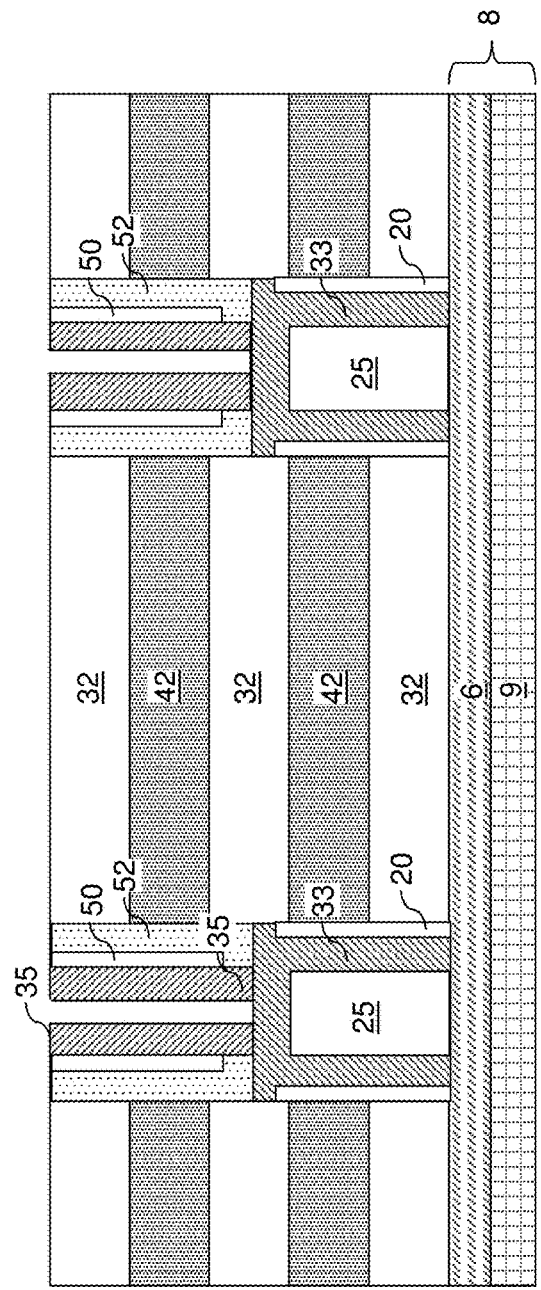
Figure 32E:
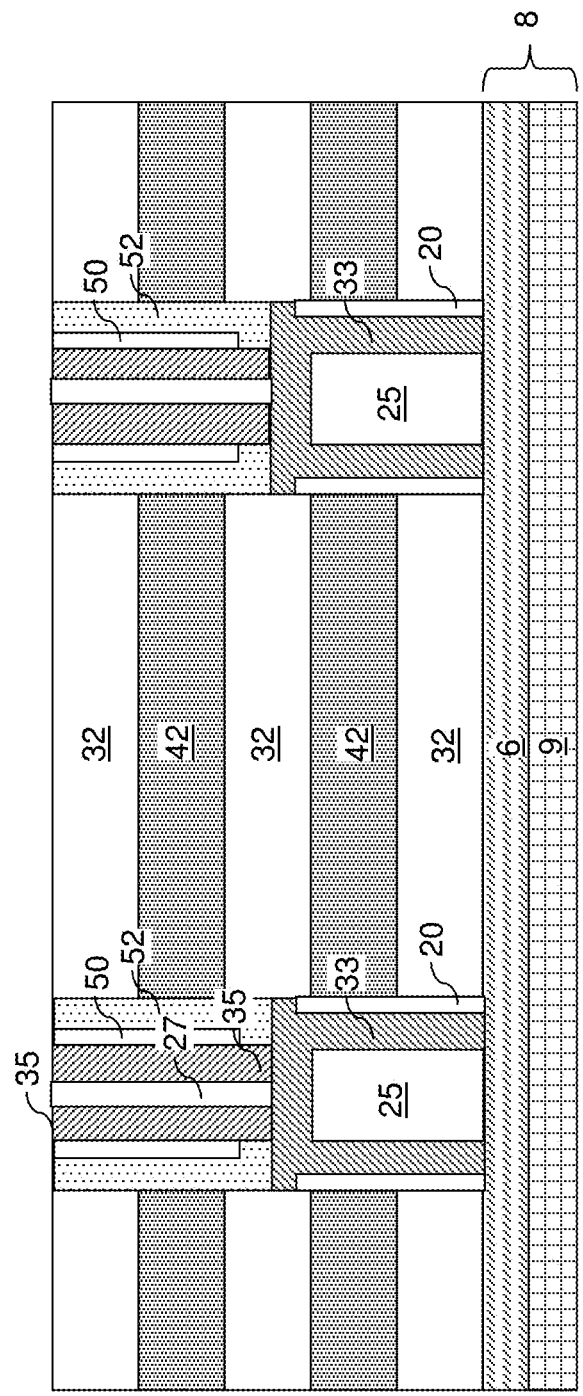

FIGS. 32C-32E illustrate steps in forming an alternative configuration of the third exemplary structure. In this alternative configuration, the first vertical semiconductor channels 33 and the second vertical semiconductor channels 35 comprise a polycrystalline semiconductor layer (e.g., polysilicon) that is deposited in the line trenches 149, and then etched back. The steps in FIGS. 32C-32E follow the steps illustrated in FIGS. 28C-28E, 29C and 30A-30B which are described above. Specifically, as shown in FIG. 32C, a thin film polysilicon second vertical semiconductor channel material layer 35L is deposited in the line cavities 149' in first-level line trenches 149 and optionally recessed. As shown in FIG. 32D, the horizontal portion of the second vertical semiconductor channel material layer 35L is removed by anisotropic etching to form the second vertical semiconductor channels 35 and to expose layer 33T at the bottom of the line cavities 149'. As shown in FIG. 32E, second dielectric cores 27 are then deposited over the second vertical semiconductor channels 35 in the line cavities 149', and recessed to be level with the top of the second vertical semiconductor channels 35. If the second vertical semiconductor channels 35 are not recessed in the prior steps, then the second vertical semiconductor channels 35 may be recessed together with the second dielectric cores 27. The subsequent process steps of the third embodiment are the same of the primary and alternative configurations of the third exemplary structure, irrespective of whether the vertical semiconductor channels (33, 35) comprise a single crystalline or polycrystalline semiconductor material.

Referring to FIGS. 33A and 33B, a photoresist layer (not shown) can be applied over the topmost one of the first-level insulating layers 32, and can be lithographically patterned to form rows of openings that are arranged along the second horizontal direction hd2. Each row of openings in the photoresist layer can overlie a respective one of the first-level line trenches 149. Each opening can laterally extend from one sidewall of an underlying first-level line trench 149 to another sidewall of the underlying first-level line trench 149. In one embodiment, the openings in the photoresist layer may include rectangular openings.

An anisotropic etch is performed to transfer the pattern in the photoresist layer through structures that fill the first-level line trenches 149. Pillar cavities vertically extending through each layer in the first-level alternating stack (32, 42) can be formed by the anisotropic etch process. A top surface of the single crystalline doped semiconductor material layer 6 can be physically exposed at the bottom of each pillar cavity. Each set of material portions that fills a first-level line trench 149 is divided into multiple discrete material portions, which are herein referred to as a first-level memory pillar structure 58. Each first-level memory pillar structure 58 includes a pair of first gate dielectrics 20, a pair of first vertical semiconductor channels 33, a first dielectric core 25, a pair of second gate dielectrics (52, 50), a pair of second vertical semiconductor channels 35, and a second dielectric core 27. Each component within a first-level memory pillar structure 58 is a patterned remaining portion of a respective larger structure as provided at the processing steps of FIG. 32A or FIG. 32E. The photoresist layer can be subsequently removed, for example, by ashing.

A dielectric material such as undoped silicate glass, a doped silicate glass, or organosilicate glass can be deposited in the pillar cavities by a conformal deposition process or a self-planarizing deposition process (such as spin-coating). Excess portions of the dielectric material can be removed from above the top surface of the topmost one of the first-level insulating layers 32. Each remaining portion of the dielectric material that fills a respective pillar cavity constitutes a first-level dielectric pillar structure 22. A laterally alternating sequence of first-tier memory pillar structures 58 and first-tier dielectric pillar structures 22 is formed within each of the first-level line trenches 149.

Each first-level memory pillar structure 58 includes components of a ferroelectric memory unit cell. A row of ferroelectric memory unit cells is formed within each first-level line trench 149. The ferroelectric memory unit cells within each first-level line trench 149 are arranged long the second horizontal direction hd2.

Referring to FIGS. 34A and 34B, the processing steps of FIGS. 15A and 15B can be performed to form first backside trenches 79 extending through the first-level alternating stack (32, 42).

Referring to FIGS. 35A and 35B, the processing steps of FIGS. 16A and 16B can be performed to form first backside recesses 43.

Figure 36A:
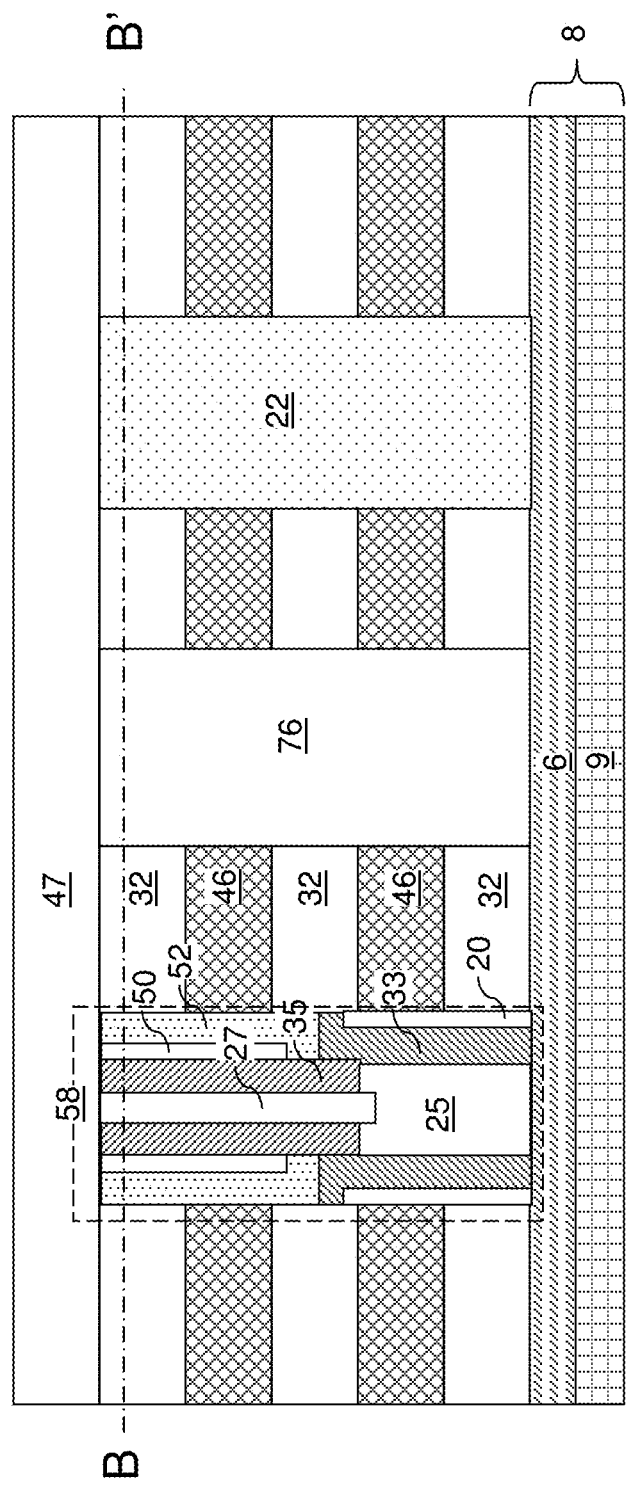
FIG. 36A is a vertical cross-sectional view of the third exemplary structure after formation of first-level electrically conductive layers and first backside trench fill structures according to the third embodiment of the present disclosure.
Figure 36B:
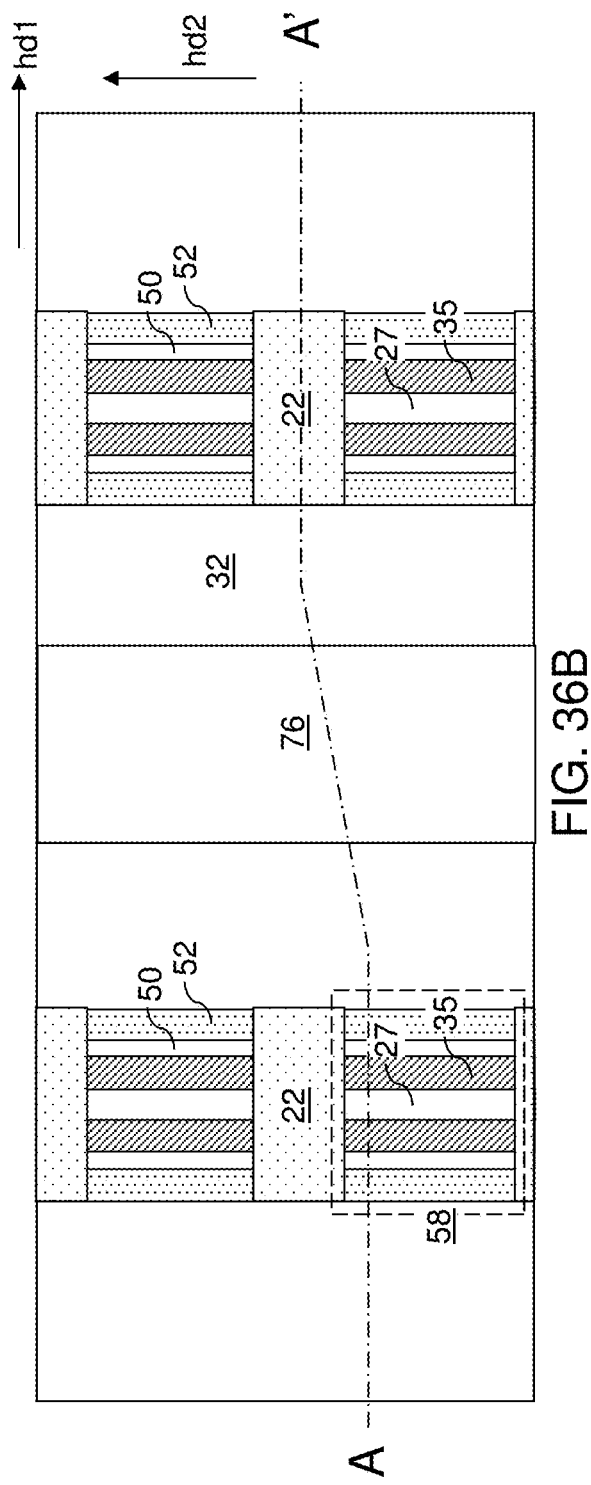
FIG. 36B is a vertical cross-sectional view of the third exemplary structure along plane B-B' in FIG. 36A. The plane A-A' is the plane of the vertical cross-sectional view of FIG. 36A.

Referring to FIGS. 36A and 36B, the processing steps of FIGS. 17A and 17B can be performed to form first-level electrically conductive layers 46, first backside trench fill structures 76, and a first contact-level dielectric layer 47.

Referring to FIGS. 37A and 37B, the processing steps of FIGS. 18A and 18B can be performed to form first contact via cavities 39 through the first contact-level dielectric layer 47 over a respective one of the second vertical semiconductor channels 35. A top surface of a second vertical semiconductor channel 35 can be physically exposed at the bottom of each first contact via cavity 39. In one embodiment, the first contact via cavities 39 can be elongated along a horizontal direction such as the first horizontal direction hd1. In one embodiment, the first contact via cavities 39 can be laterally offset along the second horizontal direction hd2 such that the lateral extent of the first contact via cavities 39 between a neighboring pair of first backside trench fill structures 76 do not have an overlap in the lateral extent along the second horizontal direction hd2, or have a minimal overlap along the second horizontal direction hd2.

In one embodiment, each of the first contact via cavities 39 can be laterally offset along the first horizontal direction hd1 from the geometrical center of an underlying one of the second vertical semiconductor channels 35. In one embodiment, a top surface of a second gate dielectric (52, 50) can be physically exposed at the bottom of each first contact via cavity 39. In one embodiment, a top surface of a topmost one of the first-level insulating layers 32 can be physically exposed at the bottom of a first contact via cavity 39. Generally, the layout of the first contact via cavities 39 can be selected such that only one second vertical semiconductor channel 35 is physically exposed underneath each first contact via cavity 35, and sufficient lateral spacing between neighboring pairs of first contact via cavities 39 is provided to avoid electrical short between first contact via structures to be subsequently formed therein.

Figure 38A:
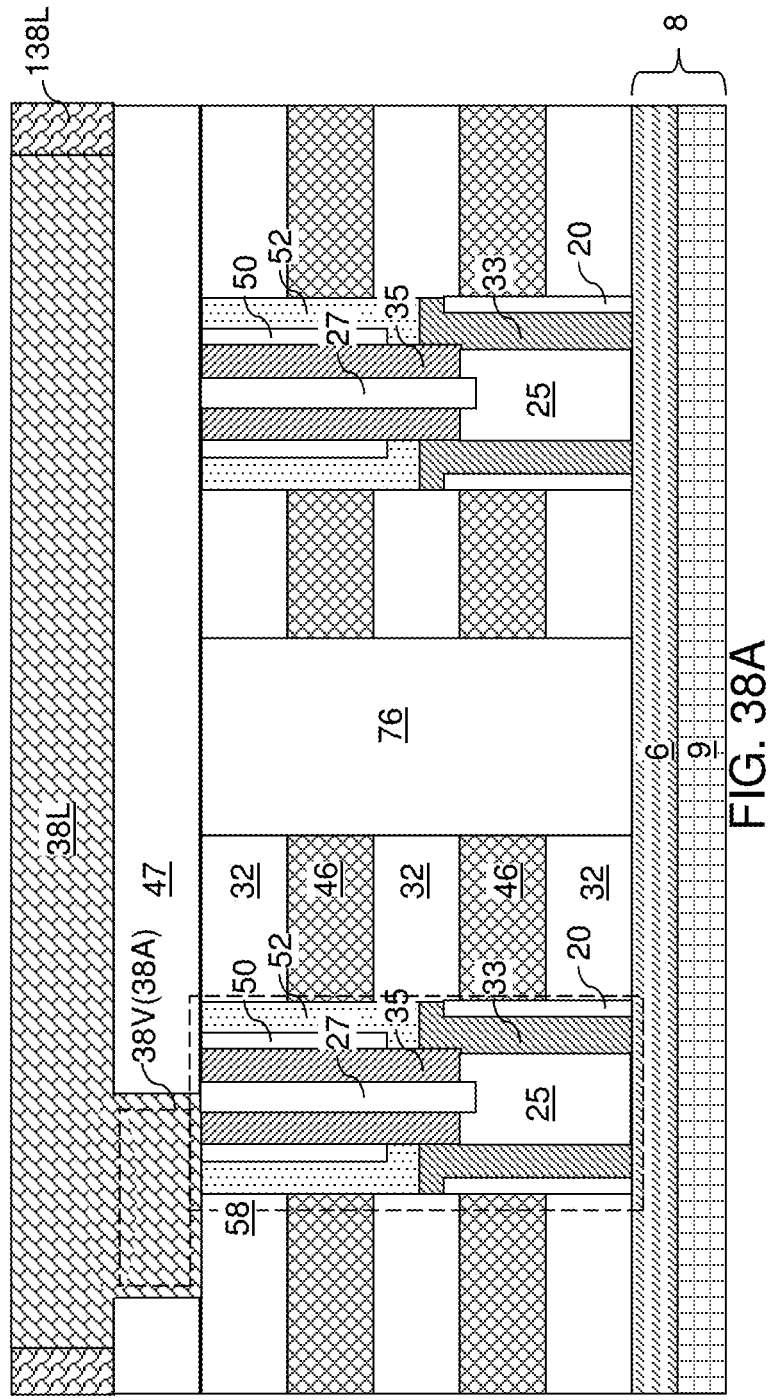
FIG. 38A is a vertical cross-sectional view of the third exemplary structure after formation of a bit-line-level conductive material layer including first contact via structures according to the third embodiment of the present disclosure.
Figure 38B:
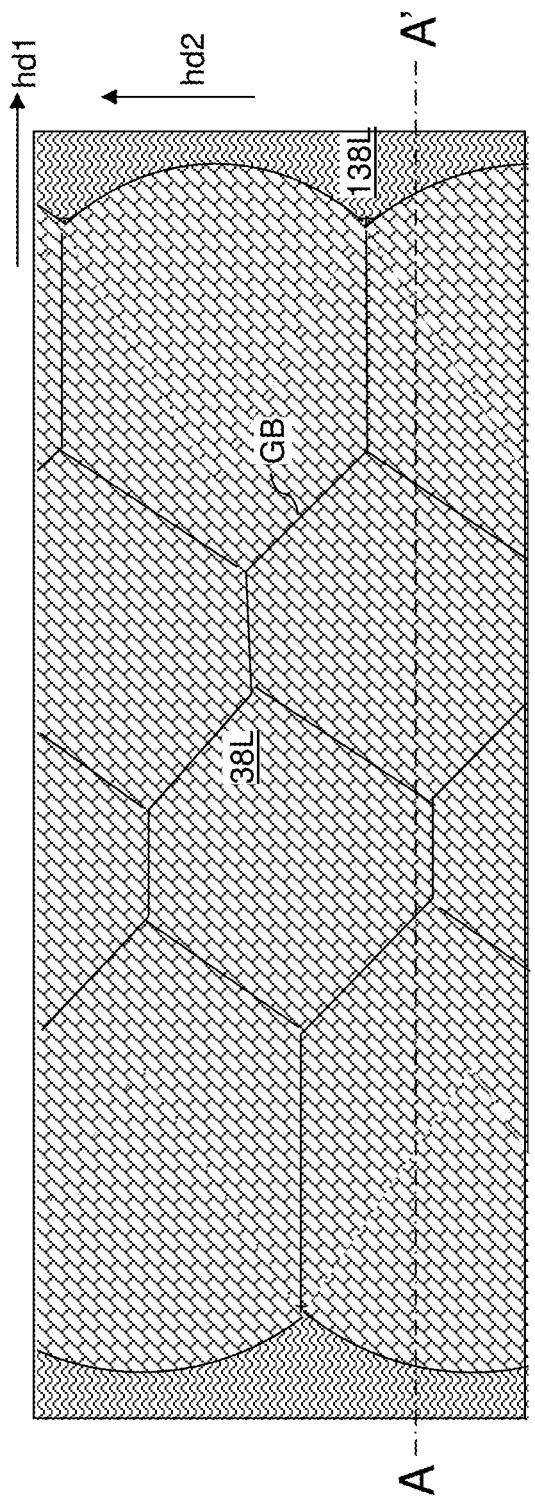
FIG. 38B is a top-down view of the third exemplary structure of FIG. 38A. The plane A-A' is the plane of the vertical cross-sectional view of FIG. 38A.

Referring to FIGS. 38A and 28B, the processing steps of FIGS. 19A and 19B can be performed to form a bit-line-level conductive material layer (38L, 138L), which can include first contact via structures 38V that fill the first contact via cavities 39 and a planar conductive material layer that overlies the first contact-level dielectric layer 47. If the first and second vertical semiconductor channels (33, 35) comprise a single crystal semiconductor material, then the bit-line-level conductive material layer (38L, 138L) can include a multi-grained epitaxial semiconductor layer 38L and a polycrystalline semiconductor layer 138L. Alternatively, if the first and second vertical semiconductor channels (33, 35) comprise a polycrystalline semiconductor material, then the bit-line-level conductive material layer comprises a polycrystalline semiconductor layer.

Figure 39B:
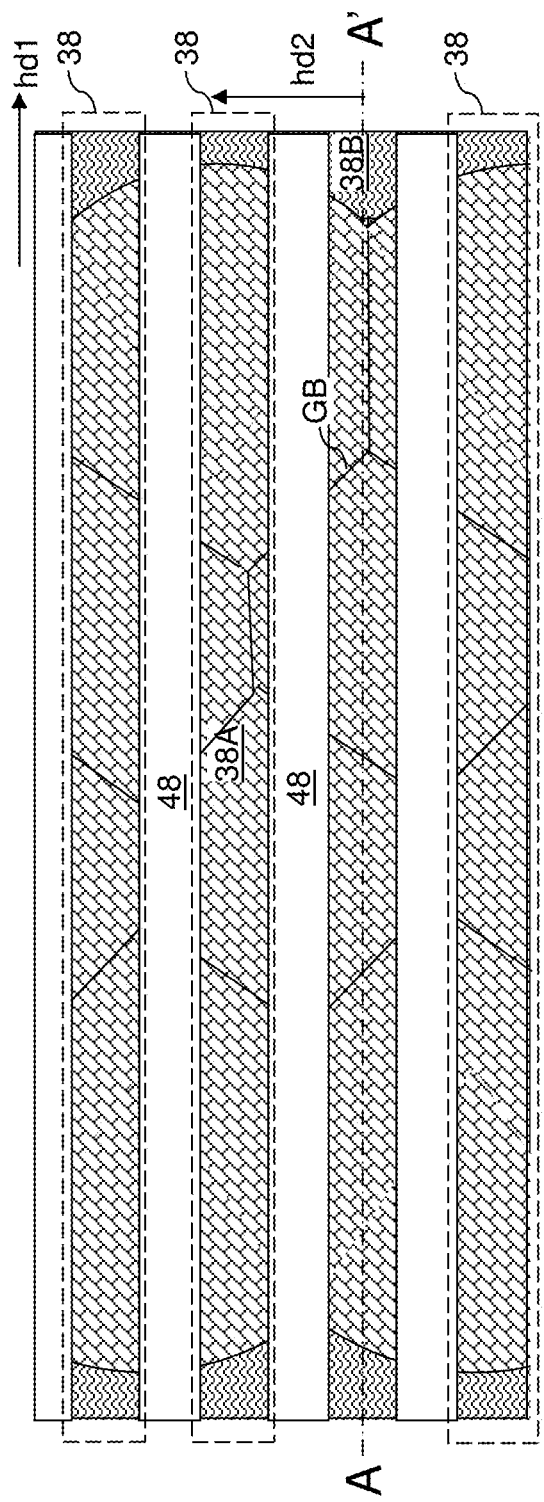
FIG. 39B is a top-down view of the third exemplary structure of FIG. 39A. The plane A-A' is the plane of the vertical cross-sectional view of FIG. 39A.

Referring to FIGS. 39A and 39B, the processing steps of FIGS. 20A and 20B can be performed to pattern the bit-line-level conductive material layer (38L, 138L) into multiple discrete portions, each of which includes a bit line 38 and a first contact via structure 38V. Each bit line 38 is a conductive line structure that may include a plurality of single crystalline grains 38A that are epitaxially aligned to a respective one of the single crystalline epitaxial semiconductor material portions of underlying ferroelectric memory unit cells, and optionally includes polycrystalline line portions 38B including a doped semiconductor material having a doping of the second conductivity type. Alternatively, each bit line 38 comprises a polycrystalline semiconductor material, a metal or metal alloy, a metal silicide and/or a conductive metal nitride.

Generally, a ferromagnetic memory unit cell UC includes a vertical stack of an underlying field effect transistor and an overlying field effect transistor. The underlying field effect transistor and the overlying field effect transistor can be formed in each of the at least one opening, i.e., the first-level discrete memory openings 49, through the vertical layer stack (32, 42). The underlying field effect transistor comprises one of a first field effect transistor (e.g., the select gate transistor SG) and a second field effect transistor (e.g., the ferroelectric memory transistor FeFET), and the overlying field effect transistor comprises another of the first field effect transistor and the second field effect transistor. The second field effect transistor overlies or underlies the first field effect transistor.

The first field effect transistor includes a first vertical semiconductor channel 33, a first gate dielectric 20 contacting a sidewall of the first vertical semiconductor channel 33, and a portion of a first electrically conductive layer 46 that contacts the first gate dielectric 20. Each first vertical semiconductor channel 33 and each second vertical semiconductor channel 35 of each underlying ferroelectric memory unit cell UC comprises respective single crystalline epitaxial semiconductor material portion that is epitaxially aligned to the single crystalline doped semiconductor material layer 6. The vertical stack of the first field effect transistor and the second field effect transistor is formed over a first active region, which comprises the single crystalline doped semiconductor material layer 6. A respective second active region can be formed on a top end of the respective stack of the first vertical semiconductor channel 33 and the second vertical semiconductor channel 35. Each second active region comprises the first contact via structure 38V electrically connected to the bit line 38.

A plurality of ferroelectric memory unit cells UC can be formed within a plurality of first-level discrete memory openings 49. Each of the first-level discrete memory openings 49 can have a closed horizontal cross-sectional shape, and can continuously extend through each of the three insulating layers 32, the first electrically conductive layer 46RL, and the second electrically conductive layer 46WL. Each of the first gate dielectric 20 and the second gate dielectric (52, 50) is located inside a respective first-level discrete memory opening 49. Each of the first electrically conductive layer 46RL and the second electrically conductive layer 46WL encircles the respective first vertical semiconductor channel 33 and second vertical semiconductor channel 36.

The first active region (e.g., the source line comprising the single crystalline doped semiconductor material layer 6), the first electrically conductive layer 46RL, the second electrically conductive layer 46WL, and the second active region (e.g., a drain region located in the via structure 38V and electrically connected to the bit line 38) are vertically spaced from each other by a respective one of the three insulating layers 32 that are vertically spaced apart from each other. In one embodiment, outer sidewalls of the second gate dielectric (52, 50) are vertically coincident with outer sidewalls of the first gate dielectric 20.

In one embodiment, an interface between the first electrically conductive layer 46RL and the first gate dielectric 20 is vertically coincident with an interface between the second electrically conductive layer 46WL and the second gate dielectric (52, 50). Each of the insulating layers 32 has a sidewall that contacts the first gate dielectric 20 or the second gate dielectric (52, 50) and is vertically coincident with the interface between the first electrically conductive layer 46RL and the first gate dielectric 20. The process for forming the third exemplary structure may be completed at this stage.

Figure 40B:
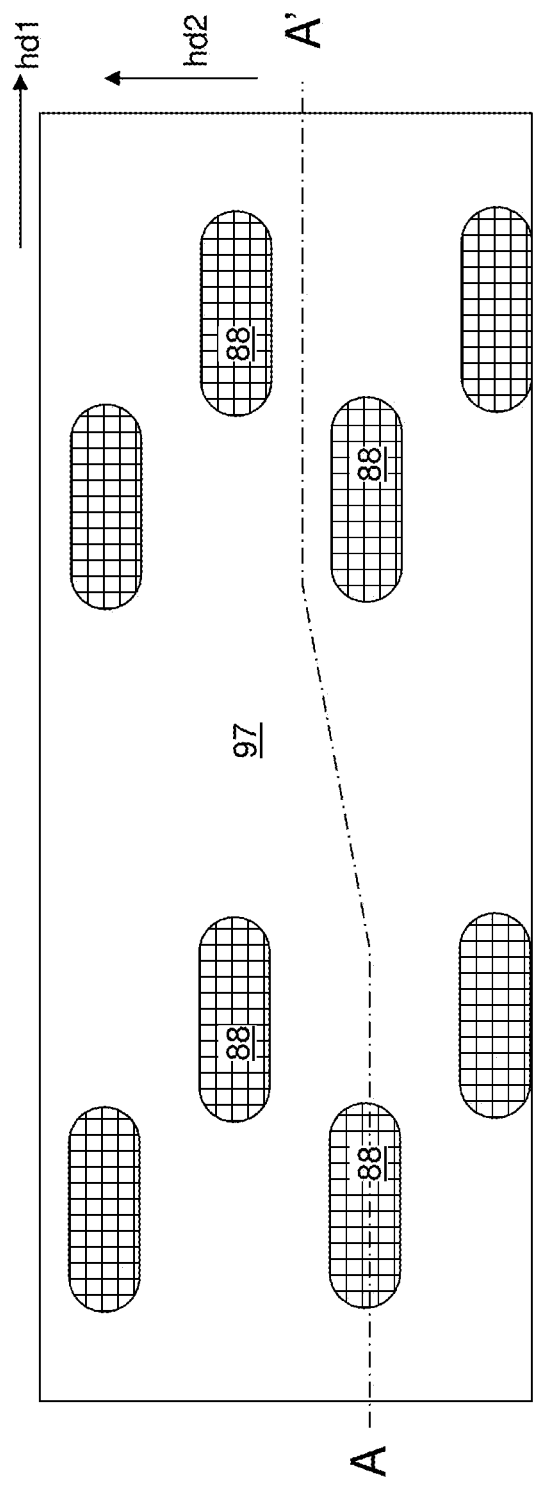
FIG. 40B is a top-down view of the third exemplary structure of FIG. 40A. The plane A-A' is the plane of the vertical cross-sectional view of FIG. 40A.

Optionally, the processing steps of FIGS. 21A and 21B can be performed to form a second contact-level dielectric layer 97 over, and between, the bit lines 38, as shown in FIGS. 40A and 40B, the. Second contact via cavities can be formed through the second contact-level dielectric layer 97 such that a top surface of an underlying bit line 38 is physically exposed. Second contact via structures 88 can be formed in the second contact via cavities by deposition and planarization of at least one conductive material.

In one embodiment, the second contact via structures 88 can include a doped semiconductor material having a doping of the second conductivity type. The second contact via structures 88 can include dopants of the second conductivity type at an atomic concentration in a range from $5.0\times10^{18}/$cm$^3$ to $2.0\times10^{21}/$cm$^3$, although lesser and greater dopant concentrations can also be employed. In one embodiment, the second contact via structures 88 can include a single crystalline doped semiconductor material within an underlying single crystalline grain of the underlying bit line 38. In this case, the second contact via structures 88 can be formed by a selective epitaxy process that grows single crystalline semiconductor material portions from the physically exposed single crystalline surfaces of the bit lines 38. In one embodiment, each second contact via structure 88 can have an areal overlap as, and/or can be located within a same area as, an underlying one of the first contact via structures 38V.

Figure 41A:
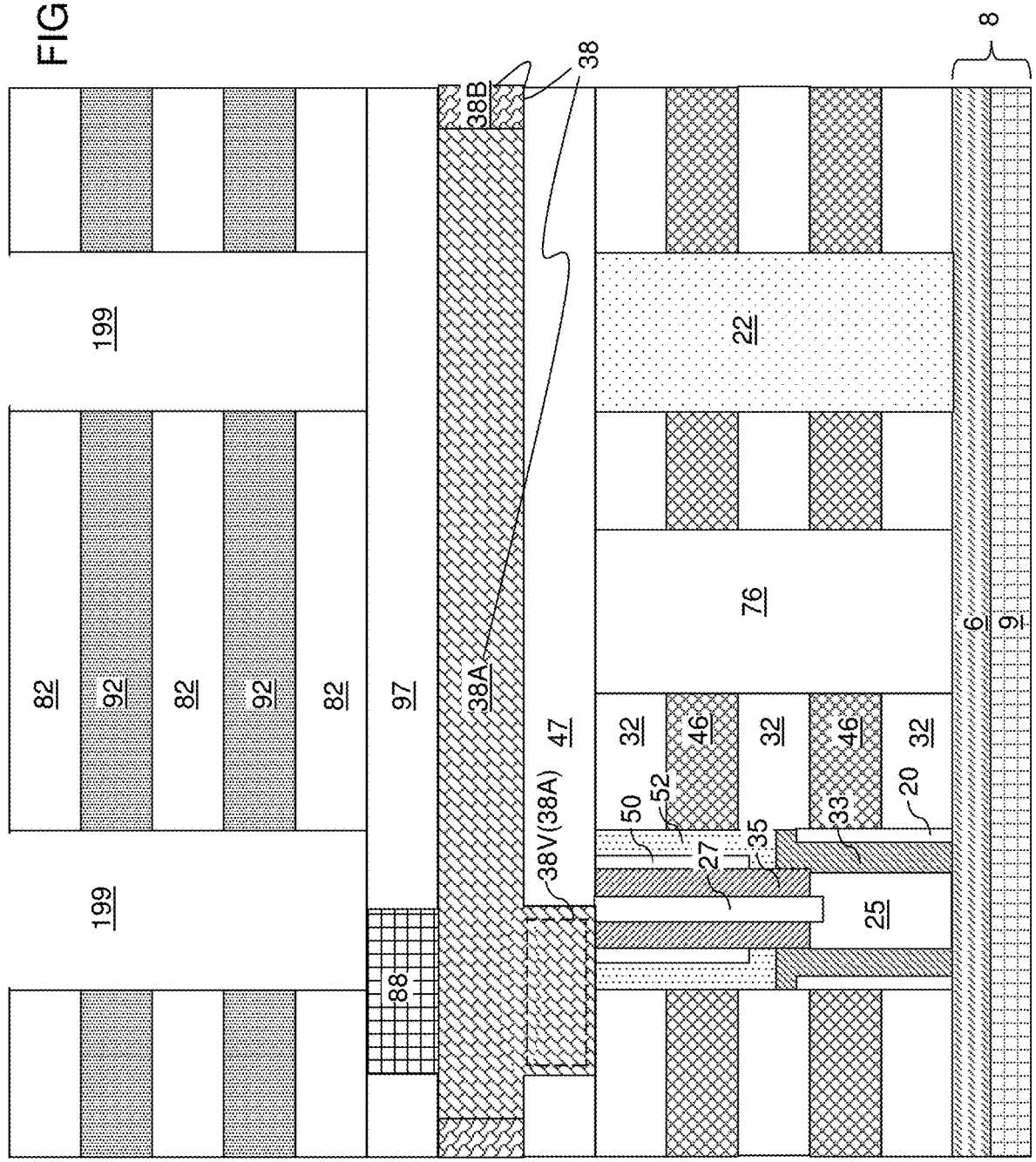
FIG. 41A is a vertical cross-sectional view of the third exemplary structure after formation of second-level line trenches through a second alternating stack of second-level insulting layers and second-level spacer material layers according to the third embodiment of the present disclosure.
Figure 41B:
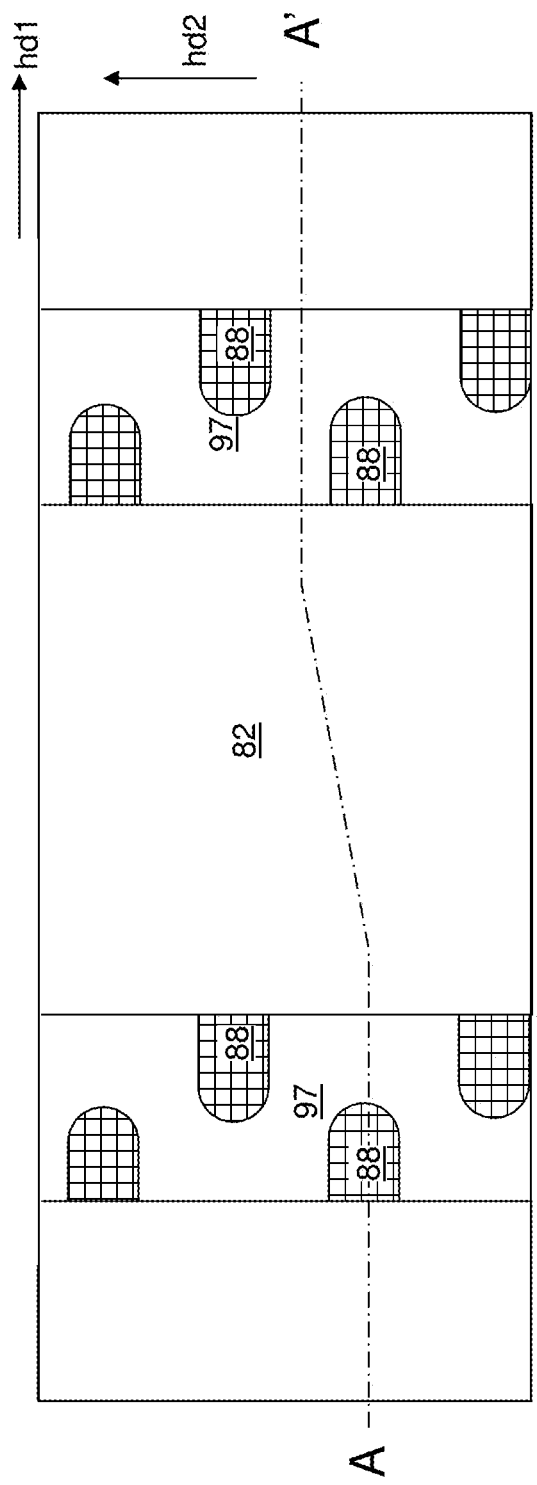
FIG. 41B is a top-down view of the third exemplary structure of FIG. 41A. The plane A-A' is the plane of the vertical cross-sectional view of FIG. 41A.

Referring to FIGS. 41A and 41B, a second-level alternating stack of second-level insulating layers 82 and second-level sacrificial material layers 92 can be formed over the second contact-level dielectric layer 97. Second-level line trenches 199 can be formed through the second-level alternating stack (82, 92) such that top surfaces of two rows of second contact via structures 88 are physically exposed at the bottom of each second-level line trench 199. In one embodiment, each second-level line trench 199 can have an areal overlap with, and/or have an identical area as, an underlying first-level line trench 149. The second-level line trenches 199 can have a respective uniform width throughout, and laterally extends along a horizontal direction such as the second horizontal direction hd2.

Referring to FIG. 42, the processing steps of FIGS. 22A and 22B can be performed to form third gate dielectrics (102, 100). Each third gate dielectric (102, 100) can include a ferroelectric material layer 102 and an optional non-ferroelectric gate dielectric 100.

Figure 43A:
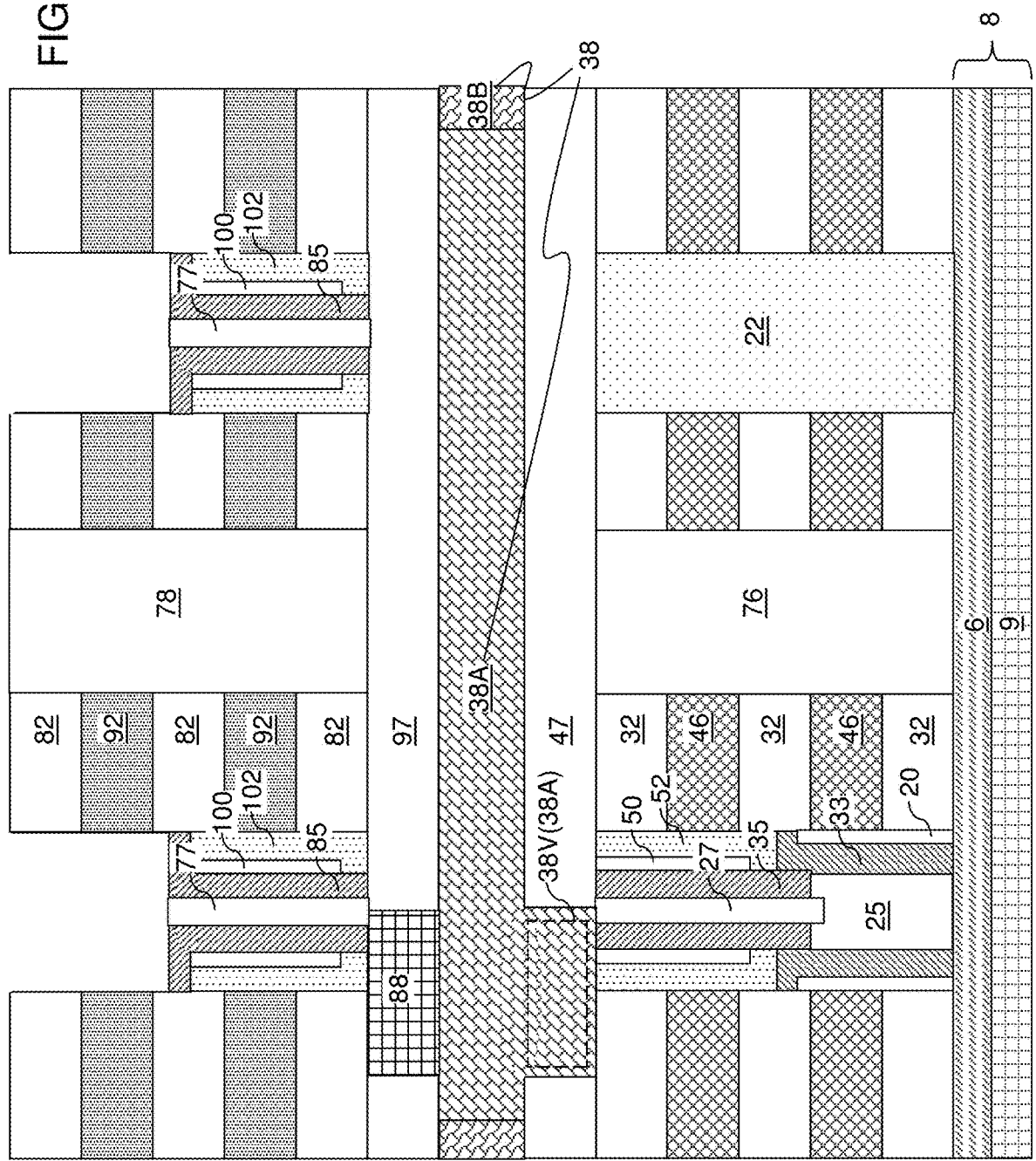
FIG. 43A is a vertical cross-sectional view of the third exemplary structure after formation of third vertical semiconductor channels and third dielectric cores according to the third embodiment of the present disclosure.
Figure 43B:
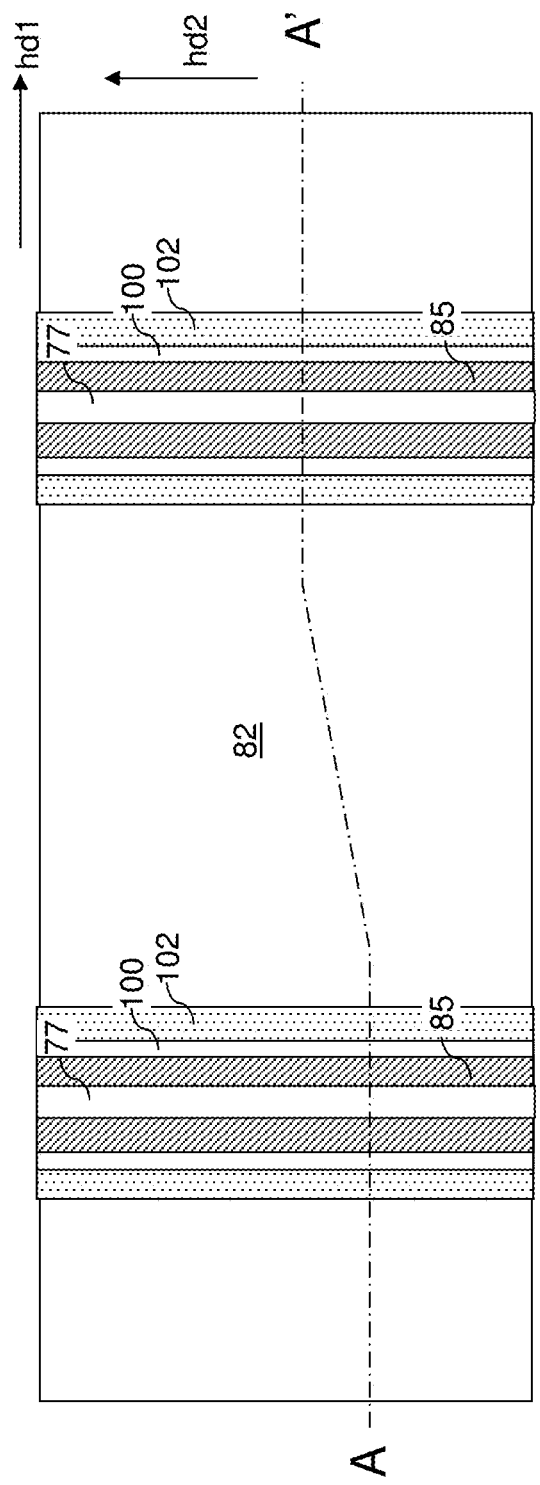
FIG. 43B is a top-down view of the third exemplary structure of FIG. 43A. The plane A-A' is the plane of the vertical cross-sectional view of FIG. 43A.

Referring to FIGS. 43A and 43B, the processing steps of FIGS. 23A and 23B can be performed to form third vertical semiconductor channel material portions, which may be an epitaxial semiconductor material portion that include a plurality of single crystalline grains that grow from a respective one of the second contact via structures 88. The third vertical semiconductor channel material portions can be vertically recessed such that top surfaces of the recessed portions of the third vertical semiconductor channel material portions are located at a level of a middle one of the second-level insulating layers 82.

Sacrificial spacers (not shown) can be formed on sidewalls of upper regions of the second-level line trenches by conformal deposition and anisotropic etch of a sacrificial spacer material. The sacrificial spacer material can include a silicon oxide material having a high etch rate (such as borosilicate glass), a silicon-germanium alloy, a carbon-based material (such as amorphous carbon), or a polymer material. Center portions of the third vertical semiconductor channel material portions can be removed by an anisotropic etch process to physically expose a top surface of the second contact dielectric layer 97. Remaining portions of the third vertical semiconductor channel material portions constitute third vertical semiconductor channels 85.

A dielectric material such as undoped silicate glass, a doped silicate glass, or an organosilicate glass can be deposited in the cavities formed by removal of the center portions of the third vertical semiconductor channel material portions. The dielectric material can be vertically recessed to form third dielectric cores 77. The sacrificial spacers can be removed selective to the third dielectric cores 77 and the third vertical semiconductor channels 85.

Figure 44A:
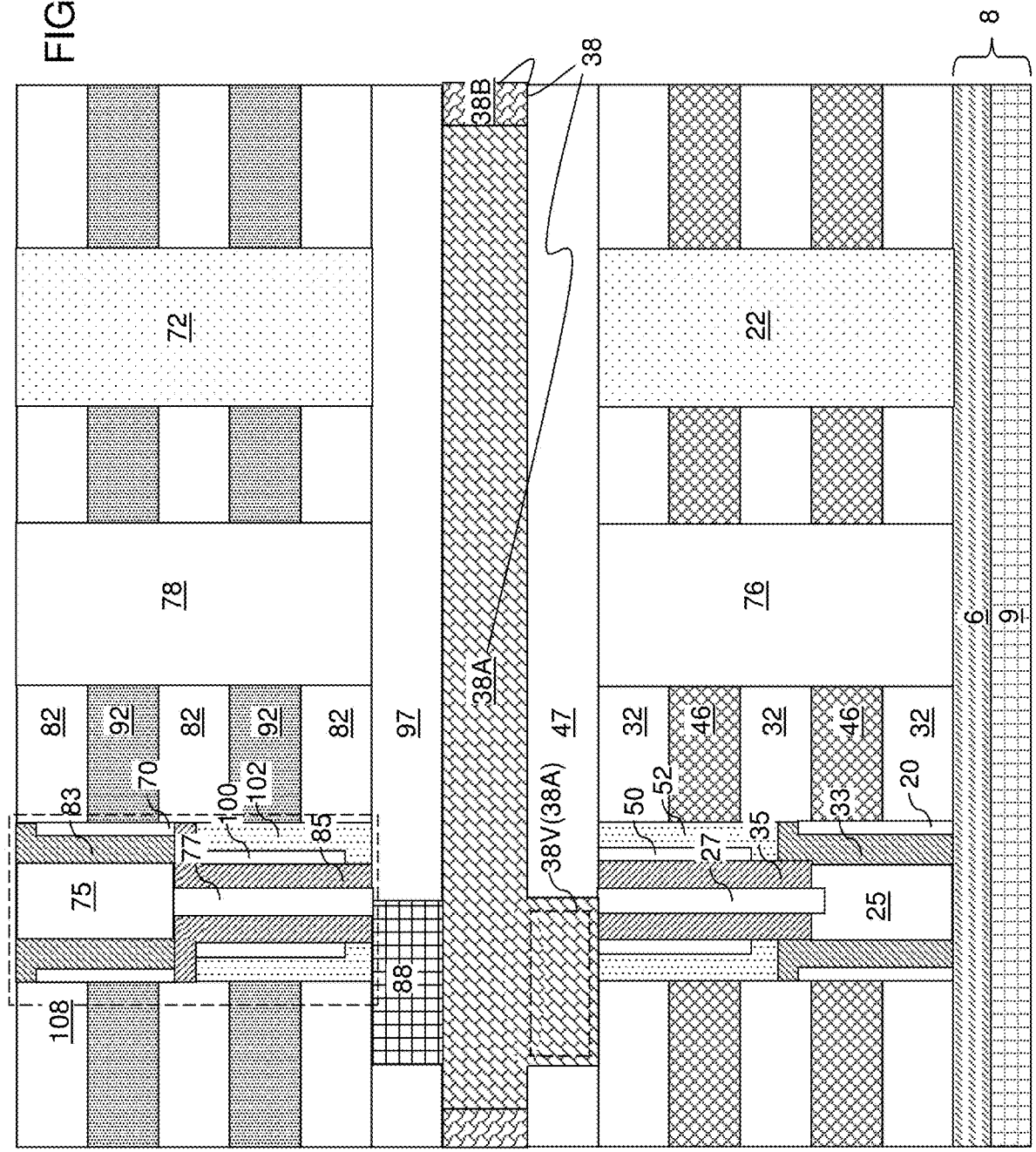
FIG. 44A is a vertical cross-sectional view of the third exemplary structure after formation of fourth gate dielectrics, fourth vertical semiconductor channels, and fourth dielectric cores according to the third embodiment of the present disclosure.
Figure 44B:
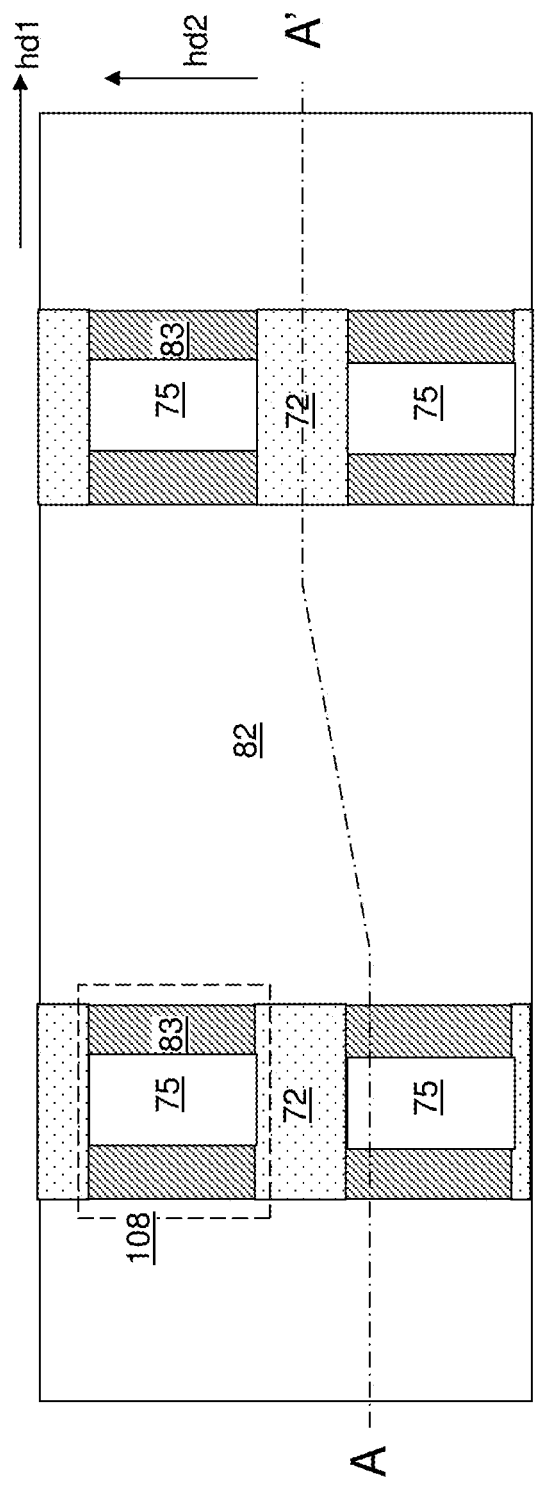
FIG. 44B is a top-down view of the third exemplary structure of FIG. 44A. The plane A-A' is the plane of the vertical cross-sectional view of FIG. 44A.

Referring to FIGS. 44A and 44B, the processing steps of FIG. 24 can be performed to form fourth gate dielectrics 70 and fourth vertical semiconductor channel material portions. Center portions of the fourth vertical semiconductor channel material portions can be removed and replaced with a dielectric material to form fourth dielectric cores 75.

A photoresist layer (not shown) can be applied over the topmost second-level insulating layer 82, and can be lithographically patterned to form rows of openings that are arranged along the second horizontal direction hd2. Each row of openings in the photoresist layer can overlie a respective one of the second-level line trenches 199. Each opening can laterally extend from one sidewall of an underlying second-level line trench 199 to another sidewall of the underlying second-level line trench 199. In one embodiment, the openings in the photoresist layer may include rectangular openings.

An anisotropic etch is performed to transfer the pattern in the photoresist layer through structures that fill the second-level line trenches 199. Pillar cavities vertically extending through each layer in the second-level alternating stack (32, 42) can be formed by the anisotropic etch process. A top surface of the second contact-level dielectric layer 97 can be physically exposed at the bottom of each pillar cavity. Each set of material portions that fills a second-level line trench 199 is divided into multiple discrete material portions, which are herein referred to as a second-level memory pillar structure 108. Each second-level memory pillar structure 108 includes a pair of third gate dielectrics (102, 100), a pair of third vertical semiconductor channels 85, a third dielectric core 77, a pair of fourth gate dielectrics 70, a pair of fourth vertical semiconductor channels 83, and a fourth dielectric core 75. Each component within a second-level memory pillar structure 108 is a patterned remaining portion of a respective larger structure as provided prior to formation of the pillar cavities. The photoresist layer can be subsequently removed, for example, by ashing.

A dielectric material such as undoped silicate glass, a doped silicate glass, or organosilicate glass can be deposited in the pillar cavities by a conformal deposition process or a self-planarizing deposition process (such as spin-coating). Excess portions of the dielectric material can be removed from above the top surface of the topmost one of the second-level insulating layers 82. Each remaining portion of the dielectric material that fills a respective pillar cavity constitutes a second-level dielectric pillar structure 72. A laterally alternating sequence of second-tier memory pillar structures 108 and second-tier dielectric pillar structures 72 is formed within each of the second-level line trenches 199.

Each second-level memory pillar structure 108 includes components of a ferroelectric memory unit cell. A row of ferroelectric memory unit cells is formed within each second-level line trench 199. The ferroelectric memory unit cells within each second-level line trench 199 are arranged long the second horizontal direction hd2.

Figure 45A:
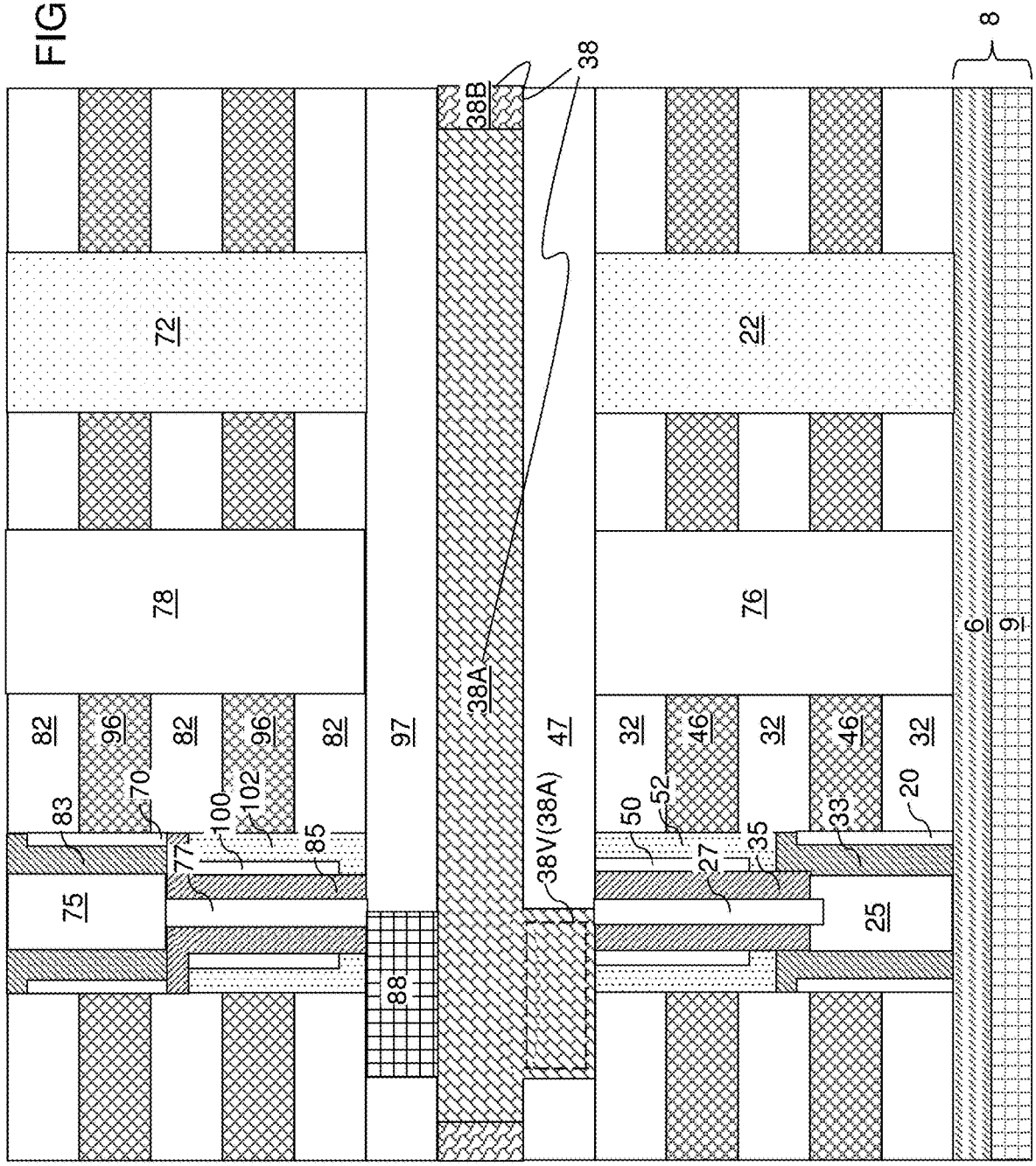
FIG. 45A is a vertical cross-sectional view of the third exemplary structure after formation of second backside trenches, replacement of the second-level spacer material layers with second-level electrically conductive layers, and formation of second backside trench fill structures according to the third embodiment of the present disclosure.
Figure 45B:
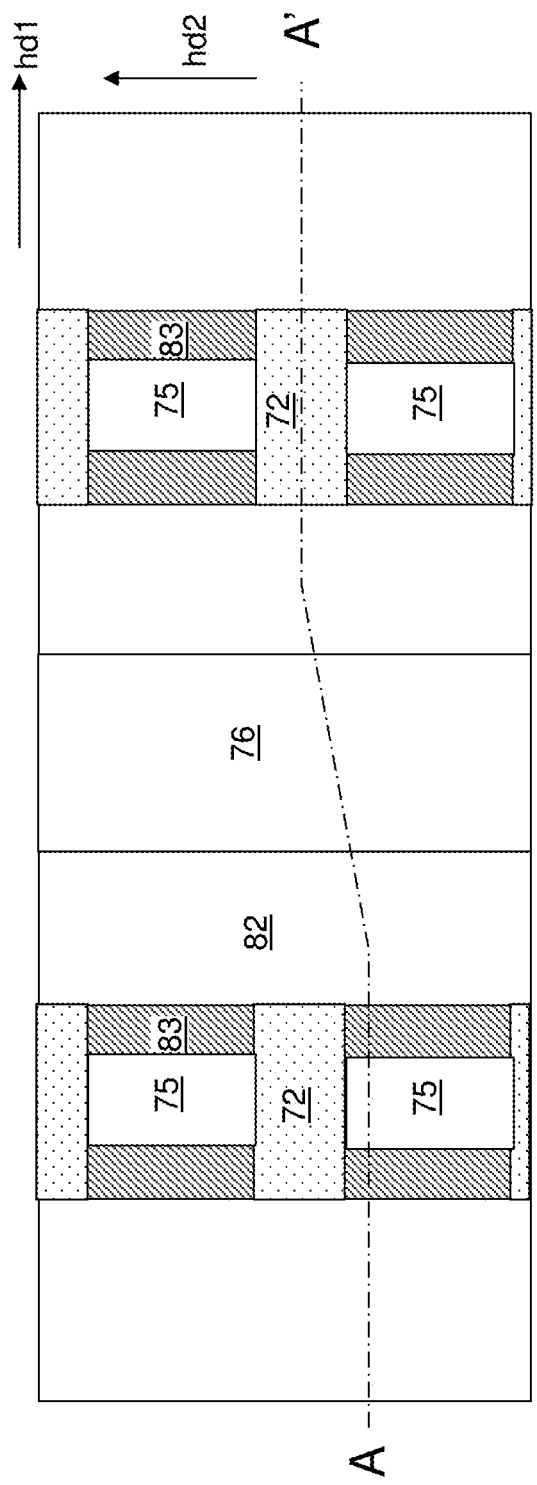
FIG. 45B is a top-down view of the third exemplary structure of FIG. 45A. The plane A-A' is the plane of the vertical cross-sectional view of FIG. 45A.

Referring to FIGS. 45A and 45B, the processing steps of FIG. 25 can be performed to form second backside trenches, second backside recesses, second-level electrically conductive layers 96, and second backside trench fill structures 78.

Figure 46B:
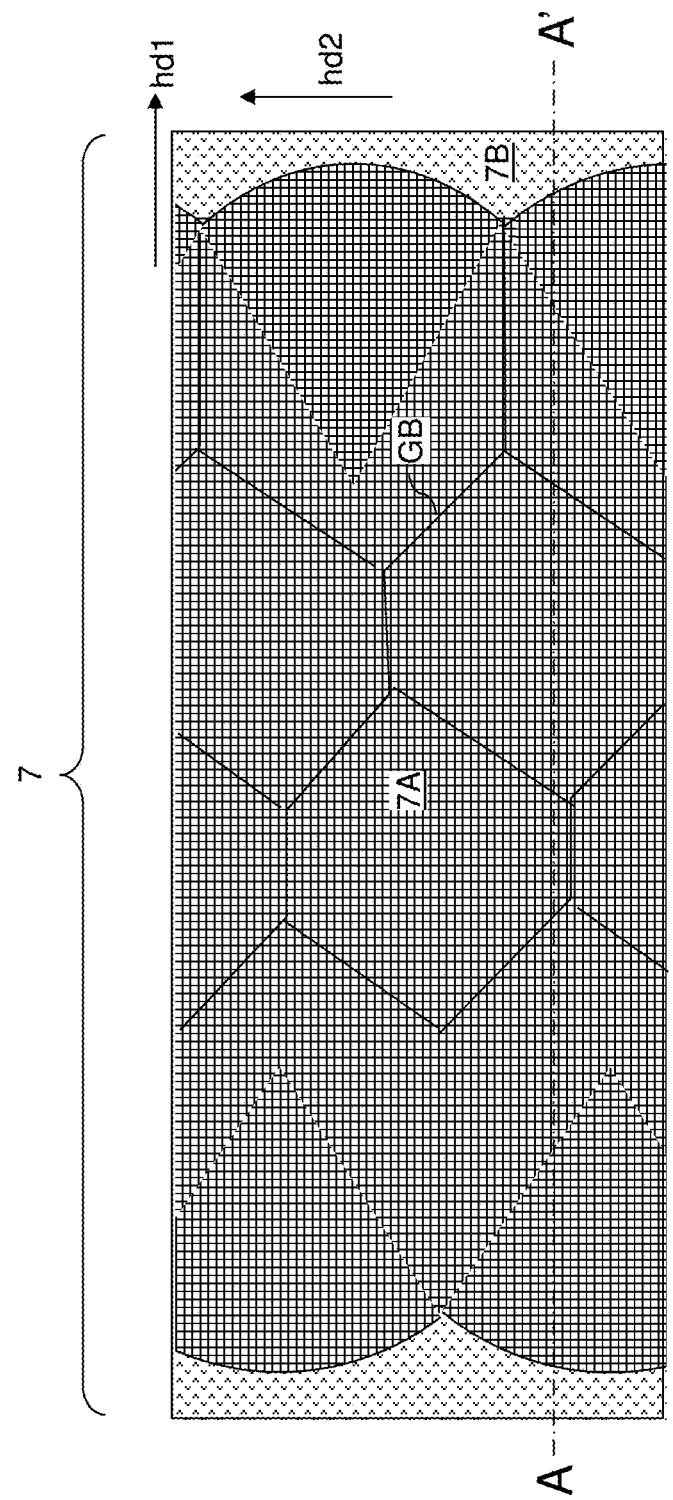
FIG. 46B is a top-down view of the third exemplary structure of FIG. 46A. The plane A-A' is the plane of the vertical cross-sectional view of FIG. 46A.

Referring to FIGS. 46A and 46B, the processing steps of FIGS. 26A and 26B can be performed to form a source-line-level conductive material layer 7. In one embodiment, the source-line-level conductive material layer 7 can be formed by performing a selective epitaxy process that grows a single crystalline semiconductor material from the physically exposed surfaces of the fourth vertical semiconductor channels 83. Single crystalline semiconductor material portions can grow from the physically exposed surfaces of the fourth vertical semiconductor channels 83. Single crystalline grains that grow from different fourth vertical semiconductor channels 83 can contact one another and form a crystalline epitaxial semiconductor material layer including multiple single crystalline semiconductor material grains that are epitaxially aligned to a respective one of the fourth vertical semiconductor channels 83, and contact one another at grain boundaries GB that are located between areas of the fourth vertical semiconductor channels 83. In one embodiment, the grain boundaries GB do not overlie any of the fourth vertical semiconductor channels 83. The set of all single crystalline grains, i.e., the single crystalline semiconductor material portions, constitutes a multi-grained epitaxial semiconductor layer 7A that includes multiple epitaxial semiconductor material grains, each of which is epitaxially aligned to an underlying fourth vertical semiconductor channel 83.

Optionally, a peripheral portion may be formed by a non-selective semiconductor deposition process to form a polycrystalline semiconductor layer 7B. The multi-grained epitaxial semiconductor layer 7A and the optional polycrystalline semiconductor layer 7B can be planarized, for example, by chemical mechanical polishing, to provide a planar top surface. The multi-grained epitaxial semiconductor layer 7A and the optional polycrystalline semiconductor layer 7B can be doped with dopants of the second conductivity type by in-situ doping or by ion implantation. The multi-grained epitaxial semiconductor layer 7A and the optional polycrystalline semiconductor layer 7B can include dopants of the second conductivity type at an atomic concentration in a range from $5.0 \times 10^{18}/cm^3$ to $2.0 \times 10^{21}/cm^3$, although lesser and greater dopant concentrations can also be employed. The set of the multi-grained epitaxial semiconductor layer 7A and the polycrystalline semiconductor layer 7B constitutes the source-line-level conductive material layer 7. Alternatively, the source-line-level conductive material layer 7 may comprise a doped polycrystalline semiconductor material, a metal or metal alloy, a metal silicide and/or a conductive metal nitride.

A third active region (comprising the source-line-level conductive material layer 7) can be formed on a top end of the respective stack of the third vertical semiconductor channel 85 and the fourth vertical semiconductor channel 83. Each of the at least one ferroelectric memory unit cell (UC1, UC2) comprises a respective vertical stack of ferroelectric memory unit cells.

Referring to FIGS. 1A-1D and 9A-46B and according to various embodiments of the present disclosure, a memory device is provided, which comprises at least one ferroelectric memory unit cell (UC, UC1, UC2). Each of the at least one ferroelectric memory unit cell is located over a substrate (such as a semiconductor substrate 8) and comprises: a respective first field effect transistor (such as a first field effect transistor of a first-level ferroelectric memory unit cell UC1 or a fourth field effect transistor of a second-level ferroelectric memory unit cell UC2) including a first vertical semiconductor channel (33 or 83), a first gate dielectric (20 or 70) contacting a sidewall of the first vertical semiconductor channel (33 or 83), and a portion of a first electrically conductive layer (46 or 96) that contacts the first gate dielectric (20 or 70); and a respective second field effect transistor (such as a second field effect transistor of the first-level ferroelectric memory unit cell UC1 or a third field effect transistor of the second-level ferroelectric memory unit cell UC2) including a second vertical semiconductor channel (35 or 85), a second gate dielectric {(52, 50) or (102, 100)} comprising a ferroelectric material layer (52 or 102) and contacting a sidewall of the second vertical semiconductor channel (35 or 85) and contacting a top end or a bottom end of the first vertical semiconductor channel (35 or 85), and a portion of a second electrically conductive layer (46 or 96) that contacts the second gate dielectric {(52, 50) or (102, 100)}; a respective first active region (which may comprise a single crystalline doped semiconductor material layer 6 or a combination of first contact via structures 38V and second contact via structures 88) connected to a bottom end of a stack of the first vertical semiconductor channel (33 or 83) and the second vertical semiconductor channel (35 or 85); and a respective second active region (which may comprise a source-line-level conductive material layer 7 or a combination of first contact via structures 38V and second contact via structures 88) connected to a top end of the stack of the first vertical semiconductor channel (33 or 83) and the second vertical semiconductor channel (35 or 85).

In one embodiment, the first active region, the first electrically conductive layer (46 or 96), the second electrically conductive layer (46 or 96), and the second active region are vertically spaced from each other by three insulating layers (32 or 82) that are vertically spaced apart from each other.

In one embodiment, outer sidewalls of the second gate dielectric {(52, 50) or (102, 100)} are vertically coincident with outer sidewalls of the first gate dielectric (20 or 70). In one embodiment, an interface between the first electrically conductive layer (46 or 96) and the first gate dielectric (20 or 70) is vertically coincident with an interface between the second electrically conductive layer (46 or 96) and the second gate dielectric {(52, 50) or (102, 100)}; and each of the insulating layers (32 or 82) has a sidewall that contacts the first gate dielectric (20 or 70) or the second gate dielectric {(52, 50) or (102, 100)} and is vertically coincident with the interface between the first electrically conductive layer (46 or 96) and the first gate dielectric (20 or 70).

In one embodiment, the memory device comprises a memory opening (49 or 99) that has a closed horizontal cross-sectional shape and continuously extends through each of the three insulating layers (32 or 82), the first electrically conductive layer (46 or 96), and the second electrically conductive layer (46 or 96); each of the first gate dielectric (20 or 70) and the second gate dielectric {(52, 50) or (102, 100)} is located inside the memory opening (49 or 99); and each of the first electrically conductive layer (46 or 96) and the second electrically conductive layer (46 or 96) encircles the respective first vertical semiconductor channel (33 or 83) and the second vertical semiconductor channel (35 or 85).

In one embodiment, the memory device comprises a line trench (149 or 199) having a width along a first horizontal direction hd1 and laterally extending along a second horizontal direction hd2 that is perpendicular to the first horizontal direction hd1, wherein each of the three insulating layers (32 or 82), the first electrically conductive layer (46 or 96), and the second electrically conductive layer (46 or 96) is located on one side of the line trench (149 or 199); each of the first gate dielectric (20 or 70) and the second gate dielectric {(52, 50) or (102, 100)} is located inside the line trench (149 or 199) and laterally extends along the second horizontal direction hd2; and each of the first electrically conductive layer (46 or 96) and the second electrically conductive layer (46 or 96) laterally extends along the second horizontal direction hd2 and optionally has a uniform width along the first horizontal direction hd1.

In one embodiment, the first gate dielectric (20, 70) comprises, and/or consists essentially of, a non-ferroelectric material. In one embodiment, the second gate dielectric {(52, 50) or (102, 100)} is vertically spaced from the first gate dielectric (20 or 70) by a portion of the first vertical semiconductor channel (33 or 83) or a by a portion of the second vertical semiconductor channel (35 or 85).

In one embodiment, each first active region comprises a portion of a single crystalline doped semiconductor material layer 6; each first vertical semiconductor channel 33 comprises a first single crystalline epitaxial semiconductor material that is epitaxially aligned to the single crystalline doped semiconductor material layer 6; and each second vertical semiconductor channel 35 comprises a second single crystalline epitaxial semiconductor material that is epitaxially aligned to a respective first single crystalline epitaxial semiconductor material.

In one embodiment, at least one ferroelectric memory unit cell (UC, UC1, UC2) comprises a two-dimensional array of ferroelectric memory unit cells that laterally extend along a first horizontal direction hd1 and a second horizontal direction hd2 that is perpendicular to the first horizontal direction hd1; each stack of the first vertical semiconductor channel 33 and the second vertical semiconductor channel 35 has a bottom end that contacts the single crystalline doped semiconductor material layer 6; the memory device comprises a plurality of second active regions comprising a conductive line (such as a respective bit line 38) that laterally extends along the first horizontal direction hd1; each conductive line contacts a top end of a stack of the first vertical semiconductor channel 33 and the second vertical semiconductor channel 35; and the conductive lines are laterally spaced apart along the second horizontal direction hd2.

In one embodiment, the at least one ferroelectric memory unit cell comprises at least one vertical stack of a first-level ferroelectric memory unit cell UC1 and a second-level ferroelectric memory unit cell UC2; the second-level ferroelectric memory unit cell UC2 overlies or underlies the first-level ferroelectric memory unit cell UC1 and has an areal overlap with the first-level ferroelectric memory unit cell UC1 in a plan view along a vertical direction; a second field effect transistor of the first-level ferroelectric memory unit cell UC1 overlies a first field effect transistor of the first-level ferroelectric memory unit cell UC1; and a second field effect transistor (such as a third field effect transistor including a third gate dielectric (102, 100)) of the second-level ferroelectric memory unit cell UC2 underlies a first field effect transistor (such as a fourth field effect transistor including a fourth gate dielectric 70) of the second-level ferroelectric memory unit cell UC2.

In one embodiment, each vertical stack of the first-level ferroelectric memory unit cell UC1 and the second-level ferroelectric memory unit cell UC2 comprises an underlying ferroelectric memory unit cell (which is one of the first-level ferroelectric memory unit cell UC1 and the second-level ferroelectric memory unit cell UC2) and an overlying ferroelectric memory unit cell (which is the other of the first-level ferroelectric memory unit cell UC1 and the second-level ferroelectric memory unit cell UC2) that is more distal from the substrate (such as the semiconductor substrate 8) than the underlying ferroelectric memory unit cell is from the substrate; and a second active region of the underlying ferroelectric memory unit cell and a first active region of the overlying ferroelectric memory unit cell comprise a common structure comprising a conductive line structure (such as a bit line 38) that laterally extends along a first horizontal direction hd1 between the underlying ferroelectric memory unit cell and the overlying ferroelectric memory unit cell.

In one embodiment, the first active region of the underlying ferroelectric memory unit cell comprises the single crystalline doped semiconductor material layer 6 having a greater lateral extent along a second horizontal direction hd2 than a width of the conductive line structure (such as a bit line 38) along the second horizontal direction hd2, the second horizontal direction hd2 being perpendicular to the first horizontal direction hd1; and the second active region of the overlying ferroelectric memory unit cell is comprises a conductive material layer (such as a source-line-level conductive material layer 7) having a greater lateral extent along the second horizontal direction hd2 than the width of the conductive line structure along the second horizontal direction hd2.

In one embodiment, each first vertical semiconductor channel (33 or 83) and each second vertical semiconductor channel (35 or 85) of each underlying ferroelectric memory unit cell comprises respective single crystalline epitaxial semiconductor material portion that is epitaxially aligned to the single crystalline doped semiconductor material layer 6; and the conductive line structure comprises a plurality of single crystalline grains that are epitaxially aligned to a respective one of the single crystalline epitaxial semiconductor material portions of the underlying ferroelectric memory unit cells.

The various embodiments of the present disclosure can provide at least one ferroelectric memory unit cell, which may be a two-dimensional array of ferroelectric memory unit cells or a three-dimensional array of ferroelectric memory unit cells. Each first field effect transistor functions as an access transistor that selects or deselects the ferroelectric memory unit cell that includes the respective first field effect transistor. The ferroelectric memory layer (52 or 102) of the second field effect transistor functions as a memory element in which information can be stores. The ferroelectric memory layer (52 or 102) may be employed as a single bit memory element that stores 0 or 1, or may be employed as a multi-level memory element configured to store a data bit selected from at least three possible data values.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device comprising at least one ferroelectric memory unit cell, wherein each of the at least one ferroelectric memory unit cell is located over a substrate and comprises:
   a respective first field effect transistor including a first vertical semiconductor channel, a first gate dielectric contacting a sidewall of the first vertical semiconductor channel, and a portion of a first electrically conductive layer that contacts the first gate dielectric;
   a respective second field effect transistor including a second vertical semiconductor channel, a second gate dielectric comprising a ferroelectric material layer and contacting a sidewall of the second vertical semiconductor channel and contacting a top end or a bottom end of the first vertical semiconductor channel, and a portion of a second electrically conductive layer that contacts the second gate dielectric;
   a respective first active region connected to a bottom end of a stack of the first vertical semiconductor channel and the second vertical semiconductor channel; and
   a respective second active region connected to a top end of the stack of the first vertical semiconductor channel and the second vertical semiconductor channel.

2. The memory device of claim 1, wherein the first active region, the first electrically conductive layer, the second electrically conductive layer, and the second active region are vertically spaced apart from each other by three insulating layers that are vertically spaced apart from each other.

3. The memory device of claim 2, wherein outer sidewalls of the second gate dielectric are vertically coincident with outer sidewalls of the first gate dielectric.

4. The memory device of claim 3, wherein:
an interface between the first electrically conductive layer and the first gate dielectric is vertically coincident with an interface between the second electrically conductive layer and the second gate dielectric; and
each of the insulating layers has a sidewall that contacts the first gate dielectric or the second gate dielectric and is vertically coincident with the interface between the first electrically conductive layer and the first gate dielectric.

5. The memory device of claim 2, wherein:
the memory device comprises a memory opening that has a closed horizontal cross-sectional shape and continuously extends through each of the three insulating layers, the first electrically conductive layer, and the second electrically conductive layer;
each of the first gate dielectric and the second gate dielectric is located inside the memory opening; and
each of the first electrically conductive layer and the second electrically conductive layer encircles the respective first vertical semiconductor channel and second vertical semiconductor channel.

6. The memory device of claim 2, wherein:
the memory device comprises a line trench having a width along a first horizontal direction and laterally extending along a second horizontal direction that is perpendicular to the first horizontal direction, wherein each of the three insulating layers, the first electrically conductive layer, and the second electrically conductive layer is located on one side of the line trench;
each of the first gate dielectric and the second gate dielectric is located inside the line trench and laterally extends along the second horizontal direction; and
each of the first electrically conductive layer and the second electrically conductive layer laterally extends along the second horizontal direction.

7. The memory device of claim 1, wherein the first gate dielectric comprises a non-ferroelectric material.

8. The memory device of claim 1, wherein the second gate dielectric is vertically spaced from the first gate dielectric by a portion of the first vertical semiconductor channel or a by a portion of the second vertical semiconductor channel.

9. The memory device of claim 1, wherein:
each first active region comprises a portion of a single crystalline doped semiconductor material layer;
each first vertical semiconductor channel comprises a first single crystalline epitaxial semiconductor material that is epitaxially aligned to the single crystalline doped semiconductor material layer; and
each second vertical semiconductor channel comprises a second single crystalline epitaxial semiconductor material that is epitaxially aligned to a respective first single crystalline epitaxial semiconductor material.

10. The memory device of claim 9, wherein:
at least one ferroelectric memory unit cell comprises a two-dimensional array of ferroelectric memory unit cells that laterally extend along a first horizontal direction and a second horizontal direction that is perpendicular to the first horizontal direction;
each stack of the first vertical semiconductor channel and the second vertical semiconductor channel has a bottom end that contacts the single crystalline doped semiconductor material layer;
the memory device comprises a plurality of second active regions comprising a respective conductive line that laterally extends along the first horizontal direction;
each conductive line contacts a top end of a stack of the first vertical semiconductor channel and the second vertical semiconductor channel; and
the conductive lines are laterally spaced apart along the second horizontal direction.

11. The memory device of claim 1, wherein:
the at least one ferroelectric memory unit cell comprises at least one vertical stack of a first-level ferroelectric memory unit cell and a second-level ferroelectric memory unit cell;
the second-level ferroelectric memory unit cell overlies or underlies the first-level ferroelectric memory unit cell and has an areal overlap with the first-level ferroelectric memory unit cell in a plan view along a vertical direction;
a second field effect transistor of the first-level ferroelectric memory unit cell overlies a first field effect transistor of the first-level ferroelectric memory unit cell; and
a second field effect transistor of the second-level ferroelectric memory unit cell underlies a first field effect transistor of the second-level ferroelectric memory unit cell.

12. The memory device of claim 11, wherein:
each vertical stack of the first-level ferroelectric memory unit cell and the second-level ferroelectric memory unit cell comprises an underlying ferroelectric memory unit cell and an overlying ferroelectric memory unit cell that is more distal from the substrate than the underlying ferroelectric memory unit cell is from the substrate; and
a second active region of the underlying ferroelectric memory unit cell and a first active region of the overlying ferroelectric memory unit cell comprise a common structure comprising a conductive line structure that laterally extends along a first horizontal direction between the underlying ferroelectric memory unit cell and the overlying ferroelectric memory unit cell.

13. The memory device of claim 12, wherein:
the first active region of the underlying ferroelectric memory unit cell comprises a single crystalline doped semiconductor material layer having a greater lateral extent along a second horizontal direction than a width of the conductive line structure along the second horizontal direction, the second horizontal direction being perpendicular to the first horizontal direction; and
the second active region of the overlying ferroelectric memory unit cell comprises a conductive material layer having a greater lateral extent along the second horizontal direction than the width of the conductive line structure along the second horizontal direction.

14. The memory device of claim 13, wherein:
each first vertical semiconductor channel and each second vertical semiconductor channel of each underlying ferroelectric memory unit cell comprises a respective single crystalline epitaxial semiconductor material portion that is epitaxially aligned to the single crystalline doped semiconductor material layer; and
the conductive line structure comprises a plurality of single crystalline grains that are epitaxially aligned to a respective one of the single crystalline epitaxial semiconductor material portions of the underlying ferroelectric memory unit cells.

\* \* \* \* \*